(12) United States Patent
Yamazaki et al.

(10) Patent No.: US 10,861,917 B2
(45) Date of Patent: Dec. 8, 2020

(54) METHOD FOR MANUFACTURING A FLEXIBLE DEVICE HAVING TRANSISTORS

(71) Applicant: Semiconductor Energy Laboratory Co., Ltd., Atsugi (JP)

(72) Inventors: Shunpei Yamazaki, Setagaya (JP); Hiroki Adachi, Tochigi (JP); Satoru Idojiri, Tochigi (JP); Kensuke Yoshizumi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/388,208

(22) Filed: Dec. 22, 2016

(65) Prior Publication Data
US 2017/0186829 A1    Jun. 29, 2017

(30) Foreign Application Priority Data

Dec. 28, 2015 (JP) ................. 2015-257109
Mar. 30, 2016 (JP) ................. 2016-067618
Mar. 30, 2016 (JP) ................. 2016-069729

(51) Int. Cl.
  *H01L 27/32*    (2006.01)
  *H01L 29/66*    (2006.01)
  (Continued)

(52) U.S. Cl.
  CPC ...... *H01L 27/3262* (2013.01); *H01L 27/3258* (2013.01); *H01L 29/24* (2013.01);
  (Continued)

(58) Field of Classification Search
  CPC ............. H01L 27/3262; H01L 27/3258; H01L 51/0024; H01L 51/003
  (Continued)

(56) References Cited

U.S. PATENT DOCUMENTS 9,088,006 B2    7/2015  Yamazaki et al.
9,437,831 B2    9/2016  Yamazaki et al.
(Continued)

FOREIGN PATENT DOCUMENTS

CN    106597697 A    4/2017
DE    112014005485  8/2016
(Continued)

OTHER PUBLICATIONS

International Search Report (Application No. PCT/IB2016/057852) dated Jul. 4, 2017.
(Continued)

*Primary Examiner* — Lex H Malsawma
*Assistant Examiner* — Eric W Jones
(74) *Attorney, Agent, or Firm* — Robinson Intellectual Property Law Office; Eric J. Robinson

(57) ABSTRACT

A flexible device is manufactured at low temperatures. A second substrate is bonded to a first substrate by a first adhesive layer. A first insulating layer, a transistor, and a second insulating layer are formed over the second substrate. Then, the first substrate and the second substrate are separated from each other while being heated at a first temperature. The heat resistant temperatures of the first substrate, the second substrate, and the first adhesive layer are a second temperature, a third temperature, and a fourth temperature, respectively. Each of the first insulating layer, the second insulating layer, and the transistor is formed at a temperature higher than or equal to room temperature and lower than the fourth temperature. The third temperature is higher than the fourth temperature and lower than the second temperature. The first temperature is higher than the fourth temperature and lower than the third temperature.

20 Claims, 56 Drawing Sheets

(51) Int. Cl.
*H01L 29/786* (2006.01)
*H01L 51/00* (2006.01)
*H01L 29/24* (2006.01)
*H01L 51/52* (2006.01)
*H01L 27/12* (2006.01)

(52) U.S. Cl.
CPC .... *H01L 29/66969* (2013.01); *H01L 29/7869* (2013.01); *H01L 51/003* (2013.01); *H01L 51/0024* (2013.01); *H01L 51/0097* (2013.01); *H01L 51/5253* (2013.01); *H01L 27/1218* (2013.01); *H01L 27/1225* (2013.01); *H01L 27/1259* (2013.01); *H01L 2227/323* (2013.01); *H01L 2227/326* (2013.01); *H01L 2251/5338* (2013.01); *H01L 2251/556* (2013.01); *Y02E 10/549* (2013.01); *Y02P 70/521* (2015.11)

(58) Field of Classification Search
USPC ...................................... 438/149; 257/40, 59
See application file for complete search history.

(56) References Cited

U.S. PATENT DOCUMENTS

| | | | |
|---|---|---|---|
| 9,559,316 B2 | 1/2017 | Yamazaki et al. | |
| 9,559,317 B2 | 1/2017 | Yamazaki et al. | |
| 2007/0110949 A1* | 5/2007 | Abrams | B32B 37/12 428/90 |
| 2008/0308806 A1* | 12/2008 | Akimoto | H01L 27/1225 257/59 |
| 2009/0267225 A1* | 10/2009 | Eguchi | H01L 23/295 257/729 |
| 2010/0244005 A1* | 9/2010 | Gyoda | H01L 51/5237 257/40 |
| 2010/0248403 A1* | 9/2010 | Hatano | H01L 51/56 438/28 |
| 2010/0297829 A1* | 11/2010 | O'Rourke | H01L 21/6835 438/459 |
| 2011/0143501 A1* | 6/2011 | Oda | C08L 63/00 438/127 |
| 2013/0299789 A1 | 11/2013 | Yamazaki et al. | |
| 2014/0339538 A1* | 11/2014 | Yamazaki | H01L 29/66969 257/43 |
| 2015/0090156 A1* | 4/2015 | Combs | C09J 103/06 106/145.5 |
| 2015/0138746 A1* | 5/2015 | Krogdahl | B32B 27/08 361/809 |
| 2015/0155505 A1 | 6/2015 | Yamazaki et al. | |
| 2015/0179446 A1* | 6/2015 | Lee | H01L 21/02565 438/104 |
| 2015/0311223 A1* | 10/2015 | Liu | H01L 21/28008 257/72 |
| 2015/0325812 A1 | 11/2015 | Yamazaki et al. | |
| 2016/0158800 A1* | 6/2016 | Viala | B05D 3/12 428/143 |
| 2016/0159056 A1* | 6/2016 | Takacs | G03F 7/0002 216/83 |
| 2016/0260768 A1* | 9/2016 | Smith | H01L 27/14663 |
| 2017/0133450 A1 | 5/2017 | Yamazaki et al. | |

FOREIGN PATENT DOCUMENTS

| | | |
|---|---|---|
| JP | 2002-033464 A | 1/2002 |
| JP | 2006-338035 A | 12/2006 |
| JP | 4869471 | 2/2012 |
| JP | 2012-138547 A | 7/2012 |
| JP | 2014-175463 A | 9/2014 |
| JP | 2014-197522 A | 10/2014 |
| JP | 2015-187701 A | 10/2015 |
| JP | 5960626 | 8/2016 |
| KR | 2013-0125715 A | 11/2013 |
| KR | 2016-0093639 A | 8/2016 |
| TW | 201523961 | 6/2015 |
| WO | WO-2015/083029 | 6/2015 |

OTHER PUBLICATIONS

Written Opinion (Application No. PCT/IB2016/057852) dated Jul. 4, 2017.

* cited by examiner

Crystal structure of $InMZnO_4$

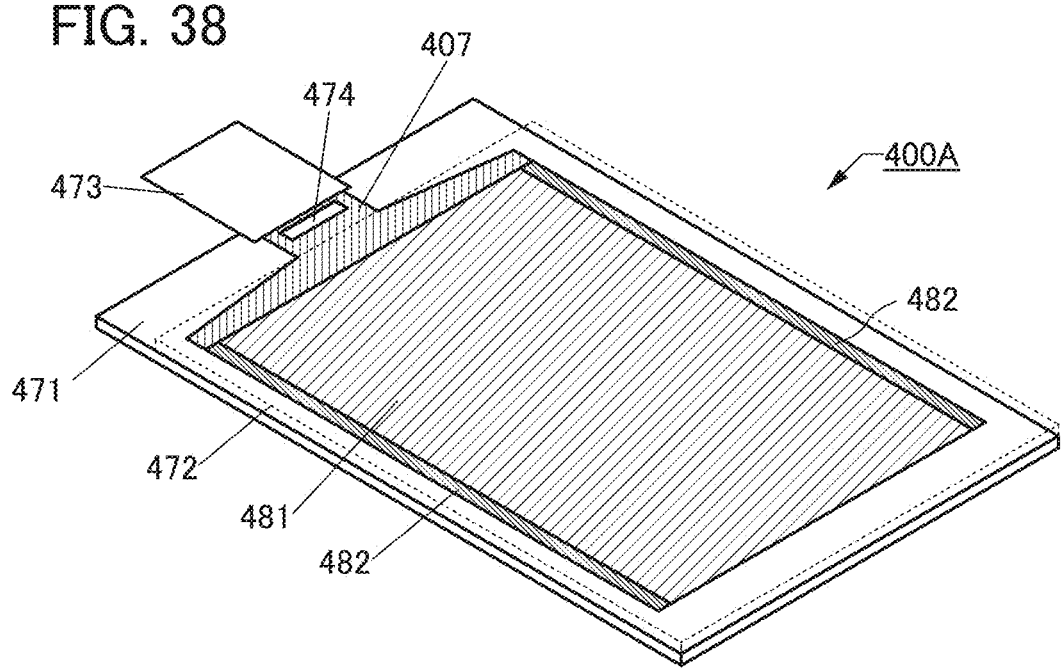

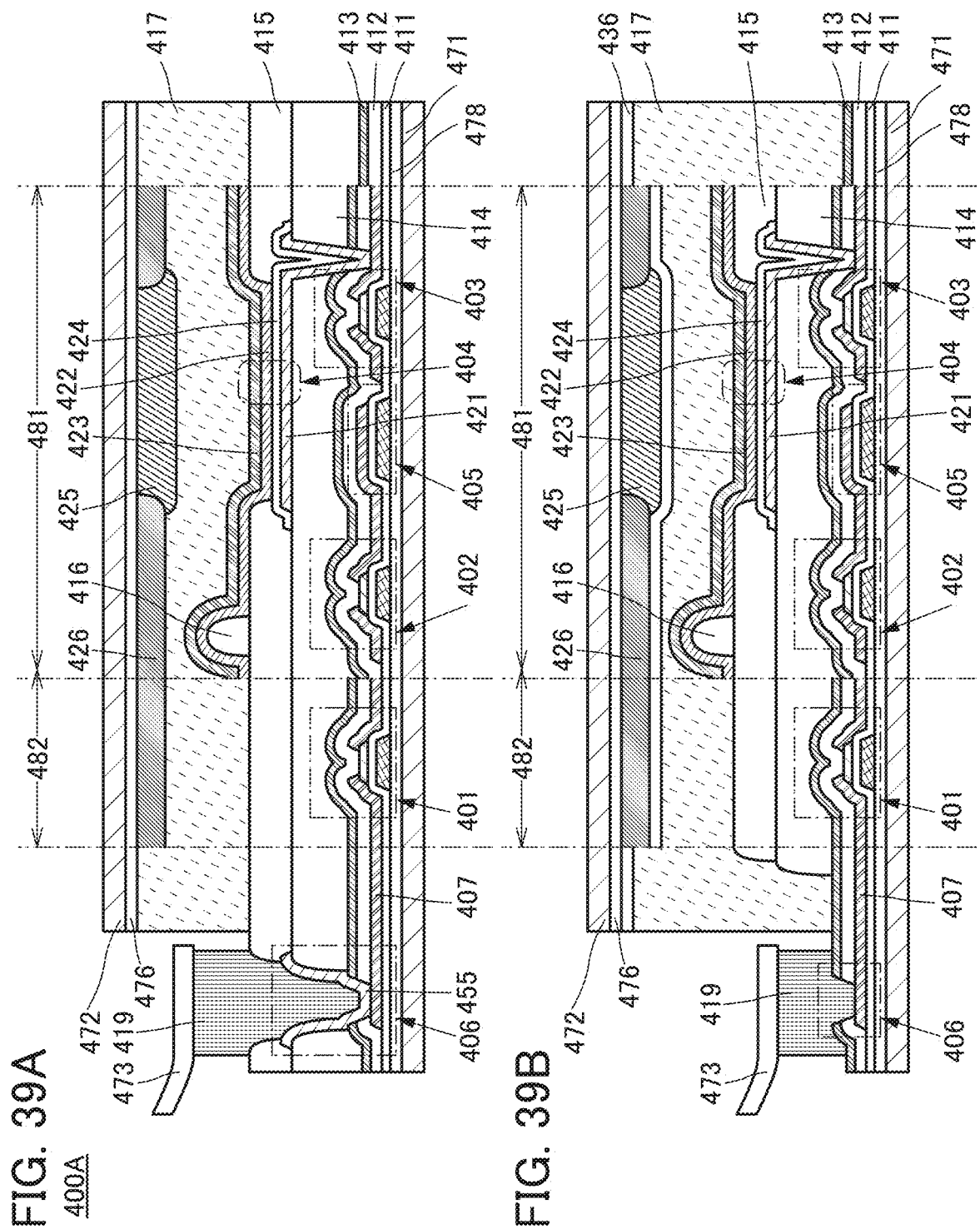

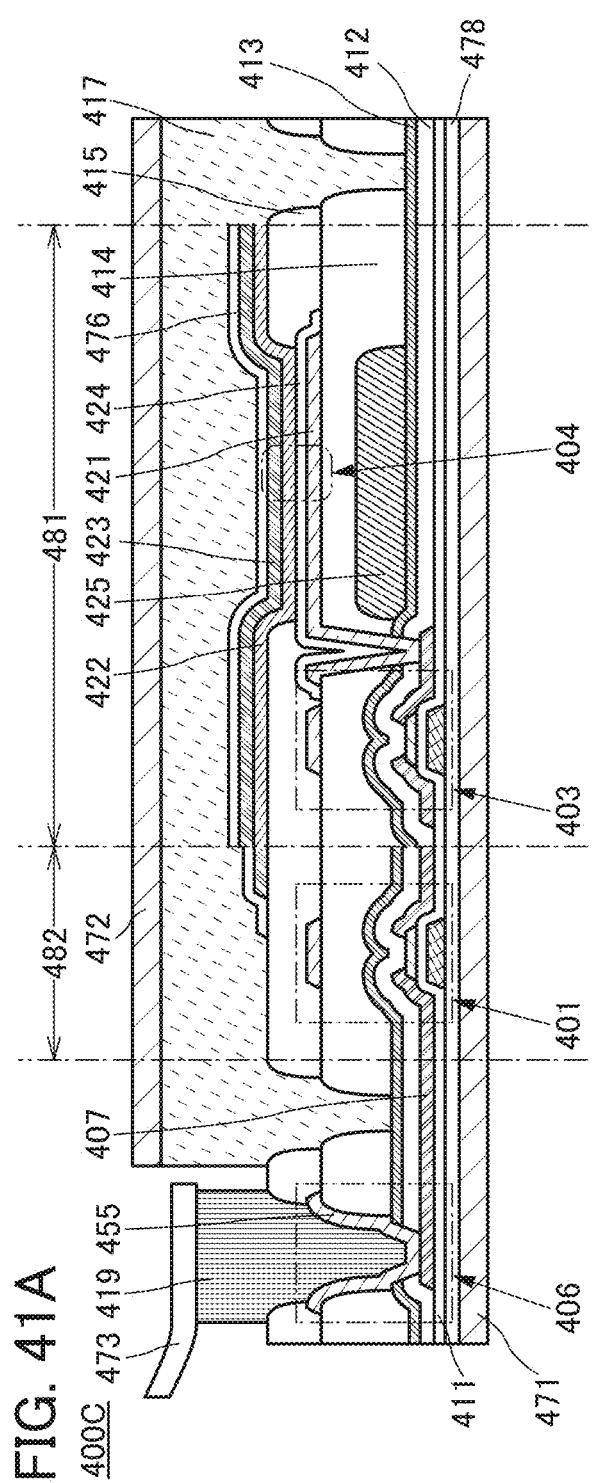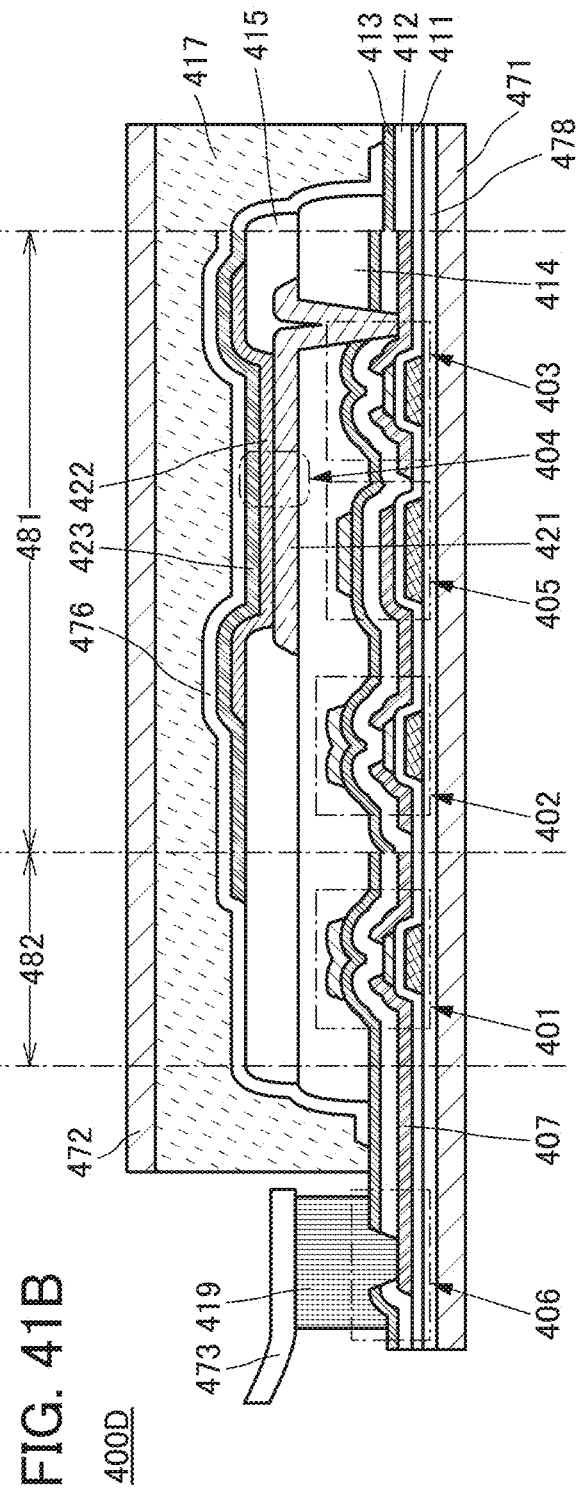

400F

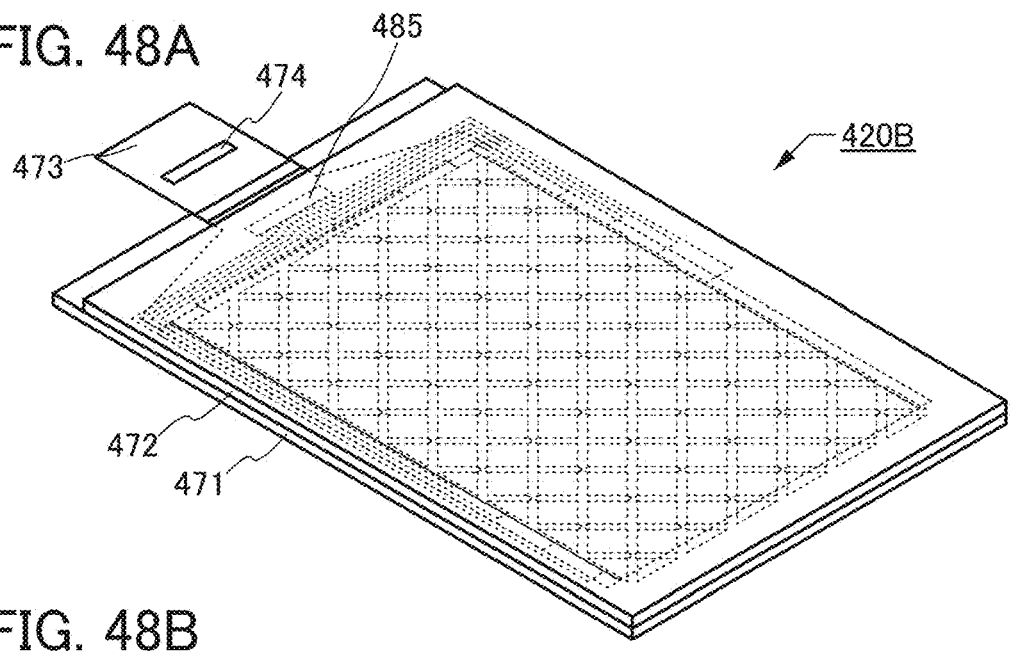
FIG. 48A
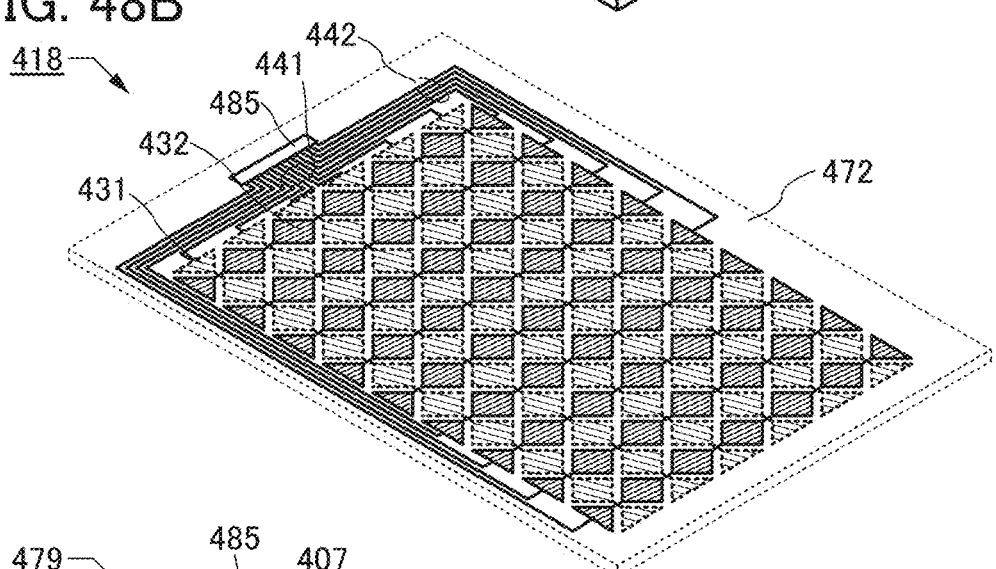
FIG. 48B
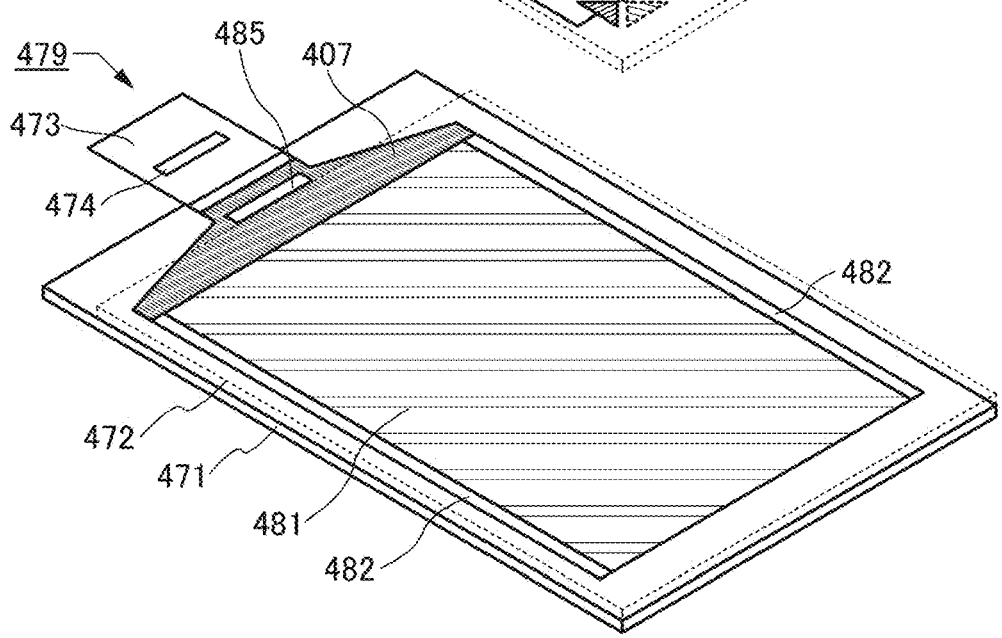

METHOD FOR MANUFACTURING A FLEXIBLE DEVICE HAVING TRANSISTORS

TECHNICAL FIELD

One embodiment of the present invention relates to a flexible device and a manufacturing method thereof. One embodiment of the present invention relates to a display device and a manufacturing method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a method for driving any of them, and a method for manufacturing any of them.

Note that in this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

Patent Document 1 discloses a flexible light-emitting device using an organic EL element.

REFERENCE

Patent Document

[Patent Document 1] Japanese Published Patent Application No. 2014-197522

DISCLOSURE OF INVENTION

Flexible devices typified by flexible displays can be obtained by forming semiconductor elements, such as transistors, and other elements over flexible substrates (films). However, flexible substrates have lower heat resistance than glass substrates or the like. Thus, when transistors or the like are directly formed on flexible substrates, the electrical characteristics and reliability of the transistors cannot be improved, in some cases.

Thus, a method described in Patent Document 1 in which a semiconductor element, a light-emitting element, or the like formed over a glass substrate over which a peeling layer is formed is peeled and transferred to a flexible substrate has been considered. In this method, the formation temperature of the semiconductor element can be increased; thus, an extremely highly reliable flexible device can be manufactured.

An object of one embodiment of the present invention is to provide a highly reliable flexible device. Another object of one embodiment of the present invention is to manufacture a flexible device at low temperatures. Another object of one embodiment of the present invention is to provide a method for manufacturing a flexible device with a simplified manufacturing process. Another object of one embodiment of the present invention is to provide a method for manufacturing a flexible device with high mass productivity. Another object of one embodiment of the present invention is to manufacture a flexible device using a large substrate.

Note that the descriptions of these objects do not disturb the existence of other objects. In one embodiment of the present invention, there is no need to achieve all the objects. Objects other than the above objects can be derived from the description of the specification and the like.

One embodiment of the present invention is a method for manufacturing a flexible device which includes a step of bonding a second substrate onto a first substrate by a first adhesive layer; a step of forming a first insulating layer over the second substrate; a step of forming a transistor including a gate electrode, a gate insulating layer, a semiconductor layer, a source electrode, and a drain electrode over the first insulating layer; a step of forming a second insulating layer covering the transistor; and a step of separating the first substrate and the second substrate from each other while heating is performed at a first temperature. The second substrate is more flexible than the first substrate. The first substrate contains a material whose heat resistant temperature (the lowest temperature among a glass transition point, a softening point, and a melting point of the material) is a second temperature. The second substrate contains a material whose heat resistant temperature is a third temperature. The first adhesive layer contains a thermoplastic material whose heat resistant temperature is a fourth temperature. Each of the first insulating layer, the second insulating layer, the semiconductor layer, and the gate insulating layer is formed at a temperature higher than or equal to room temperature and lower than the fourth temperature. The third temperature is higher than the fourth temperature and lower than the second temperature. The first temperature is higher than the fourth temperature and lower than the third temperature.

Each of the first insulating layer, the second insulating layer, the semiconductor layer, and the gate insulating layer is preferably formed at a temperature higher than or equal to room temperature and lower than 250° C. It is particularly preferable that each of the first insulating layer, the second insulating layer, the semiconductor layer, and the gate insulating layer be formed at a temperature higher than or equal to room temperature and lower than 220° C.

The semiconductor layer is preferably formed by processing a semiconductor film formed at a temperature higher than or equal to 80° C. and lower than or equal to 150° C.

The semiconductor film preferably includes an oxide containing In, Ga, and Zn and has crystallinity.

The fourth temperature is preferably higher than 220° C. and lower than 400° C. The fourth temperature is preferably higher than 250° C. and lower than 300° C. Moreover, the third temperature is preferably higher than or equal to 300° C. and lower than or equal to 500° C. The second temperature is preferably higher than 500° C.

Another embodiment of the present invention is a method for manufacturing a display device which employs the method for manufacturing a flexible device and includes a step of forming a display element over the second insulating layer, and a step of forming a protective layer to cover the display element. The display element and the protective layer are preferably formed after the first substrate and the second substrate are separated from each other.

Another embodiment of the present invention is a method for manufacturing a display device which employs the method for manufacturing a flexible device and includes, before the first substrate and the second substrate are separated from each other, a step of forming a display element over the second insulating layer, and a step of bonding a third substrate onto the display element by a second adhesive layer. The third substrate is preferably more flexible than the first substrate. The third substrate preferably contains a material whose heat resistant temperature is higher than the fourth temperature and lower than the second temperature. The second adhesive layer preferably contains a material whose heat resistant temperature is higher than the fourth temperature and lower than the second temperature.

Another embodiment of the present invention is a method for manufacturing a display device which employs the method for manufacturing a flexible device and includes, after the first substrate and the second substrate are separated from each other, a step of forming a display element over the second insulating layer, and a step of bonding a third substrate onto the display element by a second adhesive layer. The third substrate is preferably more flexible than the first substrate.

Another embodiment of the present invention is a flexible device including a first substrate, a transistor, a first insulating layer, and a second insulating layer. The first insulating layer is over and in contact with the first substrate. The transistor is over the first insulating layer. The second insulating layer covers the transistor. The first substrate has flexibility and contains a material whose heat resistant temperature is higher than or equal to 300° C. and lower than or equal to 500° C.

In the above flexible device, a first layer is preferably provided in contact with a surface of the first substrate on a side opposite to a surface on which the first insulating layer is provided. The first layer preferably contains a thermoplastic material whose heat resistant temperature is higher than 250° C. and lower than 300° C.

Another embodiment of the present invention is a display device including the flexible device, a display element, and a protective layer. The display element is preferably over the second insulating layer, and the protective layer preferably covers the display element.

Another embodiment of the present invention is a display device including the flexible device, a display element, an adhesive layer, and a second substrate. The display element is preferably over the second insulating layer, and the adhesive layer is preferably between the first substrate and the second substrate. The adhesive layer preferably contains a material whose heat resistant temperature is higher than or equal to 300° C. and lower than or equal to 500° C. The second substrate preferably has flexibility and contains a material whose heat resistant temperature is higher than or equal to 300° C. and lower than or equal to 500° C.

Another embodiment of the present invention is a method for manufacturing a semiconductor device which includes a step of forming a resin layer using a thermoplastic material over a formation substrate; a step of forming a transistor at a temperature lower than or equal to 350° C. over the resin layer; and a step of heating the resin layer to separate the formation substrate and the transistor from each other.

It is preferable that an oxide semiconductor layer be formed as a semiconductor layer of the transistor.

The resin layer is preferably formed with a spin coater.

The resin layer is preferably formed using a solution with a viscosity greater than or equal to 10 cP and less than 3000 cP.

A thickness of the resin layer is preferably greater than or equal to 0.01 μm and less than 2 μm, and further preferably greater than or equal to 0.1 μm and less than 1 μm.

A thermal expansion coefficient of the resin layer is preferably greater than or equal to 0.1 ppm/° C. and less than or equal to 10 ppm/° C.

The resin layer preferably has a function of being melted by heating.

The resin layer preferably has a function of being dissolved by an organic solvent.

It is preferable to supply an organic solvent to a separation interface between the formation substrate and the transistor.

Another embodiment of the present invention is a method for manufacturing a semiconductor device, which includes a first step of forming a resin layer using a thermoplastic material over a formation substrate, a second step of forming a first insulating layer over the resin layer, a third step of forming a transistor over the first insulating layer, a fourth step of forming a second insulating layer that covers the transistor, and a fifth step of heating the resin layer at a first temperature to separate the formation substrate and the first insulating layer from each other. The first temperature is higher than a glass transition point of the resin layer. Each of the second step, the third step, and the fourth step is preferably performed at a temperature lower than the first temperature.

The glass transition point of the resin layer is preferably higher than 350° C. and lower than or equal to 500° C. In that case, each of the second step, the third step, and the fourth step is preferably performed at a temperature lower than or equal to 350° C., and the first temperature is preferably higher than the glass transition point of the resin layer and lower than or equal to 500° C.

After the separation of the formation substrate and the transistor, it is preferable that a film be bonded by an adhesive to a surface exposed due to the separation from the formation substrate.

Another embodiment of the present invention is a method for manufacturing a flexible device, in which a resin layer is formed using a thermoplastic material over a formation substrate, a transistor is formed at a temperature lower than or equal to 350° C. over the resin layer, the resin layer is heated and melted to separate the formation substrate and the transistor from each other, and a film is positioned to overlap with the melted resin layer and pressure is applied to bond the film to the resin layer.

According to one embodiment of the present invention, a highly reliable flexible device can be provided, a flexible device can be manufactured at low temperatures, a method for manufacturing a flexible device with a simplified manufacturing process can be provided, a method for manufacturing a flexible device with high mass productivity can be provided, or a flexible device can be manufactured using a large substrate.

Note that the descriptions of these effects do not disturb the existence of other effects. One embodiment of the present invention does not necessarily achieve all the effects.

Other effects can be derived from the description of the specification, the drawings, and the claims.

BRIEF DESCRIPTION OF DRAWINGS

FIG. 38 is a perspective view illustrating a display device.

FIGS. 39A and 39B are cross-sectional views each illustrating a display device.

FIGS. 41A and 41B are cross-sectional views each illustrating a display device.

FIGS. 48A and 48B are perspective views illustrating a display device.

BEST MODE FOR CARRYING OUT THE INVENTION

Figure 1A:
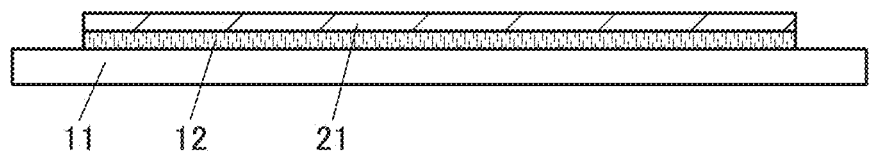
FIGS. 1A to 1E illustrate a method for manufacturing a flexible device.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that the terms "film" and "layer" can be interchanged with each other depending on the case or circumstances. For example, the term "conductive layer" can be changed into the term "conductive film." The term "insulating film" can be changed into the term "insulating layer."

Note that ordinal numbers such as "first" and "second" in this specification and the like are used in order to avoid confusion among components, and the terms do not limit the components numerically.

A transistor is a kind of semiconductor elements and can achieve amplification of current or voltage, switching operation for controlling conduction or non-conduction, or the like. A transistor in this specification includes, in its category, an insulated-gate field-effect transistor (IGFET) and a thin film transistor (TFT).

Embodiment 1

In this embodiment, a method for manufacturing a flexible device of one embodiment of the present invention will be described. Here, a display device including a display element will be described as an example of a flexible device.

In the method for manufacturing a flexible device of one embodiment of the present invention, first, a substrate with flexibility (also referred to as a flexible substrate) is bonded to a supporting substrate by a thermoplastic material. Fixing the flexible substrate to the supporting substrate can facilitate the transfer between manufacturing apparatuses and in a manufacturing apparatus. As the thermoplastic material, a material whose lowest temperature among a glass transition point, a softening point, and a melting point (or whose heat resistant temperature) is lower than that of the flexible substrate and that of the supporting substrate can be used.

Next, a first insulating layer is formed over the flexible substrate. The first insulating layer functions as a barrier layer that suppresses diffusion of impurities released from the flexible substrate or the thermoplastic material into a transistor, a display element, and the like that are formed later. The first insulating layer is formed at a temperature at least lower than the heat resistant temperature of the thermoplastic material.

After that, the transistor is formed over the first insulating layer. The transistor includes at least a gate electrode, a gate insulating layer, a semiconductor layer, a source, and a drain. The transistor may include a source electrode and a drain electrode. The gate electrode, the gate insulating layer, the semiconductor layer, the source, and the drain (and the source electrode and the drain electrode) are formed at a temperature lower than the heat resistant temperature of the thermoplastic material.

Subsequently, a second insulating layer is preferably formed to cover the transistor. The second insulating layer has a function of protecting the transistor. The second insulating layer is formed at a temperature at least lower than the heat resistant temperature of the thermoplastic material.

Next, the supporting substrate is heated at a temperature higher than the heat resistant temperature of the thermoplastic material to soften or melt the thermoplastic material and then, the flexible substrate is peeled (or separated) from the supporting substrate. Peeling is performed in the thermoplastic material, between the thermoplastic material and the supporting substrate, or between the thermoplastic material and the flexible substrate.

After peeling, the thermoplastic material might remain on the flexible substrate. The remaining thermoplastic material can be left or removed. In the case where the adhesion between the thermoplastic material and the flexible substrate is low, the remaining thermoplastic material can be torn off and removed after cooled and solidified. Alternatively, for example, the remaining thermoplastic material can be removed in the following manner: a liquid or the like that dissolves the thermoplastic material is sprayed, and the thermoplastic material is washed away or wiped off together with the liquid. Further alternatively, the remaining thermoplastic material can be removed by immersion of the flexible substrate to which the thermoplastic material is attached in the liquid, by plasma treatment in an atmosphere containing oxygen, or by ultraviolet irradiation in an atmosphere containing ozone, for example.

Note that the supporting substrate after peeling can be reused many times. In that case, if the thermoplastic material remains on the supporting substrate, the thermoplastic material is preferably removed by any of the above methods. In the case where the supporting substrate has sufficient heat resistance, the supporting substrate can be kept at a temperature higher than or equal to a temperature at which the thermoplastic material is decomposed to remove the thermoplastic material.

To manufacture the display device including the display element as a flexible device, the display element can be formed over the second insulating layer. In that case, it is preferable to form a protective film that covers the display element or to seal the display element by a flexible substrate and an adhesive layer to protect the display element.

In the case where the display element has resistance to heat applied during peeling, peeling may be performed after the display element is formed. This is preferable because the display element can be formed while the flexible substrate is fixed to the supporting substrate. Meanwhile, in the case where the display element does not have resistance to heat applied during peeling, the display element is preferably formed after peeling.

The heat resistant temperature of the supporting substrate, the heat resistant temperature of the flexible substrate, the heat resistant temperature of the thermoplastic material, and the maximum temperature for the formation of the transistor or the like are preferably high in this order. Peeling can be performed at a temperature higher than the heat resistant temperature of the thermoplastic material and lower than the heat resistant temperature of the flexible substrate.

The formation temperatures of the first insulating layer, the second insulating layer, and the gate electrode, the gate insulating layer, the semiconductor layer, the source, and the drain of the transistor can be lower than the heat resistant temperature of the thermoplastic material, for example. The formation temperatures are preferably higher than or equal to room temperature and are preferably lower than 250° C., further preferably lower than or equal to 240° C., still further preferably lower than or equal to 230° C., and yet still further preferably lower than or equal to 220° C., for example.

As the thermoplastic material, a material whose heat resistant temperature (the lowest temperature among a softening point, a glass transition point, and a melting point) is at least lower than the heat resistant temperature of the flexible substrate can be used. The heat resistant temperature of the thermoplastic material is preferably higher than 220° C. and lower than 400° C., further preferably higher than 240° C. and lower than 350° C., and still further preferably higher than 250° C. and lower than 300° C., for example.

For the flexible substrate, a material whose heat resistant temperature is at least higher than the heat resistant temperature of the thermoplastic material or a material whose heat resistant temperature is at least higher than the temperature of heat applied during peeling can be used. For example, a material whose heat resistant temperature is higher than or equal to 250° C. and lower than or equal to 1000° C., preferably higher than or equal to 280° C. and lower than or equal to 800° C., and further preferably higher than or equal to 300° C. and lower than or equal to 500° C. can be used.

For the supporting substrate, a material whose heat resistant temperature is at least higher than the temperature of heat applied during peeling can be used. Although the heat resistant temperature of the supporting substrate can be lower than the heat resistant temperature of the flexible substrate, the supporting substrate is preferably sufficiently stable to heat. It is preferable to use, for example, a material whose heat resistant temperature is higher than or equal to 500° C., preferably higher than or equal to 600° C., and further preferably higher than or equal to 700° C. because the supporting substrate can be cleaned by heat treatment to be reused.

For a semiconductor film included in the semiconductor layer, an oxide semiconductor is preferably used. It is particularly preferable to use an oxide containing In, M (M is Al, Ti, Ga, Ge, Sn, or Hf), and Zn, especially an oxide containing In, Ga, and Zn. An oxide semiconductor has higher field-effect mobility than amorphous silicon, and films with little variation can be formed using an oxide semiconductor at low temperatures as compared to the case of polycrystalline silicon.

It is particularly preferable that a semiconductor film formed using an oxide containing In, Ga, and Zn be formed by a sputtering method at a temperature higher than or equal to 80° C. and lower than or equal to 150° C. in an oxygen atmosphere. The proportion of the oxygen flow rate in a deposition gas during deposition is preferably greater than or equal to 1% and less than or equal to 33%, further preferably greater than or equal to 5% and less than or equal to 25%, and still further preferably greater than or equal to 5% and less than or equal to 20%; typically, approximately 10% is preferable. When a semiconductor film is formed at a low oxygen flow rate at relatively low temperatures as described above, a film containing both crystal parts with orientation and very minute crystal parts with no orientation can be obtained. The use of such a semiconductor film can provide a highly reliable transistor with excellent electrical characteristics and little variation.

With the use of the method for manufacturing a flexible device of one embodiment of the present invention, an extremely highly reliable semiconductor element can be manufactured over a flexible substrate directly. Furthermore, an apparatus such as a laser apparatus is not needed for the separation of a flexible substrate and a substrate that supports the flexible substrate.

A semiconductor film formed in the above-described formation method does not need to be subjected to annealing treatment at high temperatures for increasing the crystallinity, improving the film quality, or obtaining stable film quality and can be formed at low temperatures; thus, extremely favorable electrical characteristics can be obtained. A local heating apparatus such as a laser apparatus in particular is unnecessary.

A laser apparatus costs a lot not only for introduction, but also for maintenance and management. In addition, there is a problem of output stability or the like. Thus, the manufacturing method of one embodiment of the present invention that does not require a laser apparatus can be regarded as a manufacturing method at an extremely low cost.

Specific examples of the manufacturing method and specific structure examples will be described below with reference to drawings.

Example 1 of Manufacturing Method

Hereinafter, a method for manufacturing a display device in which a light-emitting element is used as a display element will be described as an example of the method for manufacturing a flexible device of one embodiment of the present invention.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

As light used for exposure in a photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Bonding]

First, a supporting substrate 11 and a substrate 21 are bonded to each other by an adhesive layer 12 (FIG. 1A).

The substrate 21 is a flexible substrate. For the supporting substrate 11, a material having flexibility at least lower than that of the substrate 21 is used. Fixing the substrate 21 to the supporting substrate 11 can facilitate the transfer of the substrate 21.

Examples of a material having flexibility and transmitting visible light include glass that is thin enough to have flexibility, polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin, a polysiloxane resin, a cycloolefin resin, a polystyrene resin, a polyamide-imide resin, a polyurethane resin, a polyvinyl chloride resin, a polyvinylidene chloride resin, a polytetrafluoroethylene (PTFE) resin, an acrylonitrile butadiene styrene (ABS) resin, and an aramid resin. In particular, a material whose thermal expansion coefficient is low is preferred, and for example, a polyamide-imide resin, a polyimide resin, an aramid resin, or PET can be suitably used. Alternatively, a substrate in which a glass fiber is impregnated with an organic resin or a substrate whose thermal expansion coefficient is reduced by mixing an organic resin with an inorganic filler can be used. A substrate using such a material is lightweight, and thus, a display device using this substrate can also be lightweight.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display device. Although there is no particular limitation on a material of the metal substrate, it is preferable to use, for example, a metal such as aluminum, copper, or nickel, or an alloy such as an aluminum alloy or stainless steel.

The adhesive layer 12 contains a thermoplastic material. For the adhesive layer 12, a liquid material, a paste-form material, or a sheet-form material can be used. A sheet-form material is suitably used because it can be cut into a desired shape.

The adhesive layer 12 can be formed in the following manner, for example: a thermoplastic material containing a solvent is applied to the substrate 21 by a screen printing method, a spin coating method, a spray coating method, or the like, the supporting substrate 11 and the substrate 21 are bonded to each other, and then the solvent is removed. Note that the supporting substrate 11 and the substrate 21 may be bonded to each other by pressing the substrate 21 against the supporting substrate 11 after the solvent is removed.

Alternatively, the supporting substrate 11 and the substrate 21 may be bonded to each other in the following manner: a thermoplastic material that does not contain a solvent is put on the supporting substrate 11, the substrate 21 is placed thereover, and the substrates are subjected to thermocompression bonding.

It is preferable that the thermoplastic material used for the adhesive layer 12 be chemically stable to a gas, a chemical solution, and the like used in later steps.

As the thermoplastic material, for example, a material containing a crystalline high-molecular material or an amorphous high-molecular material can be used. For example, a material containing polyvinyl chloride, polystyrene, polyethylene, acrylic, polyacetal, polyamide, polyimide, polyamide-imide, polyetherimide, polyethylene terephthalate, polybutylene terephthalate, polycarbonate, polyphenylenesulfide, polypropylene, polyphenyleneether, polyarylate, polysulfone, polyethersulfone, polyphenilensulfide, polyetherketone, an acrylonitrile-styrene (AS) resin, an ABS resin, or the like can be used. Alternatively, a material containing a fluoropolymer such as polytetrafluoroethylene, chlorotrifluoroethylene, polyvinylidene fluoride, or polyvinyl fluoride or a material containing a fluoropolymer copolymer such as a perfluoroalkoxy fluoropolymer may be used. A material containing a liquid crystal polymer may also be used. It is preferable to use a material that contains such a material and has improved heat resistance and chemical stability.

For the supporting substrate 11, a material having stiffness high enough to facilitate the transfer and having resistance to heat applied in the manufacturing process can be used. For example, a material such as glass, quartz, ceramics, sapphire, an organic resin, a semiconductor, a metal, or an alloy can be used. As the glass, for example, alkali-free glass, barium borosilicate glass, or aluminoborosilicate glass can be used.

FIG. 1A illustrates the case where the width of the adhesive layer 12 is the same as the width of the substrate 21. The position and shape of the adhesive layer 12 are not limited to those illustrated in FIG. 1A.

Figure 3A:
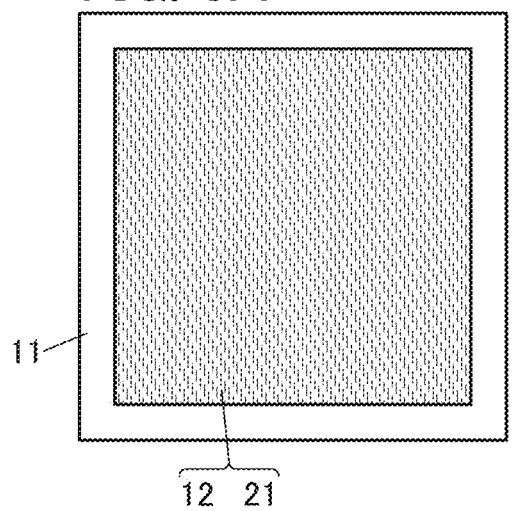
FIGS. 3A to 3F each illustrate an example of the position and shape of an adhesive layer.
Figure 3B:
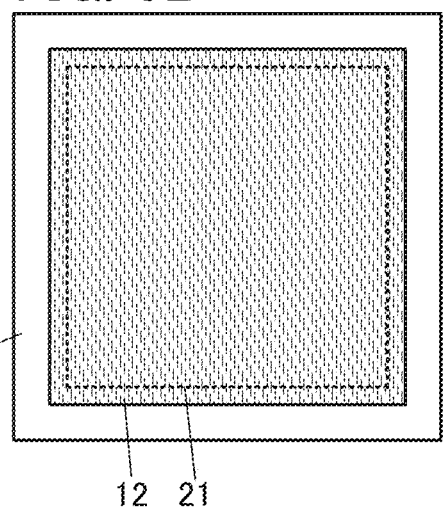
Figure 3C:
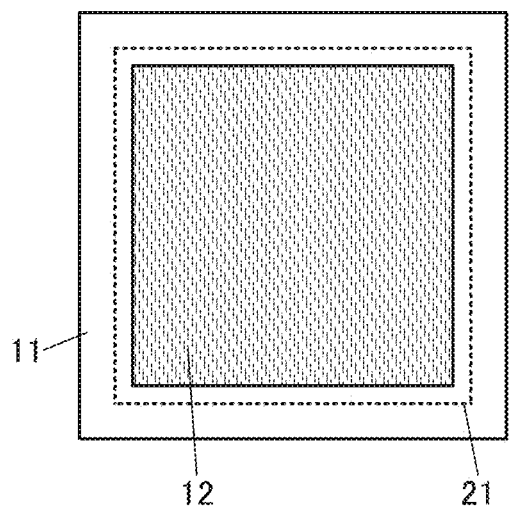

FIGS. 3A to 3F each illustrate an example of the position and shape of the adhesive layer 12. FIGS. 3A to 3F are schematic top views at the stage of FIG. 1A. Here, the substrate 21 is shown by a dashed line. FIG. 3A illustrates an example where the adhesive layer 12 and the substrate 21 are provided in the same region. FIG. 3B illustrates an example where the outer edge of the substrate 21 is located inward from the outer edge of the adhesive layer 12 and the adhesive layer 12 partly extends beyond a region where the substrate 21 is provided. FIG. 3C illustrates an example where the outer edge of the adhesive layer 12 is located inward from the outer edge of the substrate 21 and the substrate 21 partly extends beyond a region where the adhesive layer 12 is provided.

Figure 3D:
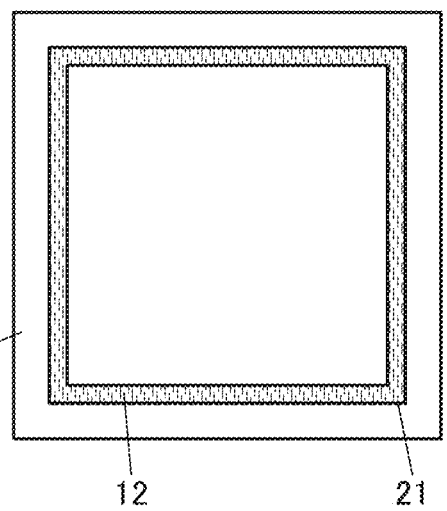
Figure 3E:
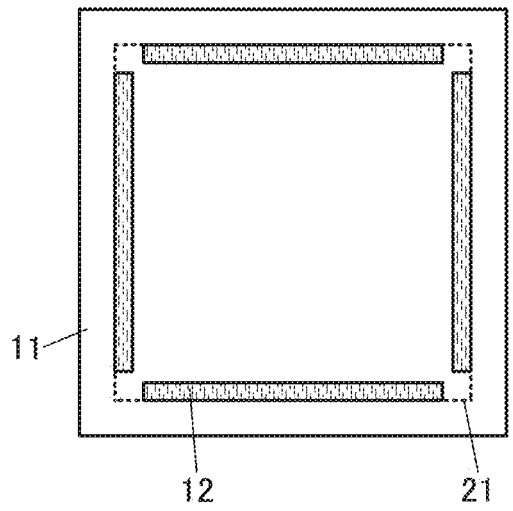
Figure 3F:
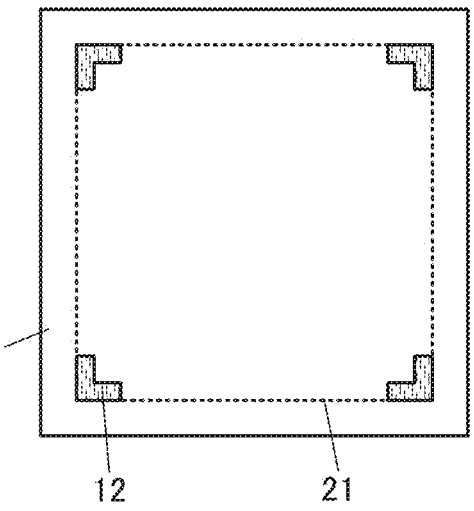

FIG. 3D illustrates an example where the adhesive layer 12 is provided in a region along the outer edge of the substrate 21 and not in the center portion. FIG. 3E illustrates an example different from that in FIG. 3D in that the adhesive layer 12 is not provided in regions at the four corners of the substrate 21. FIG. 3F illustrates an example where the adhesive layer 12 is provided in regions at the four corners of the substrate 21 and the vicinity thereof. When the adhesive layer 12 is provided along the outer edge of the substrate 21, a region with no adhesive layer 12 can be provided to divide the adhesive layer 12 into parts as illustrated in FIGS. 3E and 3F, in which case the breakage of the substrate 21 due to expansion and contraction of a space between the supporting substrate 11 and the substrate 21 by heat can be prevented. In the case where the adhesive layer 12 is provided along a closed curve (closed shape) as illustrated in FIG. 3D, a space surrounded by the supporting substrate 11, the substrate 21, and the adhesive layer 12 is preferably a reduced-pressure atmosphere.

The adhesive layer 12 needs to have a thickness large enough to fix the substrate 21 to the supporting substrate 11, and is preferably as thin as possible as long as the adhesive layer 12 does not lose its function. The thickness of the adhesive layer 12 is preferably greater than or equal to 10 nm and less than or equal to 500 μm, further preferably greater than or equal to 50 nm and less than or equal to 300 μm, still further preferably greater than or equal to 100 nm and less than or equal to 100 μm, and yet still further preferably greater than or equal to 100 nm and less than or equal to 10 μm, for example. When the adhesive layer 12 is made thin, the force required to separate the supporting substrate 11 and the substrate 21 from each other in a peeling step described later can be reduced; thus, peeling can be easily performed. In addition, when the adhesive layer 12 is made thin, the adhesive layer 12 remaining on the substrate 21 or the supporting substrate 11 after peeling can be easily removed.

[Formation of Insulating Layer 31]

Figure 1B:
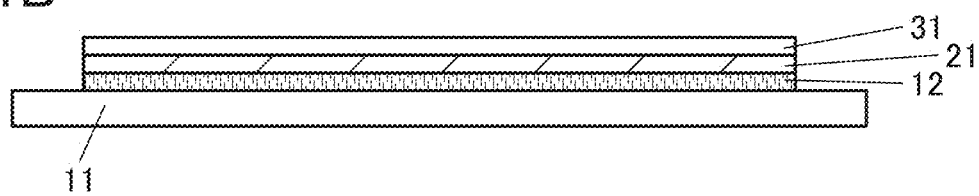

Next, an insulating layer 31 is formed over the substrate 21 as illustrated in FIG. 1B. The insulating layer 31 is formed at a temperature at least lower than the heat resistant temperature of the adhesive layer 12.

The insulating layer 31 can be used as a barrier layer that prevents diffusion of impurities contained in the substrate 21 or the adhesive layer 12 into a transistor and a display element formed later. Thus, it is preferable to use a material with a high barrier property.

For the insulating layer 31, an inorganic insulating film such as a silicon nitride film, a silicon oxynitride film, a silicon oxide film, a silicon nitride oxide film, an aluminum oxide film, or an aluminum nitride film can be used, for example. A stack including two or more of the above insulating films may also be used. It is particularly preferable to use a silicon nitride film and a silicon oxide film stacked in this order from the substrate 21 side.

In the case where the substrate 21 has an uneven surface, the insulating layer 31 preferably covers the unevenness. The insulating layer 31 may function as a planarization layer that fills the unevenness. It is preferable to use a stack including an organic insulating film and an inorganic insulating film for the insulating layer 31, for example. The organic insulating film can be formed using an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin. The organic insulating film is preferably formed using a material whose heat resistance is higher than that of the adhesive layer 12.

The inorganic insulating film used for the insulating layer 31 is formed at a substrate temperature higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 250° C., still further preferably higher than or equal to 100° C. and lower than or equal to 220° C. Higher temperatures can provide the insulating film with higher density and a higher barrier property.

The organic insulating film used for the insulating layer 31 is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

[Formation of Transistor]

Figure 1C:
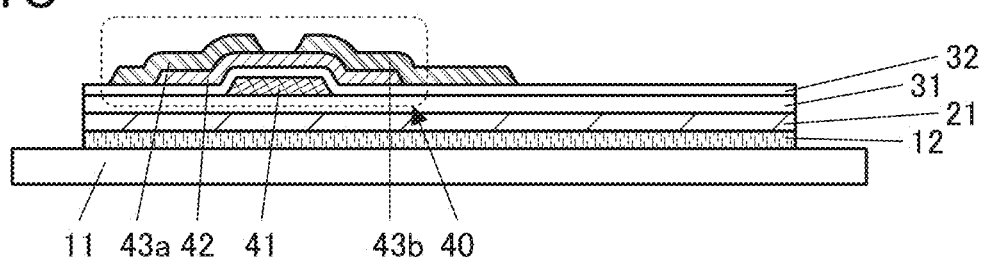

Next, as illustrated in FIG. 1C, a transistor 40 is formed over the insulating layer 31. Here, an example where a bottom-gate transistor is formed as an example of the transistor 40 will be described.

A conductive layer 41 is formed over the substrate 21. The conductive layer 41 can be formed in the following manner: a conductive film is formed, a resist mask is formed, the conductive film is etched, and the resist mask is removed.

The conductive film is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

Next, an insulating layer 32 is formed. For the insulating layer 32, the description of the inorganic insulating film that can be used for the insulating layer 31 can be referred to.

The insulating layer 32 is formed at a substrate temperature higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 250° C., still further preferably higher than or equal to 100° C. and lower than or equal to 220° C. Higher temperatures can provide the insulating film with higher density and a higher barrier property.

Then, a semiconductor layer 42 is formed. The semiconductor layer 42 can be formed in the following manner: a semiconductor film is formed, a resist mask is formed, the semiconductor film is etched, and the resist mask is removed.

The semiconductor film is formed at a substrate temperature higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 220° C., still further preferably higher than or equal to 80° C. and lower than or equal to 150° C.

For the semiconductor film, for example, an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because off-state current of the transistor can be reduced.

It is particularly preferable that the semiconductor film used in one embodiment of the present invention be formed by a sputtering method while the substrate is heated in an atmosphere containing oxygen.

The substrate temperature during the deposition of the semiconductor film is preferably higher than or equal to 80° C. and lower than or equal to 150° C. and further preferably higher than or equal to 100° C. and lower than or equal to 150° C., typified by 130° C. High substrate temperature can result in a large number of crystal parts with orientation.

The oxygen flow rate ratio (partial pressure of oxygen) during the deposition is preferably higher than or equal to 1% and lower than 33%, further preferably higher than or equal to 5% and lower than or equal to 30%, still further preferably higher than or equal to 5% and lower than or equal to 20%, and yet still further preferably higher than or equal to 5% and lower than or equal to 15%, typified by 10%. Low oxygen flow rate can result in a large number of crystal parts with no orientation in the film.

Accordingly, setting the substrate temperature and the oxygen flow rate during the deposition within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film of this embodiment is not limited to an In—Ga—Zn-based oxide; for example, an In-M-Zn-based oxide (M is Al, Ga, Y, or Sn) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example, than a transistor including a semiconductor film that contains only crystal parts with no orientation.

Figure 15A:
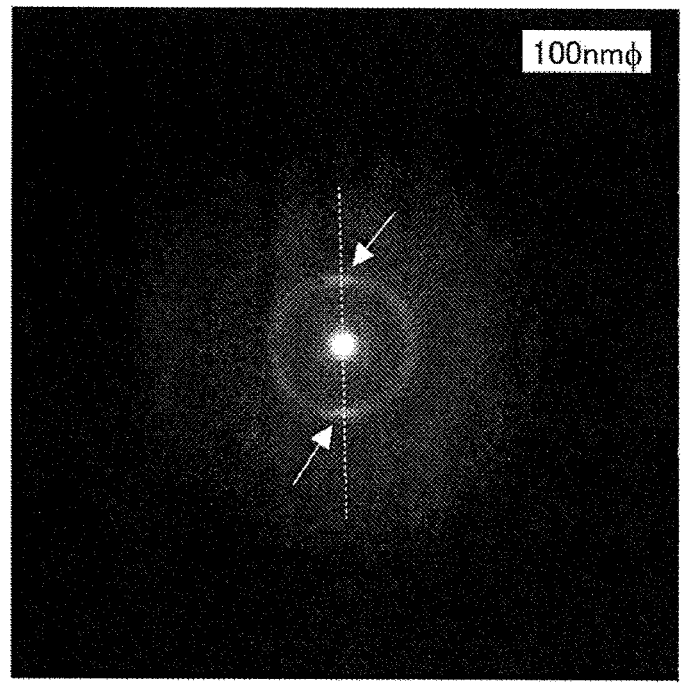
FIGS. 15A and 15B each show an electron diffraction pattern of an oxide semiconductor film.
Figure 15B:
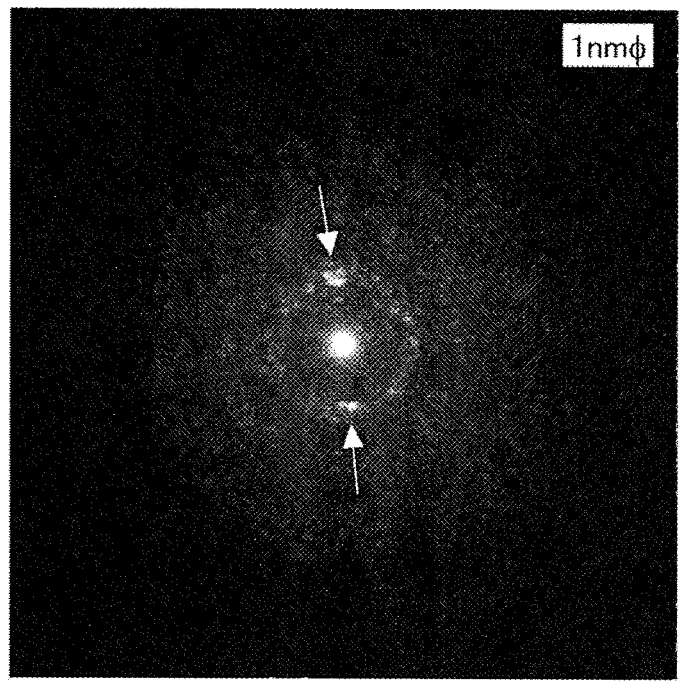

FIGS. 15A and 15B show examples of electron diffraction patterns of such an oxide semiconductor film, obtained by incidence of electrons from a direction perpendicular to the cross section of the film. FIG. 15A shows an electron diffraction pattern observed with a beam diameter of 100 nm. FIG. 15B shows an electron diffraction pattern of a submicroscopic region observed with a beam diameter of 1 nm.

As shown in FIG. 15A, in the case of a large beam diameter, that is, in the case of a large observation area, a ring-shaped pattern that is circularly symmetric about a direct spot indicating the electron incident direction and spots that are on the ring-shaped pattern and are brighter than the ring-shaped pattern are observed. These spots are attributed to the diffraction from a crystal plane perpendicular to the c-axis, and suggest the existence of a large number of crystal parts whose c-axes are aligned in the thickness direction, in the oxide semiconductor film.

The observation of the submicroscopic region revealed that, as shown in FIG. 15B, the ring-shaped diffraction pattern in FIG. 15A is a group of microscopic spots. This suggests that the oxide semiconductor film contains a large number of randomly aligned submicroscopic crystal parts. The spots with c-axis alignment in the thickness direction are clearly observed also in the submicroscopic region, which indicates that the proportion of crystal parts with such orientation is higher than that of crystal parts aligned in the other directions.

A transistor including a semiconductor film that contains both first crystal parts with orientation and submicroscopic second crystal parts with no orientation can have higher field-effect mobility than a transistor including a semiconductor film that contains a large proportion (e.g., higher than 80%) of the first crystal parts with orientation, especially when gate voltage is low, leading to a low driving voltage of a device, easy high-frequency driving of a device, and the like.

Note that in crystal parts with layered crystallinity parallel to the c-axis, oxygen is unlikely to diffuse in a direction along the c-axis. In an oxide semiconductor film containing both the first crystal parts with orientation and a region other than the first crystal parts, the region other than the first crystal parts functions as an oxygen diffusion path; thus, the oxide semiconductor film can have greatly improved oxygen diffusibility and oxygen permeability. Accordingly, performing treatment for supplying oxygen to the oxide semiconductor film can reduce oxygen vacancies in the oxide semiconductor film and defects at an interface between the oxide semiconductor film and an insulating film, and can easily reduce defect levels. As a result, a semiconductor device with both high reliability and high field-effect mobility can be obtained.

A transistor with such improved field-effect mobility is suitably used for a switch that can be used for rapid charging and discharging of a capacitor. As a typical example, the transistor is suitably used for a demultiplexer circuit.

A demultiplexer circuit is a circuit that divides one input signal into two or more signals and outputs the signals. When a demultiplexer circuit including the above transistor is provided between a signal line driver circuit and a signal line of a display device, the number of terminals in the case of mounting the signal line driver circuit in a form of an integrated circuit (IC) can be reduced, leading to a display device with a narrow frame that can operate at a higher speed.

It is preferable that the proportion of a region other than crystal parts observed in the oxide semiconductor film with a transmission electron microscope be higher than or equal to 20% and lower than 100%, further preferably higher than or equal to 20% and lower than or equal to 80%, and still further preferably higher than or equal to 20% and lower than or equal to 60%, for example. The oxide semiconductor film including the region other than the clear crystal parts at the above proportion can have improved oxygen permeability. Accordingly, an effect of reducing oxygen vacancies exhibited as a result of the treatment for supplying oxygen to the oxide semiconductor film can be enhanced. Thus, application of such an oxide semiconductor film to a semiconductor device, such as a transistor, can provide an extremely highly reliable semiconductor device.

The consideration of the deposition mechanism of a semiconductor film is made below. In the case where a sputtering target contains a plurality of crystal grains each of which has a layered structure and an interface at which the crystal grain is easily cleaved, ion collision with the sputtering target might cleave crystal grains to make plate-like or pellet-like sputtering particles. The obtained plate-like or pellet-like sputtering particles are deposited on a substrate, which probably results in formation of a semiconductor film containing nanocrystals. A semiconductor film containing crystal parts with orientation is likely to be formed when the substrate is heated because the nanocrystals are then bonded to each other or rearranged at a substrate surface.

Note that the above consideration is made on the assumption that a sputtering method is used; a sputtering method is particularly preferable because the crystallinity can be easily adjusted. Note that instead of a sputtering method, a PLD method, a PECVD method, a thermal CVD method, an ALD method, a vacuum evaporation method, or the like may be used. As an example of the thermal CVD method, an MOCVD method can be given.

Next, a conductive layer 43a and a conductive layer 43b are formed. The conductive layers 43a and 43b can be formed in the following manner: a conductive film is formed, a resist mask is formed, the conductive film is etched, and the resist mask is removed.

The conductive film is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

Note that during the processing of the conductive layer 43a and the conductive layer 43b, the semiconductor layer 42 might be partly etched to be thin in a region not covered by the resist mask. An oxide semiconductor film containing crystal parts with orientation is preferable for the semiconductor layer 42 because the unintended etching can be prevented.

In the above manner, the transistor 40 can be fabricated. In the transistor 40, part of the conductive layer 41 functions as a gate, part of the insulating layer 32 functions as a gate insulating layer, and the conductive layer 43a and the conductive layer 43b function as a source and a drain.

[Formation of Insulating Layer 33]

Figure 1D:
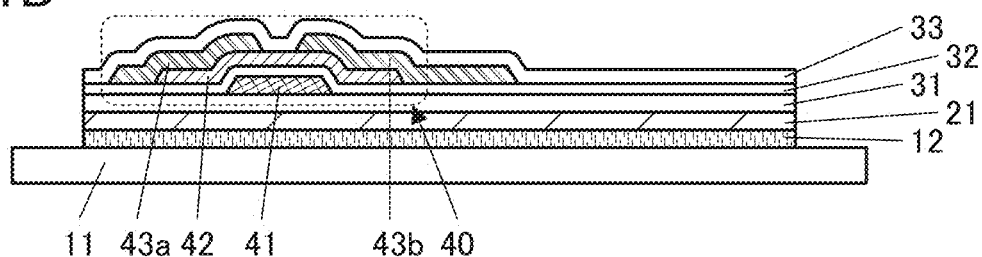

Next, an insulating layer 33 that covers the transistor 40 is formed as illustrated in FIG. 1D. The insulating layer 33 can be formed in a manner similar to that of the insulating layer 32.

The insulating layer 33 is formed at a substrate temperature higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 250° C., still further preferably higher than or equal to 100° C. and lower than or equal to 220° C. Higher temperatures can provide the insulating film with higher density and a higher barrier property.

It is preferable to use an oxide insulating film, such as a silicon oxide film or a silicon oxynitride film, formed at a low temperature in the above range in an atmosphere containing oxygen for the insulating layer 33. An insulating film with low oxygen diffusibility and oxygen permeability, such as a silicon nitride film, is preferably stacked over the silicon oxide film or the silicon oxynitride film. The oxide insulating film formed at low temperatures in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the semiconductor layer 42. As a result, oxygen vacancies in the semiconductor layer 42 can be filled and defects at the interface between the semiconductor layer 42 and the insulating layer 33 can be repaired, leading to a reduction in defect levels. Accordingly, an extremely highly reliable semiconductor device can be fabricated.

Through the above steps, the transistor 40 and the insulating layer 33 covering the transistor 40 can be formed over the flexible substrate 21.

If the substrate 21 and the supporting substrate 11 are separated from each other at this stage by a method described later, a flexible device including no display element can be fabricated. Forming the transistor 40 or forming a capacitor, a resistor, a wiring, and the like in addition to the transistor 40, and separating the substrate 21 and the supporting substrate 11 from each other by the method described later can provide a flexible device including a semiconductor circuit, for example.

[Formation of Insulating Layer 34]

Figure 1E:
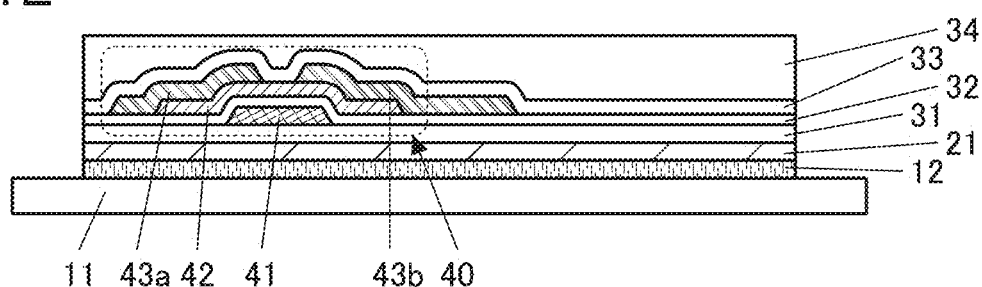

Then, an insulating layer 34 is formed over the insulating layer 33 as illustrated in FIG. 1E. The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

In the case of using the organic insulating film for the insulating layer 34, the insulating layer 34 is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

In the case of using an organic insulating film for the insulating layer 34, substrate temperature during the deposition is higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 250° C., and still further preferably higher than or equal to 100° C. and lower than or equal to 220° C. Higher temperatures can provide the insulating film with higher density and a higher barrier property.

[Formation of Display Element 60]

Figure 2A:
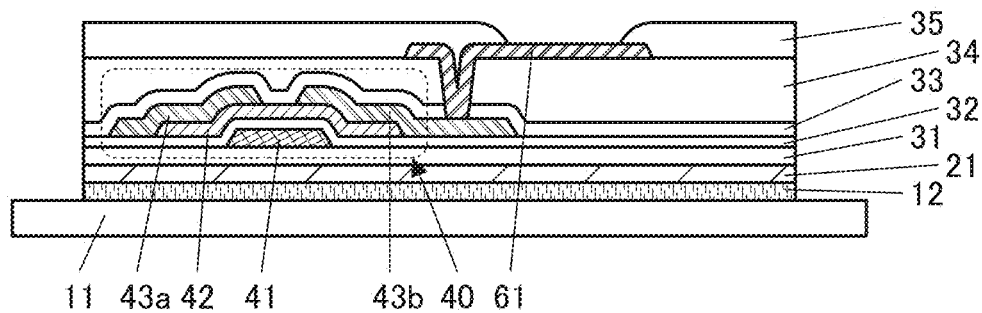
FIGS. 2A to 2D illustrate a method for manufacturing a flexible device.

Next, openings that reach the conductive layer 43b and the like are formed in the insulating layer 34 and the insulating layer 33 as illustrated in FIG. 2A.

After that, a conductive layer 61 is formed as illustrated in FIG. 2A. Part of the conductive layer 61 functions as a pixel electrode. The conductive layer 61 can be formed in the following manner: a conductive film is formed, a resist mask is formed, the conductive film is etched, and the resist mask is removed.

The conductive film is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

Subsequently, an insulating layer 35 that covers an end portion of the conductive layer 61 is formed as illustrated in FIG. 2A. For the insulating layer 35, the description of the organic insulating film or the inorganic insulating film that can be used for the insulating layer 31 can be referred to.

In the case of using an organic insulating film for the insulating layer 35, the insulating layer 35 is formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

In the case of using an inorganic insulating film for the insulating layer 35, substrate temperature during the deposition is higher than or equal to room temperature and lower than or equal to the heat resistant temperature of the adhesive layer 12, preferably higher than or equal to room temperature and lower than or equal to 300° C., further preferably higher than or equal to 80° C. and lower than or equal to 250° C., and still further preferably higher than or equal to 100° C. and lower than or equal to 220° C. Higher temperatures can provide the insulating film with higher density and a higher barrier property.

Figure 2B:
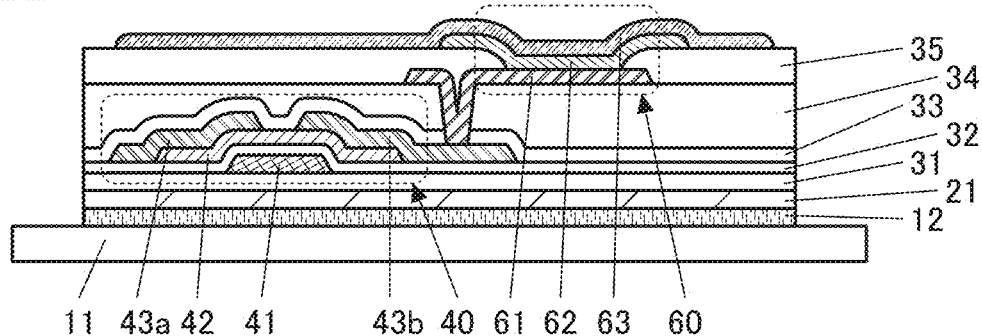

Next, an EL layer 62 and a conductive layer 63 are formed as illustrated in FIG. 2B.

The EL layer 62 can be formed by an evaporation method, a coating method, a printing method, a discharge method, or the like. In the case where the EL layer 62 is formed for each individual pixel, an evaporation method using a shadow mask such as a metal mask, an ink-jet method, or the like can be used. In the case of sharing the EL layer 62 by some pixels, an evaporation method not using a metal mask can be used.

The conductive layer 63 can be formed by an evaporation method, a sputtering method, or the like.

The EL layer 62 and the conductive layer 63 are each formed at a temperature lower than or equal to the heat resistant temperature of the adhesive layer 12, preferably lower than or equal to 300° C., further preferably lower than or equal to 250° C., still further preferably lower than or equal to 220° C., and higher than or equal to room temperature.

In the above manner, a display element 60 can be completed. In the display element 60, the conductive layer 61 part of which functions as a pixel electrode, the EL layer 62, and the conductive layer 63 part of which functions as a common electrode are stacked.

[Bonding of Substrate 22]

Figure 2C:
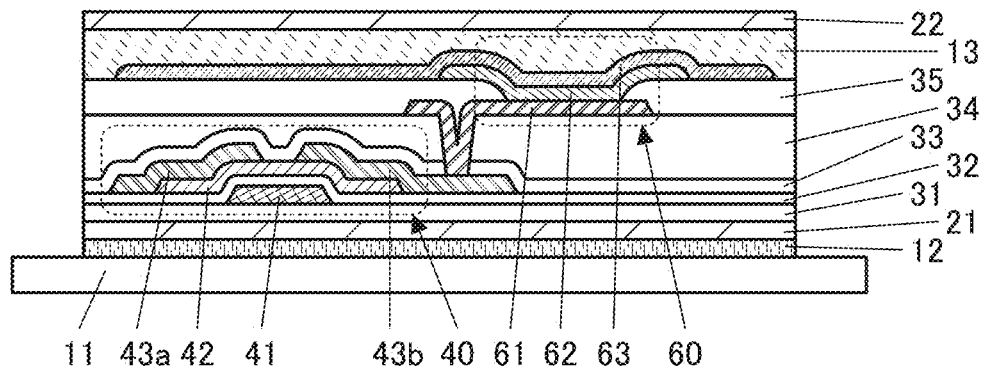

Next, a substrate 22 is bonded onto the display element 60 by an adhesive layer 13 as illustrated in FIG. 2C. Accordingly, the display element 60 can be sealed by the adhesive layer 13 and the substrate 22.

The substrate 22 preferably has flexibility. For the substrate 22, the description of the substrate 21 can be referred to.

A curable material is preferably used for the adhesive layer 13. Alternatively, a thermoplastic material whose heat resistant temperature is higher than that of the adhesive layer 12 may be used, in which case the adhesive layer 13 can be prevented from being softened or dissolved by heat in a separation method described later; thus, sealing breakage can be prevented.

[Separation]

Figure 2D:
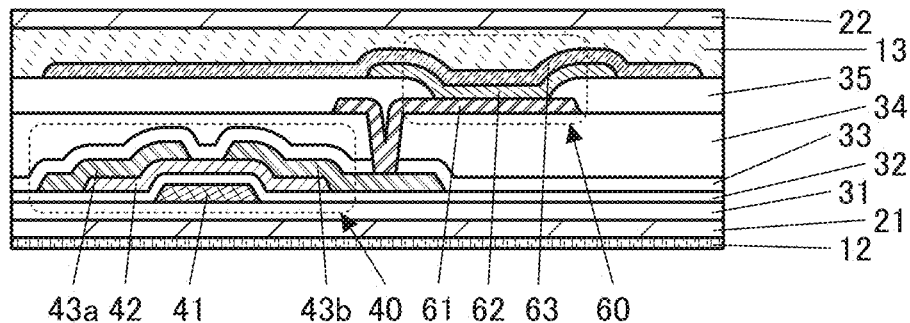

Then, the supporting substrate 11 is heated at a temperature higher than the heat resistant temperature of the adhesive layer 12, and the supporting substrate 11 and the substrate 21 are separated from each other as illustrated in FIG. 2D.

The supporting substrate 11 is heated at, for example, a temperature higher than 220° C. and lower than 400° C., preferably higher than or equal to 240° C. and lower than or equal to 350° C., further preferably higher than or equal to 250° C. and lower than or equal to 350° C.

Figure 4A:
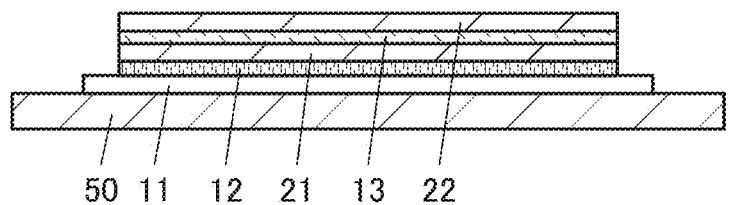
FIGS. 4A to 4E each illustrate a method for manufacturing a flexible device.

FIG. 4A illustrates an example where a stack including the supporting substrate 11, the adhesive layer 12, the substrate 21, the adhesive layer 13, and the substrate 22 is placed on a stage 50 provided with a heating mechanism.

The supporting substrate 11 is heated while being fixed to the stage 50 provided with a heating mechanism. The stage 50 can have any structure as long as the supporting substrate 11 can be fixed thereto. The stage 50 may be provided with an attachment mechanism for vacuum attachment, electrostatic attachment, or the like or a mechanism for physically fixing the supporting substrate 11, for example.

The separation can be performed by applying perpendicular force to the substrate 21, or by attaching a mechanism to part of the top surface of the substrate 22 and pulling up the substrate 22, for example.

Figure 4B:
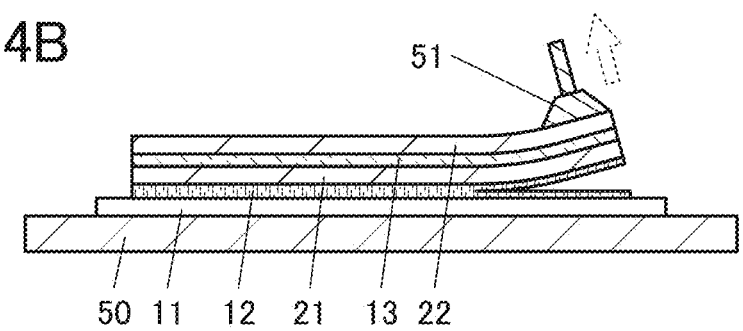

FIG. 4B illustrates an example where the supporting substrate 11 and the substrate 21 are separated from each other by attaching a member 51 provided with an attachment mechanism to the top surface of an end portion of the substrate 22 and pulling up the member 51.

Figure 4C:
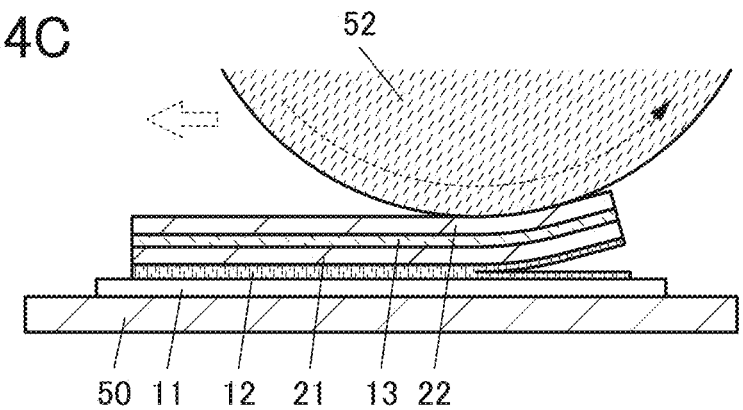

FIG. 4C illustrates an example where the supporting substrate 11 and the substrate 21 are separated from each other by pressing a drum-shaped member 52 whose surface is adhesive against the top surface of the substrate 22 and rotating the member 52.

Note that in the examples illustrated in FIGS. 4B and 4C, the adhesive layer 12 partly remains on the substrate 21. When the supporting substrate 11 and the substrate 21 are separated from each other while the viscosity of the adhesive layer 12 is sufficiently low, for example, the adhesive layer 12 might be divided into an upper part and a lower part as illustrated in FIGS. 4B and 4C and the adhesive layer 12 might remain on both the supporting substrate 11 and the substrate 21.

In the case where the viscosity of the adhesive layer 12 is relatively high, peeling might occur at an interface between the supporting substrate 11 and the adhesive layer 12 or an interface between the adhesive layer 12 and the substrate 21, whichever the adhesion is lower. In other words, when the adhesion of the interface between the adhesive layer 12 and the supporting substrate 11 or the substrate 21 is less than the force required to divide the adhesive layer 12 into an upper part and a lower part, peeling might occur at the interface. In that case, the adhesive layer 12 remains on one of the supporting substrate 11 and the substrate 21 and does not remain on the other, in some cases.

If the viscosity of the adhesive layer 12 is made sufficiently low by heating, the supporting substrate 11 and the substrate 21 can be slid relatively to each other to separate them.

Figure 4D:
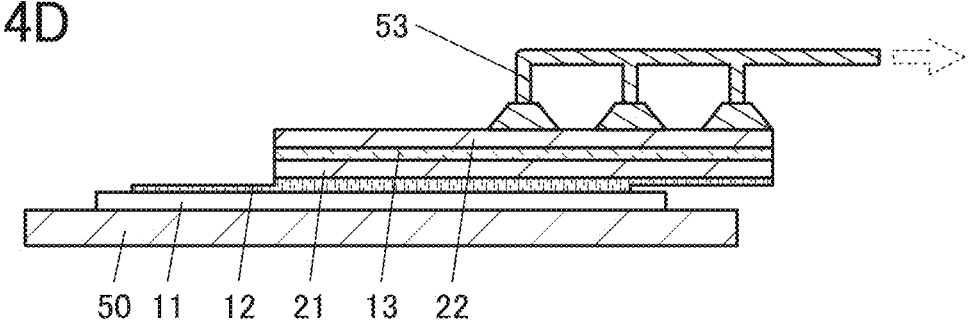

FIG. 4D illustrates an example where the supporting substrate 11 and the substrate 21 are separated from each other by attaching a member 53 provided with an attachment mechanism to the top surface of the substrate 22 and pulling the member 53 laterally. In that case, the area of a region where the member 53 can be attached is preferably large. In the example illustrated in FIG. 4D, the member 53 has a plurality of attachment mechanisms.

Figure 4E:
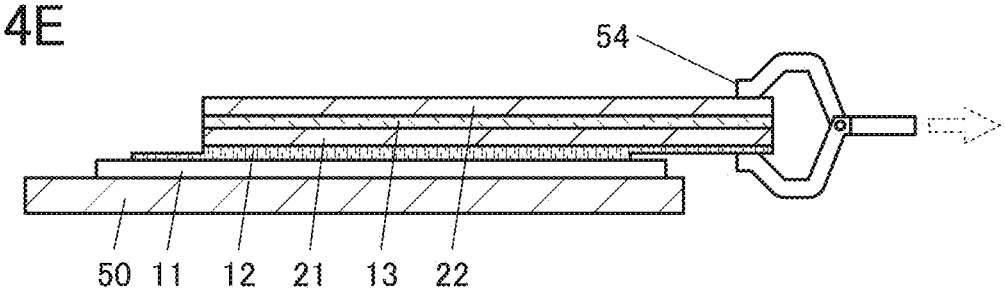

FIG. 4E illustrates an example where the supporting substrate 11 and the substrate 21 are separated from each other by using a member 54 that can pinch the substrate 21 and the substrate 22 and pulling the member 54 laterally. In that case, the substrate 21 is preferably bonded to the supporting substrate 11 so as to extend beyond the supporting substrate 11, in which case the substrate 21 is easily pinched by the member 54. Note that the supporting substrate 11 and the substrate 21 may be separated from each other by pulling the member 54 diagonally upward or upward.

A method for separating the supporting substrate 11 and the substrate 21 from each other is not limited to the above examples. In the case where the adhesion at the interface between the adhesive layer 12 and the supporting substrate 11 or the adhesion at the interface between the adhesive layer 12 and the substrate 21 is sufficiently lower than the adhesion at the other interfaces between two layers (e.g., an interface between the substrate 21 and the insulating layer 31 and an interface between the insulating layer 33 and the insulating layer 34), for example, the supporting substrate 11 and the substrate 21 can be separated from each other without heating. In that case, a thermosetting resin can be used for the adhesive layer 12. Note that the adhesion between the supporting substrate 11 and the substrate 21 is preferably high enough to not cause peeling during the transfer of the supporting substrate.

[Display Device]

The separation of the supporting substrate 11 and the substrate 21 can complete a display device 10 (FIG. 2D). Since a pair of substrates (the substrate 21 and the substrate 22) is flexible, the display device 10 can remain bent or can be bent repeatedly, for example.

Figure 5A:
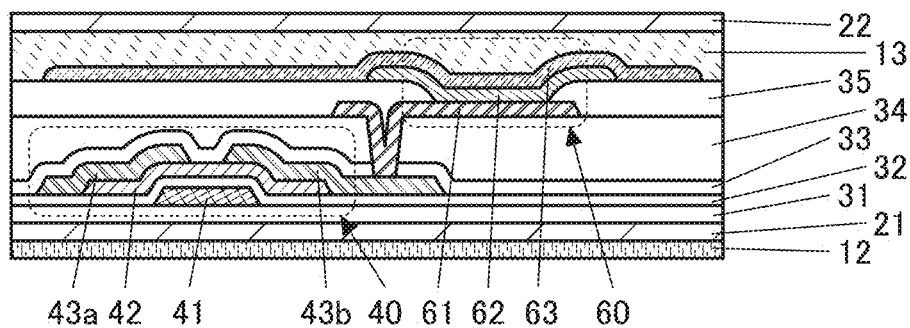
FIGS. 5A and 5B each illustrate a structure example of a flexible device.
Figure 5B:
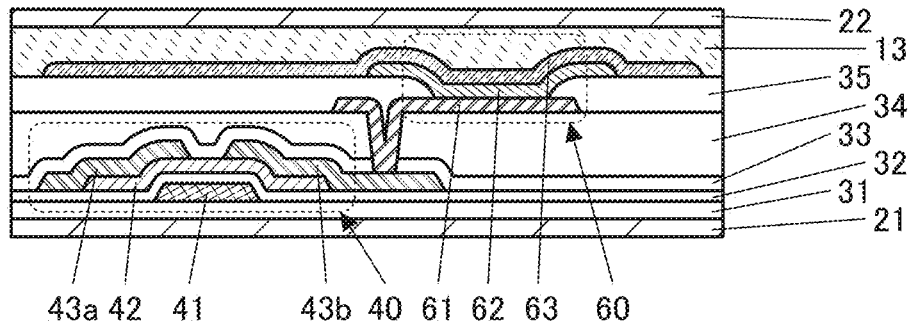

FIG. 2D illustrates an example where the adhesive layer 12 partly remains on the substrate 21; in some cases, however, the adhesive layer 12 remains entirely on the substrate 21 as illustrated in FIG. 5A or the adhesive layer 12 does not remain on the substrate 21 as illustrated in FIG. 5B, depending on the viscosity of the adhesive layer 12 at the time of the separation.

In particular, when a substrate formed of an inorganic material such as a metal or glass is used as the supporting substrate 11 and a substrate containing an organic resin is used as the substrate 21, peeling is likely to occur between the supporting substrate 11 and the adhesive layer 12. Thus, the adhesive layer 12 is likely to remain on the substrate 21 as illustrated in FIG. 2D and FIG. 5A.

Since the adhesive layer 12 contains a thermoplastic resin, the adhesive layer 12 may be kept remaining on the substrate 21 if the display device 10 is used at a temperature lower than a softening point, a glass transition point, and a melting point of the adhesive layer 12. In that case, the adhesive layer 12 can be used as a protective layer for protecting the substrate 21.

In the case where the adhesive layer 12 remains on the substrate 21 as illustrated in FIG. 2D and FIG. 5A, the adhesive layer 12 may be removed in a step after the separation step. For example, the adhesive layer 12 may be removed using a solvent that dissolves the adhesive layer 12. Alternatively, the adhesive layer 12 may be peeled by injection of a liquid with low surface tension between the adhesive layer 12 and the substrate 21, or by physical force applied in a direction in which the adhesive layer 12 is pulled. Further alternatively, the remaining adhesive layer 12 may be decomposed and removed by plasma treatment in an oxygen atmosphere, ultraviolet light irradiation in an ozone atmosphere, or the like.

The above is the description of Example 1 of manufacturing method.

Example 2 of Manufacturing Method

An example of a manufacturing method partly different from Example 1 of manufacturing method will be described below.

Figure 6A:
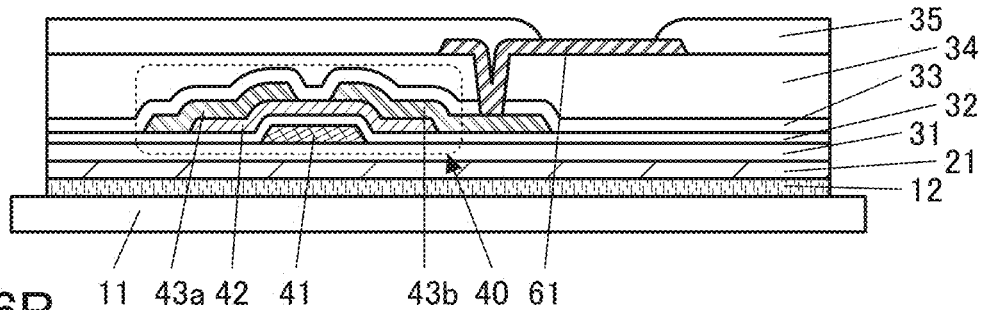
FIGS. 6A to 6E illustrate a method for manufacturing a flexible device.

First, as in the case in Example 1 of manufacturing method, the supporting substrate 11 and the substrate 21 are bonded to each other by the adhesive layer 12. Then, the insulating layer 31, the transistor 40, the insulating layer 33, the insulating layer 34, the conductive layer 61, and the insulating layer 35 are formed in this order over the substrate 21 (FIG. 6A).

Figure 6B:
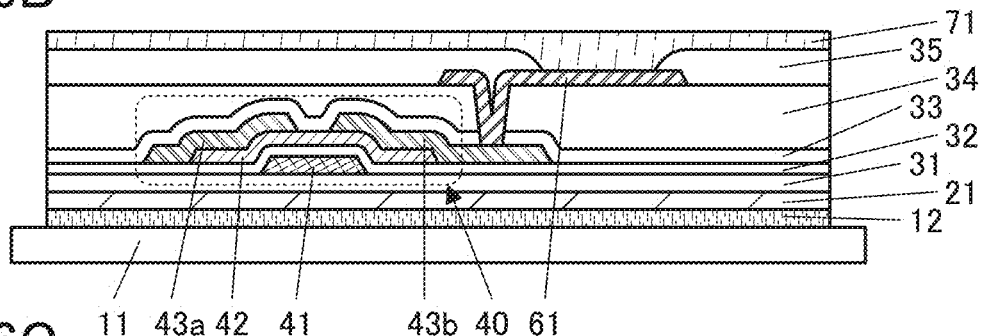

Subsequently, a protective layer 71 is formed as illustrated in FIG. 6B.

The protective layer 71 has a function of protecting surfaces of the insulating layer 35 and the conductive layer 61 in steps after the separation step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface. A stack of a water-soluble resin and an adhesive that can be peeled by light or heat may be used for the protective layer 71 that can be removed.

Alternatively, for the protective layer 71 that can be removed, a base material having a property in which adhesion is strong in a normal state but weakened when irradiated with light or heated may be used. For example, a thermal peeling tape whose adhesion is weakened by heat, a UV-peeling tape whose adhesion is weakened by ultraviolet irradiation, or the like may be used. Alternatively, a weak adhesion tape with weak adhesion in a normal state or the like can be used.

Next, the supporting substrate 11 and the substrate 21 are separated from each other in a manner similar to that in Example 1 of manufacturing method. It is particularly preferable to use the drum-shaped member 52 for the separation as illustrated in FIG. 4C. In the case where a member that is attached to a surface is used for the separation as illustrated in FIG. 4B and FIG. 4D, the member is preferably attached outward from a region where a display region and a driver circuit are provided. Furthermore, in the case where a member that pinches the substrate 21 is used as illustrated in FIG. 4E, the member preferably pinches a portion located outward from the region where the display region and the driver circuit are provided.

Figure 6C:
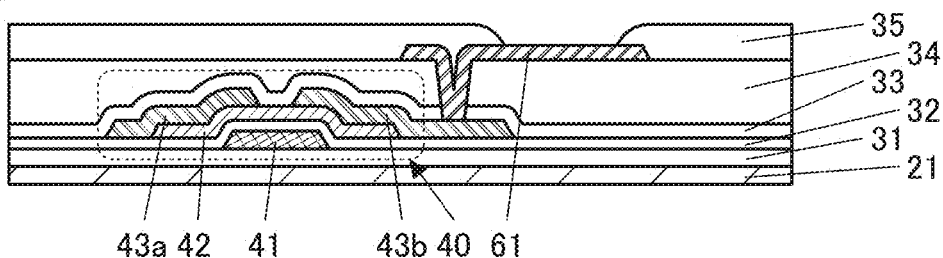

After the supporting substrate 11 and the substrate 21 are separated from each other, the protective layer 71 is removed (FIG. 6C).

Figure 6D:
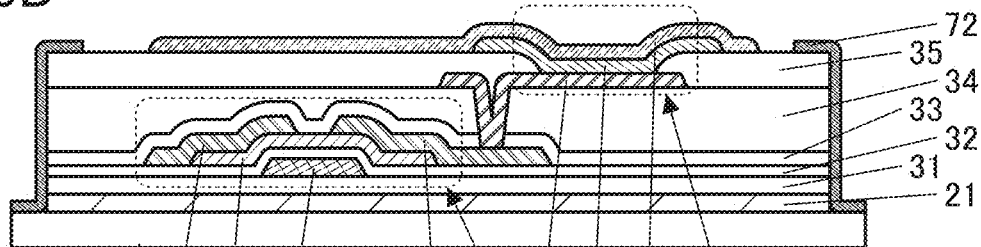

Subsequently, the EL layer 62 and the conductive layer 63 are formed, whereby the display element 60 is completed (FIG. 6D).

The EL layer 62 and the conductive layer 63 may be formed while the substrate 21 is fixed to a stage of a deposition apparatus, but are preferably formed while the substrate 21 is fixed to a supporting substrate 73 by a tape 72 or the like and the supporting substrate 73 is placed on the stage, as illustrated in FIG. 6D. Fixing the substrate 21 to the supporting substrate 73 can facilitate the transfer of the substrate 21 in an apparatus and between apparatuses. A substrate similar to the supporting substrate 11 can be used as the supporting substrate 73.

Then, in a manner similar to that in Example 1 of manufacturing method, the substrate 21 and the substrate 22 are bonded to each other by the adhesive layer 13.

Figure 6E:
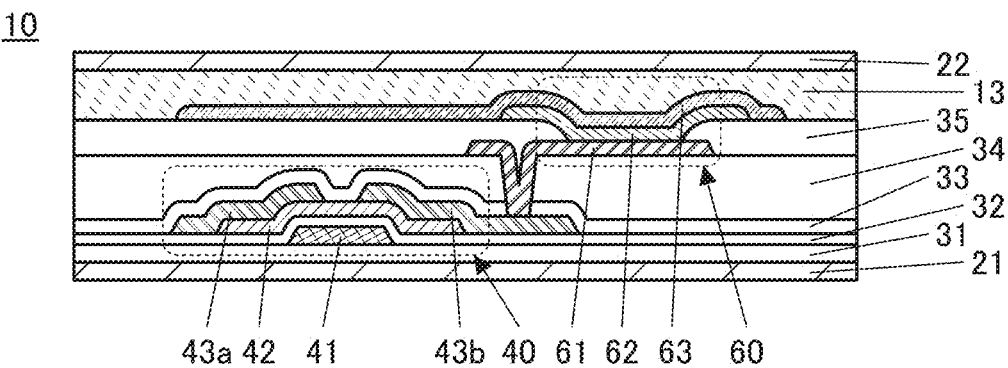

Through the above steps, the display device 10 can be manufactured (FIG. 6E).

In Example 2 of manufacturing method, the EL layer 62 and the conductive layer 63 can be formed after the separation of the substrates and thus can be formed using materials with low heat resistance. Materials with low heat resistance can also be used for the adhesive layer 13 and the substrate 22 provided after the separation. Thus, a material can be selected more freely, leading to fabrication of a highly reliable display device at lower cost.

Example 3 of Manufacturing Method

An example of a manufacturing method partly different from the examples of a manufacturing method will be described below.

Figure 7A:
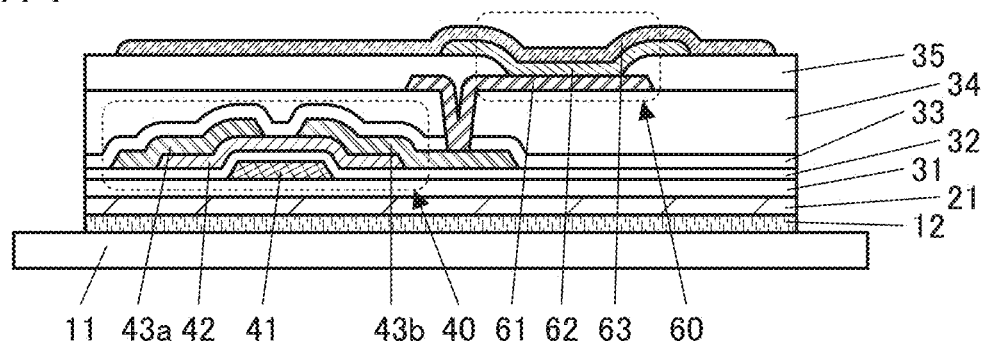
FIGS. 7A to 7D illustrate a method for manufacturing a flexible device.

First, as in the case in Example 1 of manufacturing method, the supporting substrate 11 and the substrate 21 are bonded to each other by the adhesive layer 12. Then, the insulating layer 31, the transistor 40, the insulating layer 33, the insulating layer 34, the conductive layer 61, and the insulating layer 35 are formed in this order over the substrate 21. Subsequently, the EL layer 62 and the conductive layer 63 are formed, whereby the display element 60 is completed (FIG. 7A).

Figure 7B:
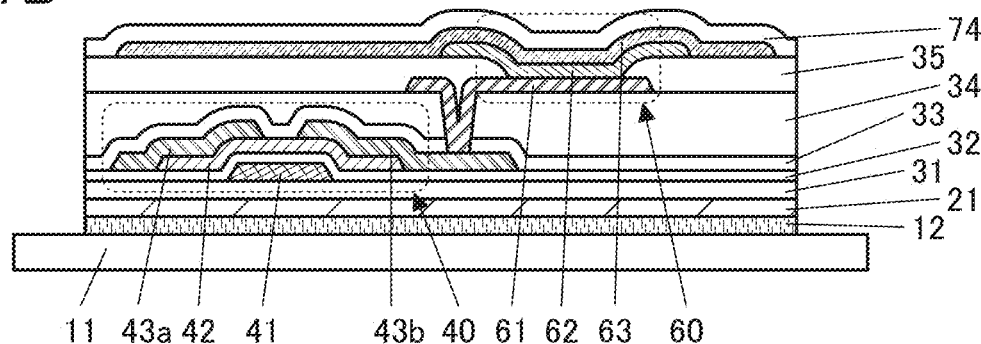

Next, an insulating layer 74 is formed so as to cover the conductive layer 63 (FIG. 7B). The insulating layer 74 functions as a protective layer that prevents diffusion of impurities such as water into the display element 60.

The insulating layer 74 preferably contains an inorganic insulating material with a high barrier property that can be used for the insulating layer 31. A stack including an inorganic insulating material and an organic insulating material can also be used.

Figure 7C:
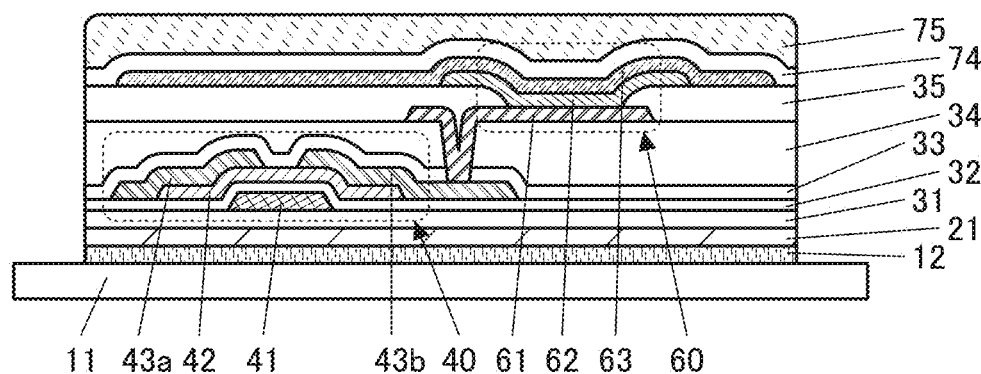

Then, a protective layer 75 is formed over the insulating layer 74 (FIG. 7C). The protective layer 75 can be used as a layer positioned on the outermost surface of the display device 10.

The above-described organic insulating film that can be used for the insulating layer 31 is preferably used for the protective layer 75 because the surface of the display device 10 can be prevented from being damaged or cracked. In the protective layer 75, the organic insulating film and a hard coat layer (e.g., a silicon nitride layer) for protecting a surface from damage or the like, a layer formed of a material that can disperse pressure (e.g., an aramid resin layer), or the like may be stacked.

Figure 7D:
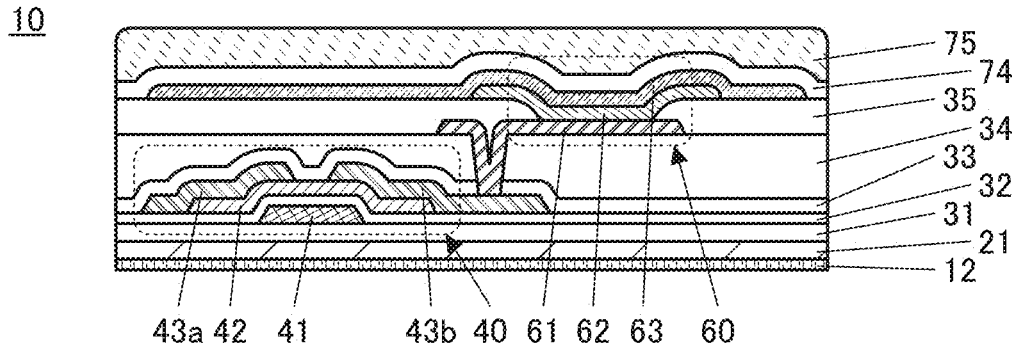

Next, the supporting substrate 11 and the substrate 21 are separated from each other in a manner similar to that in Example 1 of manufacturing method. Accordingly, the display device 10 illustrated in FIG. 7D can be completed. Since the substrate 22 is not used, it is preferable to use the drum-shaped member 52 for the separation as illustrated in FIG. 4C, in which case the surface is less likely to be damaged. In the case where a member that is attached to the surface is used as illustrated in FIG. 4B and FIG. 4D, the member is preferably attached outward from the region where the display region and the driver circuit are provided. In that case, the insulating layer 74 or the like in a portion to which the member is attached might be cracked. The cracked portion may be cut and removed after the separation to prevent the crack from reaching the region where the display region and the driver circuit are provided.

Modification Example

In Example 3 of manufacturing method, as described in Example 2 of manufacturing method, the protective layer 71 that can be removed may be formed after the conductive layer 61 and the insulating layer 35 are formed, and the supporting substrate 11 and the substrate 21 may be separated from each other before the EL layer 62 and the like are formed. In that case, the EL layer 62, the conductive layer 63, the insulating layer 74, the protective layer 75, and the like may be formed while the substrate 21 after the separation is fixed to the supporting substrate 73.

The above is the description of the example of a manufacturing method.

At least part of this embodiment can be implemented in combination with any of the other embodiments described in this specification as appropriate.

Embodiment 2

In this embodiment, a method for manufacturing a flexible device of one embodiment of the present invention will be described.

One embodiment of the present invention is a method for manufacturing a flexible device which includes a step of forming a resin layer using a thermoplastic material over a formation substrate, a step of forming a transistor at a temperature lower than or equal to 350° C. over the resin layer, and a step of heating the resin layer to separate the formation substrate and the transistor from each other.

An oxide semiconductor is preferably used for a semiconductor layer of the transistor. With the use of an oxide semiconductor, the maximum process temperature can be lower than that of the case of using low-temperature polysilicon (LTPS).

In the case of using LTPS for the semiconductor layer of the transistor, the resin layer is required to have heat resistance because a temperature of approximately 500° C. to 550° C. is applied. However, high heat resistant temperature of the resin layer leads to an increase in the cost because a heating process at extremely high temperatures, a laser irradiation process, or the like is required to peel the transistor from the formation substrate.

In contrast, the transistor formed using an oxide semiconductor does not need heat treatment at high temperatures unlike the case of LTPS, and can be formed at a temperature lower than or equal to 350° C., or even lower than or equal to 300° C. Thus, the resin layer is not required to have high heat resistance. Accordingly, the heat resistant temperature of the resin layer can be low, and heating temperature of the resin layer applied to peel the transistor from the formation substrate thus can be low. Furthermore, the transistor formed using an oxide semiconductor does not need laser crystallization; thus, the resin layer can be thin. Since the resin layer is not required to have high heat resistance and can be thinned, the cost can be significantly reduced.

In one embodiment of the present invention, the resin layer is heated at a temperature higher than the heat resistant temperature of the resin layer. Note that the heat resistant temperature of the resin layer is the lowest temperature among a glass transition point, a softening point, and a melting point of the resin layer. The resin layer is heated at a temperature higher than 350° C. and lower than or equal to 500° C., for example, to peel the transistor from the formation substrate.

The peeling step does not require heating at extremely high temperatures; thus, the materials of the layers can be selected from a wide range, which contributes to a reduction in the cost. Furthermore, a laser irradiation apparatus does not need to be used in the peeling step, which also contributes to a reduction in the cost. In addition, since the resin layer does not need to be formed thick, the process time can be shortened. In the case of using a polyimide resin, for example, formation of a thick resin layer results in extremely high cost. Thus, when the resin layer is made thin, the cost can be reduced. The thickness of the resin layer is, for example, greater than or equal to 0.01 μm and less than 2 μm.

In one embodiment of the present invention, the resin layer is preferably formed using a solution with low viscosity, in which case the resin layer can be easily made thin. The resin layer can be formed by spin coating, for example. The resin layer can be formed using, for example, a solution with a viscosity greater than or equal to 10 cP and less than 3000 cP.

It is preferable that volume expansion or swelling of the resin layer do not occur, in which case an element such as the transistor can be prevented from being broken even when the resin layer is heated in the peeling step. The thermal expansion coefficient of the resin layer is preferably greater than or equal to 0.1 ppm/° C. and less than or equal to 10 ppm/° C., for example.

The resin layer is preferably heated at as low temperature as possible. At least part of the resin layer might be melted, changed in quality, softened, or vaporized by heating. The resin layer is heated at a temperature higher than the heat resistant temperature of the resin layer.

The resin layer is preferably melted by heating. When the resin layer is melted, peeling can be performed more surely, which can result in an increase in the yield.

The resin layer is preferably dissolved by an organic solvent. The organic solvent may be supplied to a peeling interface to dissolve the resin layer and to promote peeling, for example. Alternatively, the resin layer remaining on a surface of a first insulating layer may be dissolved by the organic solvent after peeling from the formation substrate to remove the resin layer. For the organic solvent, a material having a function of dissolving the resin layer can be used. For example, thinner may be used.

The smaller the thickness of the resin layer to be melted or dissolved is, the more the process time can be shortened. Accordingly, the resin layer is preferably made thin in one embodiment of the present invention.

In one embodiment of the present invention, separation of the formation substrate and the resin layer is performed while or after the resin layer is heated.

The resin layer can be heated with the use of, for example, at least one of an oven, a hot plate, a heating blower, a stage provided with a heating mechanism, a roller provided with a heating mechanism, and the like.

The oven, the hot plate, and the stage provided with a heating mechanism can heat the resin layer uniformly. The use of the roller provided with a heating mechanism enables peeling to be performed while the resin layer is heated.

Specifically, the method for manufacturing a flexible device of one embodiment of the present invention includes the following five steps. In a first step, a resin layer is formed using a thermoplastic material over a formation substrate. In a second step, a first insulating layer is formed over the resin layer. In a third step, a transistor is formed over the first insulating layer. In a fourth step, a second insulating layer that covers the transistor is formed. In a fifth step, the resin layer is heated at a temperature higher than the heat resistant temperature of the resin layer to separate the formation substrate and the first insulating layer from each other.

It is preferable to form all of the insulating layers, the transistor, and the like formed over the resin layer before the fifth step at a temperature lower than or equal to the heat resistant temperature of the resin layer. Accordingly, the resin layer can be prevented from being peeled from the formation substrate before the fifth step. Before the fifth step, a display element or the like may be formed over the second insulating layer. An element whose heat resistance is lower than that of the resin layer is preferably formed after the fifth step.

The first insulating layer can prevent moisture and the like released by heating of the resin layer from entering the transistor. The second insulating layer can prevent impurities from entering the transistor from the outside. Each of the first insulating layer and the second insulating layer preferably includes at least one of a silicon nitride film, a silicon oxynitride film, a silicon nitride oxide film, and an aluminum oxide film. Each of the first insulating layer and the second insulating layer preferably includes a stack including a silicon nitride film and a silicon oxynitride film. In that case, the silicon oxynitride film is preferably closer to the transistor than the silicon nitride film is.

Owing to the heating of the resin layer, an element such as the transistor can be peeled from the formation substrate. By the method of one embodiment of the present invention, a flexible device can be manufactured at low temperatures; thus, the material of the resin layer can be selected from a wide range, high mass productivity can be obtained at low cost, and a large substrate can be used, for example.

A film may be bonded to a surface exposed by peeling, by an adhesive. The film can function as a supporting substrate of the flexible device. Alternatively, the resin layer itself may be used as the supporting substrate of the flexible device.

The resin layer being melted may be used as an adhesive. After peeling from the formation substrate, the melted resin layer and the film are positioned so as to overlap with each other and pressure is applied, whereby the film can be bonded to the resin layer. There is no particular limitation on a member that is bonded to the resin layer, and as well as the film, a polarizing plate, an optical member, a touch panel, and the like can be used.

The method for manufacturing a flexible device of one embodiment of the present invention will be described below with reference to FIGS. 8A to 8E, FIGS. 9A to 9D, FIGS. 10A to 10D, FIGS. 11A to 11D, FIGS. 12A and 12B, FIGS. 13A to 13E, and FIGS. 14A to 14D. Here, an example where a display device including an EL element is fabricated as the flexible device will be described. Note that the detailed descriptions of the steps described in Embodiment 1 are omitted in some cases.

Example 1 of Manufacturing Method

Figure 8A:
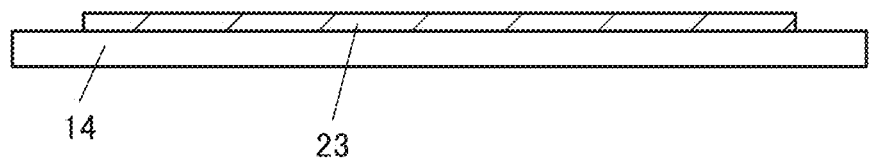
FIGS. 8A to 8E illustrate a method for manufacturing a flexible device.

First, a resin layer 23 is formed using a thermoplastic material over a formation substrate 14 (FIG. 8A).

The resin layer 23 has flexibility. The formation substrate 14 has lower flexibility than the resin layer 23 does. Since the resin layer 23 is formed over the formation substrate 14, the resin layer 23 can be transferred easily.

For the resin layer 23, a polyimide resin is preferably used.

Other examples of a material that can be used for the resin layer 23 are polyvinyl chloride, polystyrene, polyethylene, acrylic, polyacetal, polyamide, polyamide-imide, polyetherimide, polyethylene terephthalate, polybutylene terephthalate, polycarbonate, polyphenylenesulfide, polypropylene, polyphenyleneether, polyarylate, polysulfone, polyethersulfone, polyphenilensulfide, polyetherketone, an AS resin, and an ABS resin. A fluoropolymer such as polytetrafluoroethylene, chlorotrifluoroethylene, polyvinylidene fluoride, or polyvinyl fluoride, a fluoropolymer copolymer such as a perfluoroalkoxy fluoropolymer, or a material containing a liquid crystal polymer may also be used. It is preferable to use a material that contains such a material and has improved heat resistance and chemical stability.

The resin layer 23 is preferably formed with a spin coater. Alternatively, the resin layer 23 can be formed by dipping, spray coating, ink-jetting, dispensing, screen printing, or offset printing, or with a doctor knife, a slit coater, a roll coater, a curtain coater, or a knife coater, for example.

The resin layer 23 is preferably formed using a solution with a viscosity greater than or equal to 10 cP and less than 3000 cP, further preferably greater than or equal to 10 cP and less than or equal to 1000 cP. The lower the viscosity of the solution is, the easier the coating is. Furthermore, the lower the viscosity of the solution is, the more the entry of bubbles can be prevented, leading to a film with good quality.

The thickness of the resin layer 23 is preferably greater than or equal to 0.01 μm and less than 10 μm, further preferably greater than or equal to 0.01 μm and less than 2 μm, and still further preferably greater than or equal to 0.1 μm and less than 1 μm. With the use of a solution with low viscosity, the resin layer 23 can be easily made thin.

The thermal expansion coefficient of the resin layer 23 is preferably greater than or equal to 0.1 ppm/° C. and less than or equal to 20 ppm/° C., and further preferably greater than or equal to 0.1 ppm/° C. and less than or equal to 10 ppm/° C. The lower the thermal expansion coefficient of the resin layer 23 is, the more the breakage of the transistor or the like by heating can be prevented.

The formation substrate 14 has stiffness high enough for easy transfer and has resistance to heat applied in the manufacturing process. Examples of a material that can be used for the formation substrate 14 include glass, quartz, ceramics, sapphire, an organic resin, a semiconductor, a metal, and an alloy. Examples of the glass include alkali-free glass, barium borosilicate glass, and aluminoborosilicate glass.

Figure 8B:
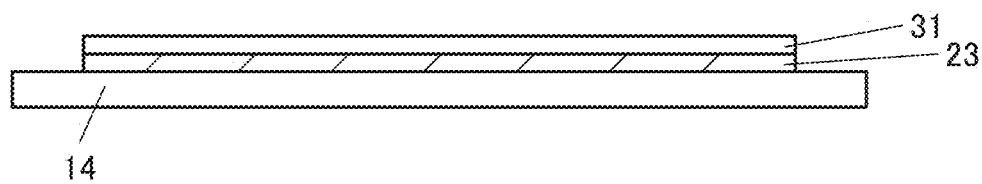

Next, the insulating layer 31 is formed over the resin layer 23 (FIG. 8B).

The insulating layer 31 is formed at a temperature lower than heating temperature in a peeling step and lower than or equal to the heat resistant temperature of the resin layer 23. For example, the insulating layer 31 is formed at a temperature lower than a glass transition point of the resin layer 23.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

For the insulating layer 31, an inorganic insulating film such as a silicon nitride film, a silicon oxynitride film, a silicon oxide film, a silicon nitride oxide film, an aluminum oxide film, or an aluminum nitride film can be used, for example. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have higher density and barrier property as the deposition temperature becomes higher.

In the case of using an inorganic insulating film for the insulating layer 31, substrate temperature during the deposition is preferably higher than or equal to room temperature (25° C.) and lower than or equal to 350° C., and further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating film and an inorganic insulating film for the insulating layer 31, for example. The organic insulating film can be formed using an organic resin such as an epoxy resin, an acrylic resin, a silicone resin, a phenol resin, a polyimide resin, an imide resin, a PVC resin, a PVB resin, or an EVA resin.

In the case of using an organic insulating film for the insulating layer 31, it is preferable to form the insulating layer 31 at a temperature higher than or equal to room temperature and lower than or equal to 350° C., further preferably at a temperature higher than or equal to room temperature and lower than or equal to 300° C.

Figure 8C:
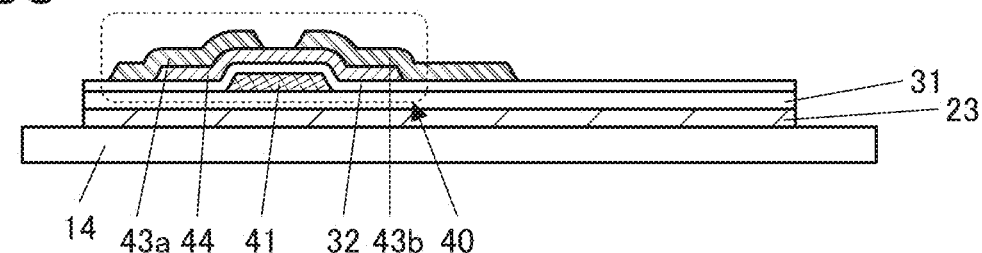

Next, the transistor 40 is formed over the insulating layer 31 (FIG. 8C). Here, the case where a bottom-gate transistor including an oxide semiconductor layer 44 is formed as an example of the transistor 40 is described. Note that Embodiment 1 can also be referred to for a method for forming the transistor.

In one embodiment of the present invention, for a semiconductor film of the transistor, for example, an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used. As described in Embodiment 1, an oxide semiconductor having a wider band gap than silicon is preferably used.

The transistor 40 is fabricated at a temperature lower than the heating temperature in the peeling step. Furthermore, the transistor 40 is fabricated at a temperature lower than or equal to the heat resistant temperature of the resin layer 23. For example, the transistor 40 is fabricated at a temperature lower than the glass transition point of the resin layer 23.

Specifically, first, the conductive layer 41 is formed over the insulating layer 31.

Conductive films included in the transistor 40 are preferably formed at a temperature higher than or equal to room temperature and lower than or equal to 350° C., further preferably higher than or equal to room temperature and lower than or equal to 300° C.

Next, the insulating layer 32 is formed. For the insulating layer 32, the description of the inorganic insulating film that can be used for the insulating layer 31 can be referred to.

Then, the oxide semiconductor layer 44 is formed. The oxide semiconductor layer 44 can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

Embodiment 1 and Embodiment 3 can also be referred to for the oxide semiconductor.

Next, the conductive layer 43a and the conductive layer 43b are formed.

In the above manner, the transistor 40 can be fabricated.

Figure 8D:
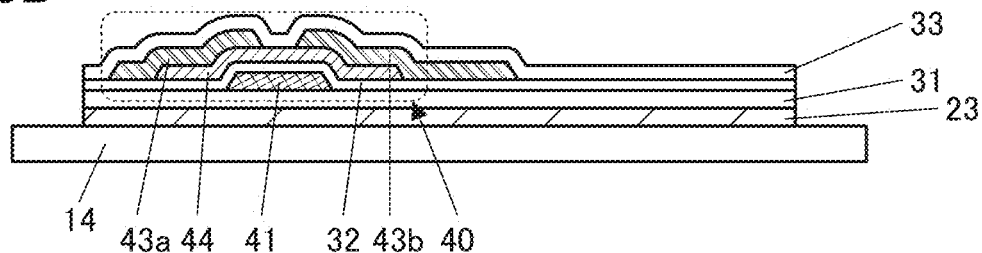

After that, the insulating layer 33 that covers the transistor 40 is formed (FIG. 8D). The insulating layer 33 can be formed in a manner similar to that of the insulating layer 32. Embodiment 1 can be referred to for the formation step of the insulating layer 33.

Through the above steps, the insulating layer 31, the transistor 40, and the insulating layer 33 can be formed over the resin layer 23 (FIG. 8D).

If the formation substrate 14 and the insulating layer 31 are separated from each other at this stage by a method described later, a flexible device including no display element can be fabricated. Forming the transistor 40 or forming a capacitor, a resistor, a wiring, and the like in addition to the transistor 40, and separating the formation substrate 14 and the insulating layer 31 from each other by the method described later can provide a flexible device including a semiconductor circuit, for example.

Figure 8E:
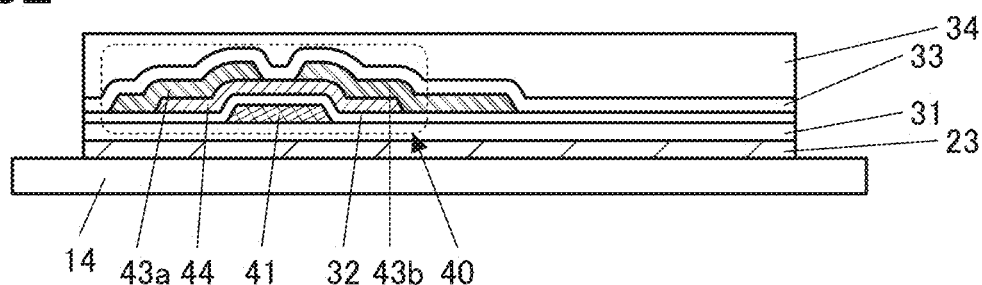

Then, the insulating layer 34 is formed over the insulating layer 33 (FIG. 8E). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than heating temperature in a peeling step and lower than or equal to the heat resistant temperature of the resin layer 23. For example, the insulating layer 34 is formed at a temperature lower than the glass transition point of the resin layer 23.

In the case of using an organic insulating film for the insulating layer 34, it is preferable to form the insulating layer 34 at a temperature higher than or equal to room temperature and lower than or equal to 350° C., further preferably at a temperature higher than or equal to room temperature and lower than or equal to 300° C.

In the case of using an inorganic insulating film for the insulating layer 34, substrate temperature during the deposition is preferably higher than or equal to room temperature and lower than or equal to 350° C., and further preferably higher than or equal to 100° C. and lower than or equal to 300° C.

Next, openings that reach the conductive layer 43b and the like are formed in the insulating layer 34 and the insulating layer 33.

Figure 9A:
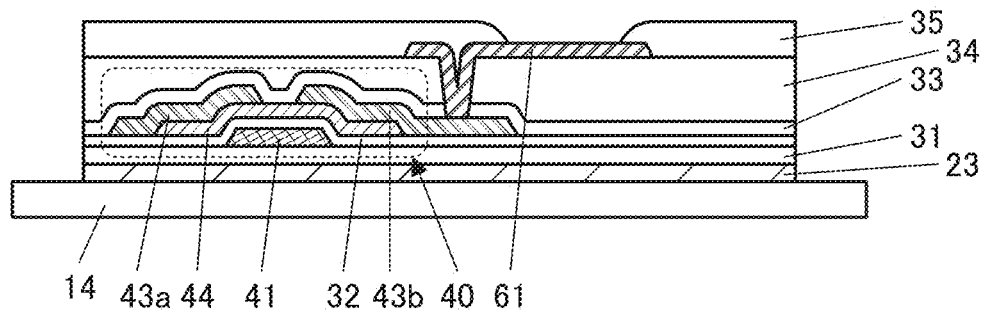
FIGS. 9A to 9D illustrate a method for manufacturing a flexible device.

After that, the conductive layer 61 is formed (FIG. 9A). Part of the conductive layer 61 functions as a pixel electrode of the display element 60.

The conductive layer 61 is formed at a temperature lower than the heating temperature in the peeling step. Furthermore, the conductive layer 61 is formed at a temperature lower than or equal to the heat resistant temperature of the resin layer 23. For example, the conductive layer 61 is formed at a temperature lower than the glass transition point of the resin layer 23.

The conductive layer 61 is preferably formed at a temperature higher than or equal to room temperature and lower than or equal to 350° C., further preferably higher than or equal to room temperature and lower than or equal to 300° C.

Subsequently, the insulating layer 35 that covers an end portion of the conductive layer 61 is formed (FIG. 9A). For the insulating layer 35, the description of the organic insulating film or the inorganic insulating film that can be used for the insulating layer 31 can be referred to.

The insulating layer 35 is formed at a temperature lower than heating temperature in a peeling step and lower than or equal to the heat resistant temperature of the resin layer 23. For example, the insulating layer 35 is formed at a temperature lower than the glass transition point of the resin layer 23.

In the case of using an organic insulating film for the insulating layer 35, it is preferable to form the insulating layer 35 at a temperature higher than or equal to room temperature and lower than or equal to 350° C., further preferably at a temperature higher than or equal to room temperature and lower than or equal to 300° C.

In the case of using an inorganic insulating film for the insulating layer 35, substrate temperature during the deposition is preferably higher than or equal to room temperature and lower than or equal to 350° C., and further preferably higher than or equal to 100° C. and lower than or equal to 300° C.

Figure 9B:
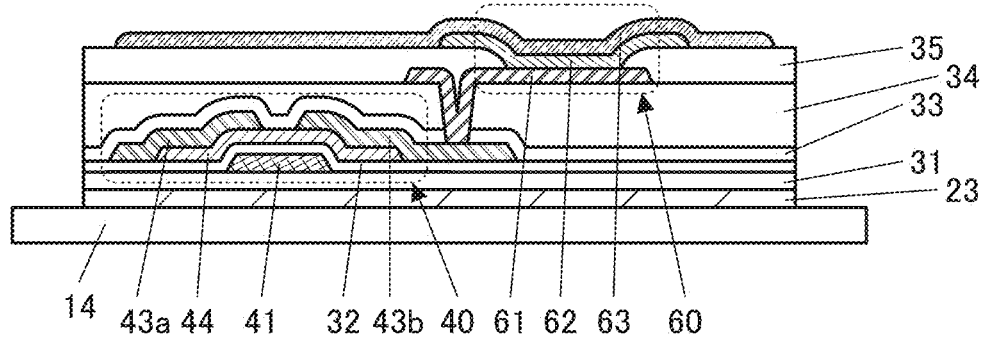

Then, the EL layer 62 and the conductive layer 63 are formed (FIG. 9B). Part of the conductive layer 63 functions as a common electrode of the display element 60.

The EL layer 62 and the conductive layer 63 are each formed at a temperature lower than the heating temperature in the peeling step and lower than or equal to the heat resistant temperature of the resin layer 23. For example, the EL layer 62 and the conductive layer 63 are each formed at a temperature lower than the glass transition point of the resin layer 23.

Specifically, the EL layer 62 and the conductive layer 63 are each preferably formed at a temperature higher than or equal to room temperature and lower than or equal to 350° C., further preferably higher than or equal to 100° C. and lower than or equal to 300° C.

In the above manner, the display element 60 can be completed. Note that Embodiment 1 can also be referred to for a method for forming the display element 60.

Figure 9C:
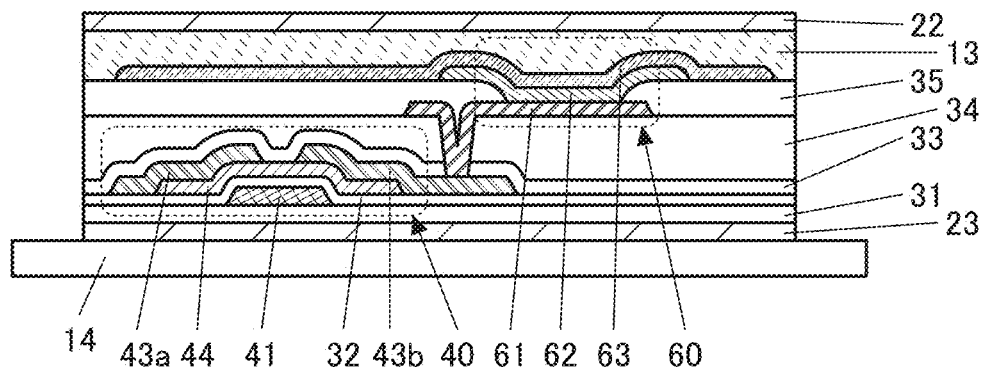

Next, the substrate 22 is bonded onto the display element 60 by the adhesive layer 13 (FIG. 9C). Accordingly, the display element 60 can be sealed by the adhesive layer 13 and the substrate 22.

Materials having higher heat resistance (e.g., a higher glass transition point) than the resin layer 23 are used for the substrate 22 and the adhesive layer 13. As a result, sealing breakage in the later peeling step can be prevented.

The substrate 22 preferably has flexibility. For the substrate 22, for example, the organic resin that can be used for the resin layer 23 can be used. A resin film is suitably used for the substrate 22.

For the adhesive layer 13, any of a variety of curable adhesives such as a reactive curable adhesive, a thermosetting adhesive, an anaerobic adhesive, and a photocurable adhesive such as an ultraviolet curable adhesive can be used.

Figure 9D:
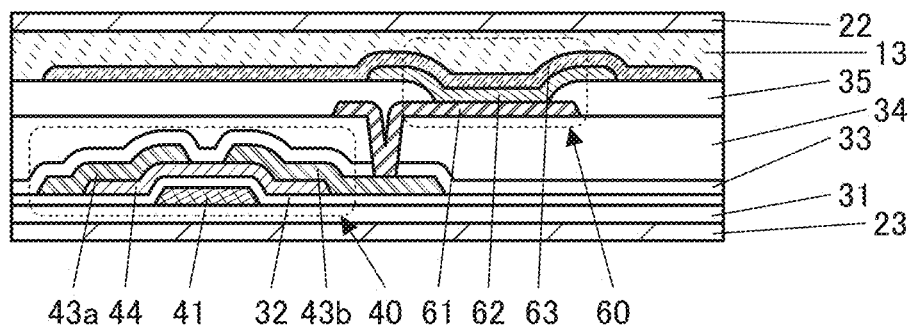

Then, the resin layer 23 is heated at a first temperature and the formation substrate 14 and the insulating layer 31 are separated from each other (FIG. 9D). Here, an example where peeling occurs at an interface between the formation substrate 14 and the resin layer 23 and the resin layer 23 remains on a surface of the insulating layer 31 is described.

The first temperature is higher than the heat resistant temperature of the resin layer 23. For example, the first temperature is higher than the glass transition point of the resin layer 23. Specifically, the resin layer 23 is heated at a temperature higher than 300° C. and lower than or equal to 500° C., preferably higher than 350° C. and lower than or equal to 450° C.

The resin layer 23 is heated with the use of, for example, at least one of an oven, a hot plate, a heating blower, a stage provided with a heating mechanism, a roller provided with a heating mechanism, and the like.

Figure 10A:
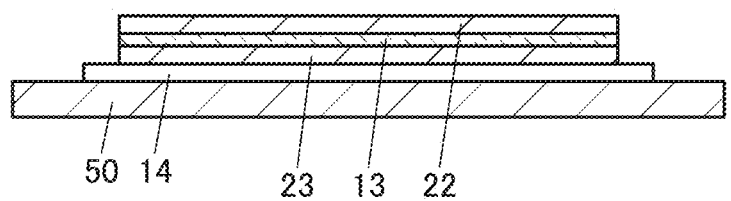
FIGS. 10A to 10D each illustrate a method for manufacturing a flexible device.

FIG. 10A illustrates an example where a stack including the resin layer 23 is placed over the stage 50 provided with a heating mechanism. Note that FIGS. 10A to 10D and FIGS. 11A and 11B only illustrate the formation substrate 14, the resin layer 23, the adhesive layer 13, and the substrate 22 as the stack and do not illustrate the transistor and the like between the resin layer 23 and the adhesive layer 13.

The formation substrate 14 is heated while being fixed to the stage 50. The stage 50 can have any structure as long as the formation substrate 14 can be fixed thereto. The stage 50 may be provided with an attachment mechanism for vacuum attachment, electrostatic attachment, or the like or a mechanism for physically fixing the formation substrate 14, for example.

Peeling can be performed by applying perpendicular force to the resin layer 23, or by attaching part of the top surface of the substrate 22 and pulling up the substrate 22, for example.

Figure 10B:
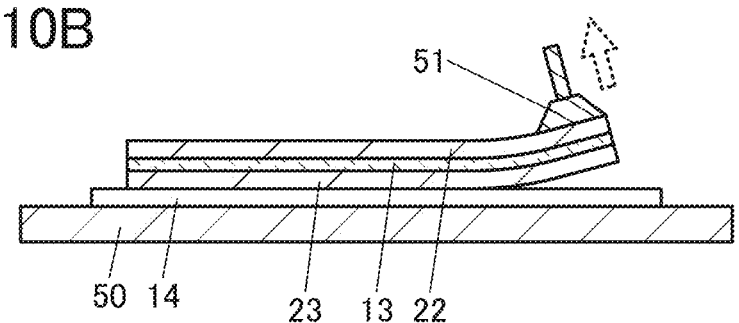
Figure 11A:
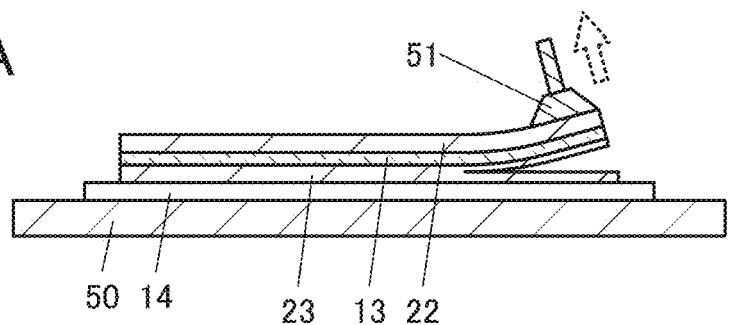
FIGS. 11A to 11D each illustrate a method for manufacturing a flexible device and structure examples of a flexible device.

FIG. 10B and FIG. 11A each illustrate an example where the member 51 provided with an attachment mechanism is used for peeling. The member 51 provided with an attachment mechanism is attached to the top surface of an end portion of the substrate 22 and is pulled up, whereby the formation substrate 14 and the insulating layer 31 (not illustrated) can be separated from each other.

FIG. 10B illustrates an example where peeling occurs at the interface between the formation substrate 14 and the resin layer 23. FIG. 11A illustrates an example where peeling occurs in the resin layer 23.

Figure 10C:
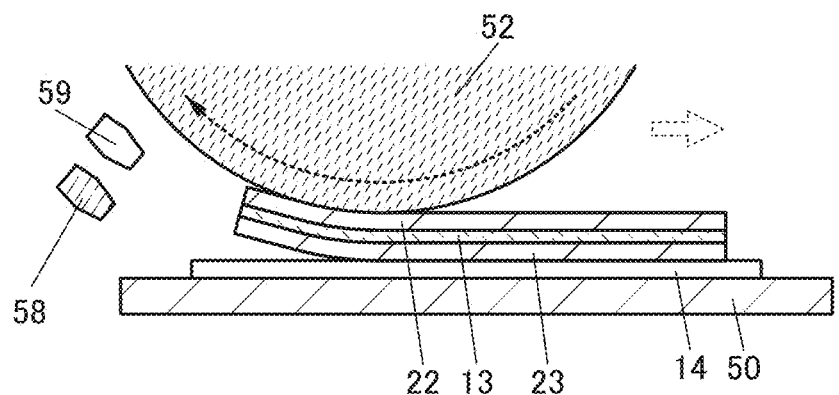
Figure 10D:
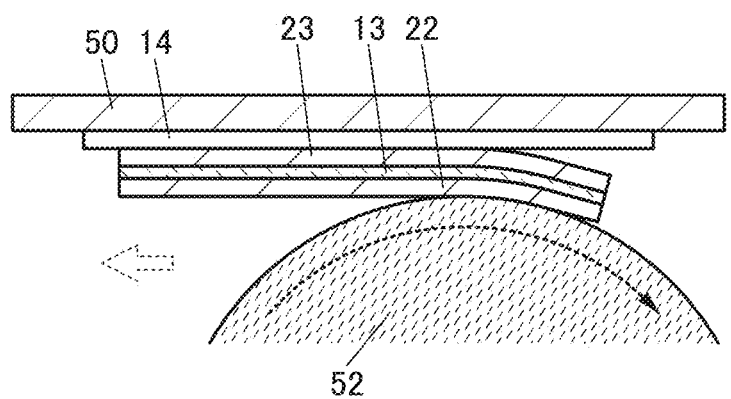
Figure 11B:
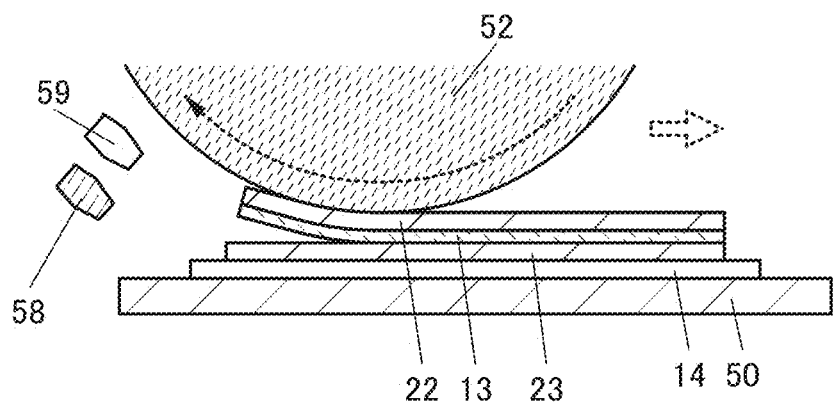

FIGS. 10C and 10D and FIG. 11B each illustrate an example where the drum-shaped member 52 is used for peeling. The drum-shaped member 52 is pressed against a surface of the substrate 22 and is rotated to move, whereby the formation substrate 14 and the insulating layer 31 (not illustrated) can be separated from each other.

FIG. 10C and FIG. 11B each illustrate the case where the substrate 22 is pulled up and FIG. 10D illustrates the case where the substrate 22 is pulled down.

FIGS. 10C and 10D each illustrate an example where peeling occurs at the interface between the formation substrate 14 and the resin layer 23. FIG. 11B illustrates an example where peeling occurs at an interface between the resin layer 23 and the insulating layer 31 (not illustrated).

The resin layer 23 is heated with at least one of the stage 50 and the drum-shaped member 52.

The drum-shaped member 52 illustrated in FIGS. 10C and 10D is preferably provided with a heating mechanism. The drum-shaped member 52 preferably has a surface with high thermal conductivity, in which case heat can be easily conducted to the resin layer. For the material of the drum-shaped member 52, for example, a metal material or an alloy material is preferably used. The surface of the drum-shaped member 52 is preferably adhesive.

At least one of the drum-shaped member 52 and the stage 50 can move until the insulating layer 31 is completely peeled from the formation substrate 14.

FIG. 10C and FIG. 11B also illustrate a liquid supply mechanism 58 and a blowing mechanism 59.

Water, an organic solvent, or the like can be used as a liquid, for example. With the use of an organic solvent that dissolves an organic resin, the resin layer 23 can be removed.

A liquid can be supplied to a peeling interface with the liquid supply mechanism 58. When an organic solvent is supplied to the peeling interface, the resin layer 23 can be dissolved and peeling can be promoted.

It is preferable that the resin layer 23 be melted by heating and dissolved by a liquid at the same time, in which case time required for the peeling step can be reduced and the yield can be increased.

The liquid supply mechanism 58 can supply a liquid to a surface of the insulating layer 31 or a surface of the resin layer 23 exposed by peeling. When an organic solvent is supplied to the surface exposed by peeling, the remaining organic resin can be dissolved and removed.

The blowing mechanism 59 can be used for heat blowing, cool blowing, air blowing, or the like. The blowing can remove a residue (an organic resin, a liquid, or the like) at the peeling interface.

The blowing mechanism 59 can be used for heat blowing to heat the resin layer 23.

The blowing mechanism 59 can be used for cool blowing to cool the transistor or the like peeled from the formation substrate 14.

Peeling may be performed after the resin layer 23 is heated. For example, peeling can be performed as follows: a stack including the resin layer 23 is placed in an oven and heated, the stack is taken out from the oven, and peeling is performed before the stack is cooled.

After peeling, the resin layer 23 can be left or removed. To remove the resin layer 23, as well as the above blowing and the dissolution by an organic solvent, cleaning, wiping, plasma treatment (e.g., oxygen plasma treatment), light irradiation (e.g., ultraviolet light irradiation), or the like can be used.

Note that the formation substrate 14 after peeling can be reused many times. In that case, if the resin layer 23 remains on the formation substrate 14, the resin layer 23 can be removed by any of the above methods.

The separation of the formation substrate 14 and the insulating layer 31 can complete the display device 10 (FIG. 9D). Since the resin layer 23 and the substrate 22 are flexible, the display device 10 can remain bent or can be bent repeatedly, for example.

Figure 11C:
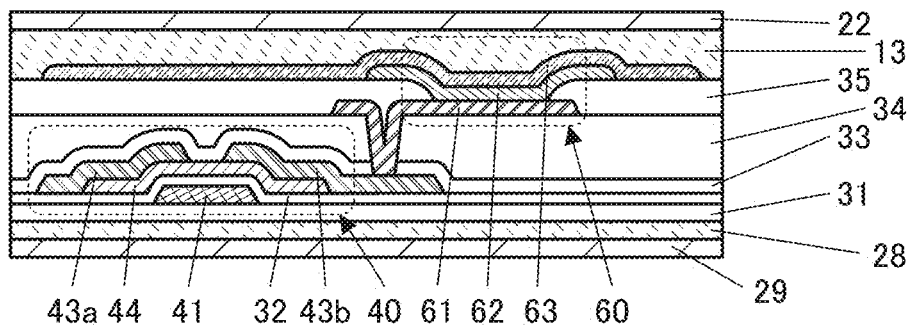
Figure 11D:
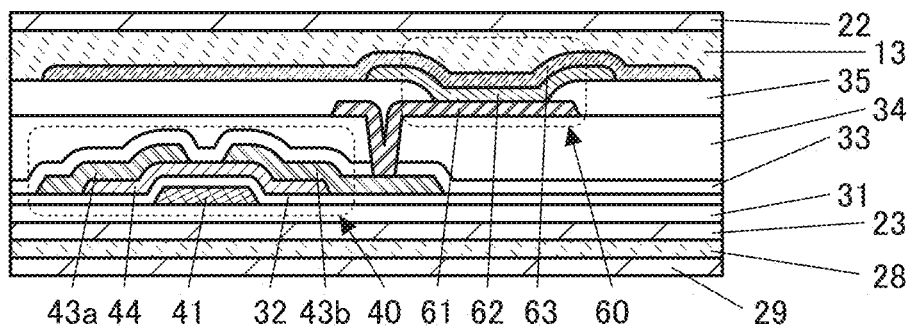

As illustrated in FIGS. 11C and 11D, a film 29 may be bonded to the surface exposed by peeling, by an adhesive layer 28. The film 29 can function as a supporting substrate of the flexible device.

FIG. 11C illustrates an example where the film 29 is bonded to the insulating layer 31 by the adhesive layer 28. FIG. 11D illustrates an example where the film 29 is bonded to the resin layer 23 by the adhesive layer 28.

The film 29 may be directly bonded to the resin layer 23 exposed by peeling. The film 29 can be bonded to the resin layer 23 without using an adhesive in the following manner: the film 29 is positioned so as to overlap with the resin layer 23 which is melted by heating, and pressure is applied.

Figure 12A:
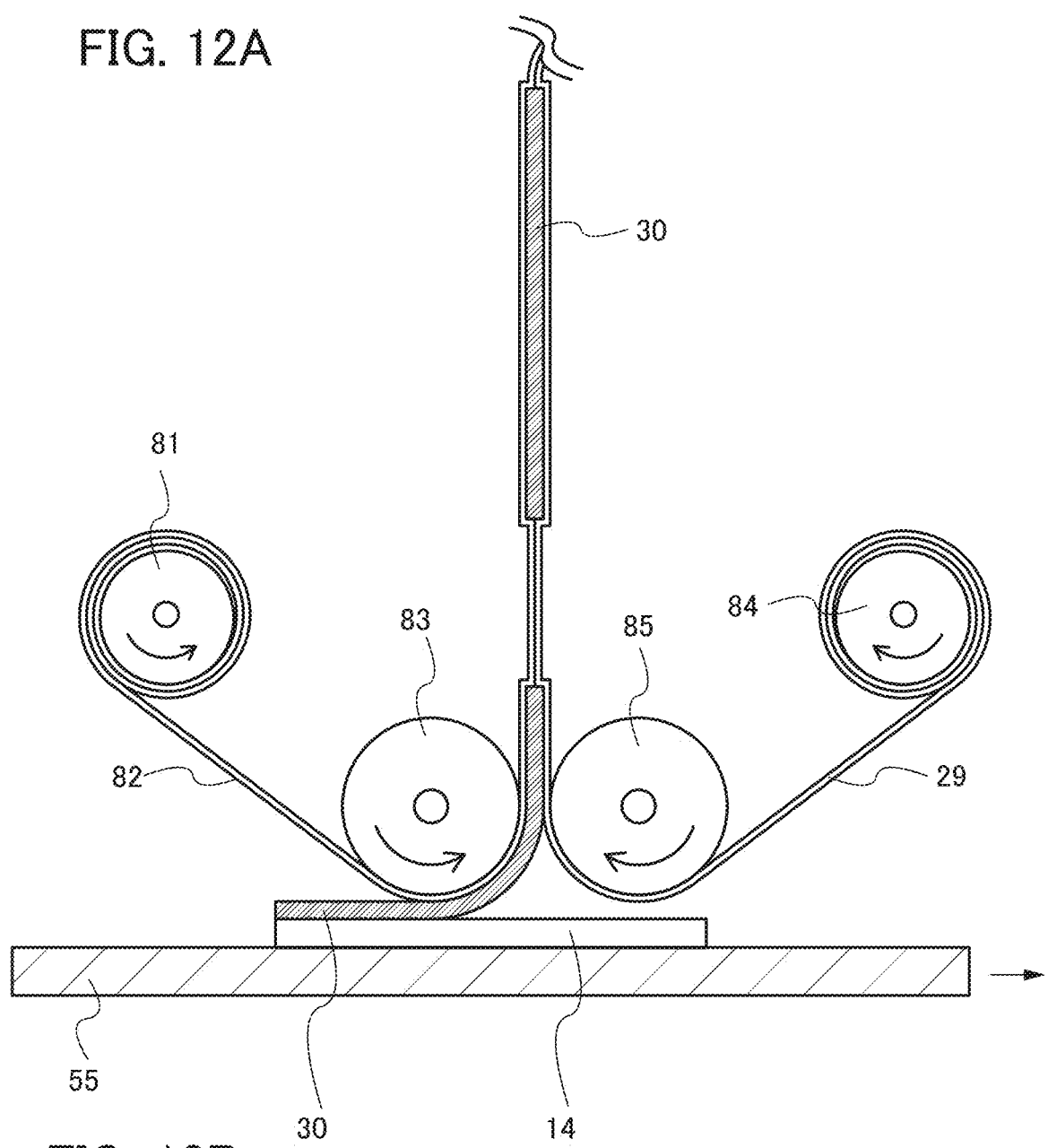
FIGS. 12A and 12B are diagrams for illustrating a method for manufacturing a flexible device.

Peeling from the formation substrate 14 and the bonding of the film 29 can be performed using the same apparatus. In FIG. 12A, the formation substrate 14 and a stack 30 including the resin layer 23 over the formation substrate 14 are transferred on a transfer stage 55. The stack 30 is peeled from the formation substrate 14 using a press roller 83. The stack 30 peeled from the formation substrate 14 is supported by a support body 82 reeled out from a tape reel 81 and transferred. The delivering direction of the film 29 which is reeled out from a tape reel 84 is changed by a press roller 85. The stack 30 and the film 29 are pressed against each other and pressure-bonded between the press roller 83 and the press roller 85.

At least one of the transfer stage 55 and the press roller 83 is provided with a heating mechanism. Accordingly, the resin layer 23 can be heated, which leads to the separation of the formation substrate 14 and the stack 30.

Furthermore, at least one of the press roller 83 and the press roller 85 is provided with a heating mechanism. Accordingly, the resin layer 23 can be heated even after peeling. It is preferable that the resin layer 23 in a melted state be bonded to the film 29 because an additional adhesive is not necessary.

An adhesive layer may be formed on a surface of the film 29. Then, the stack 30 and the film 29 may be bonded to each other by application of pressure and heat by the press roller 83 and the press roller 85.

Figure 12B:
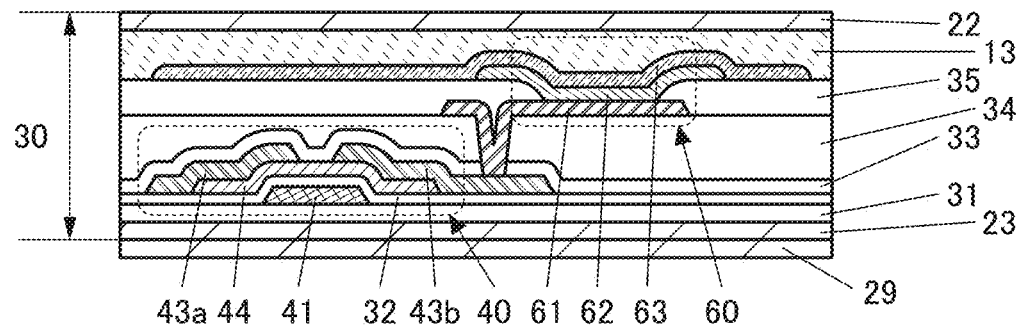

FIG. 12B is a schematic diagram of a structure obtained by bonding the film 29 and the stack 30 to each other. The film 29 is in contact with the resin layer 23.

Example 2 of Manufacturing Method

Here, a manufacturing method partly different from Example 1 of manufacturing method will be described. Note that detailed descriptions of portions similar to those in Example 2 of manufacturing method in Embodiment 1 might be omitted.

Figure 13A:
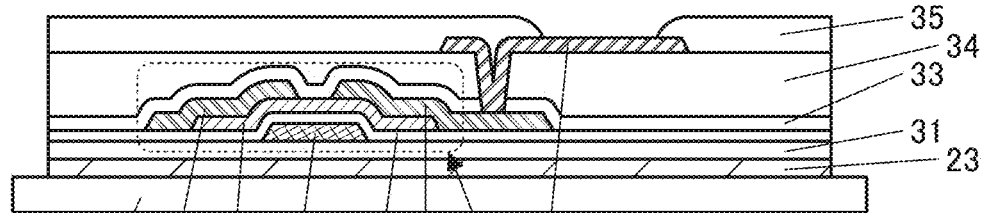
FIGS. 13A to 13E illustrate a method for manufacturing a flexible device.

First, components from the resin layer 23 to the insulating layer 35 are formed in order over the formation substrate 14 in a manner similar to that in Example 1 of manufacturing method (FIG. 13A).

Figure 13B:
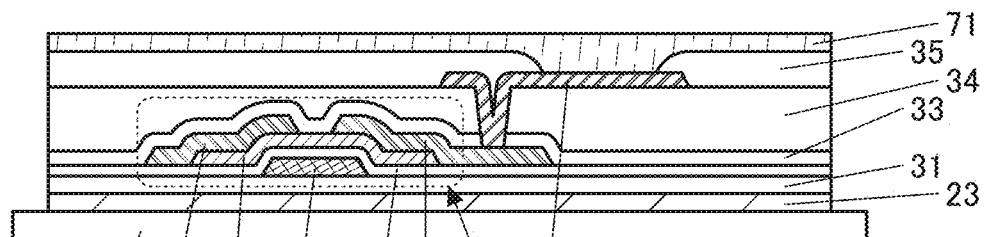

Then, the protective layer 71 is formed as illustrated in FIG. 13B. Embodiment 1 can be referred to for the protective layer 71.

Figure 13C:
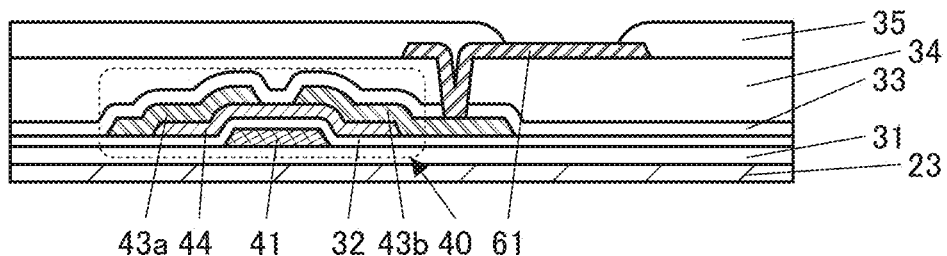

Subsequently, the formation substrate 14 and the insulating layer 31 are separated from each other in a manner similar to that in Example 1 of manufacturing method. It is particularly preferable to use the drum-shaped member 52 for the separation as illustrated in FIGS. 10C and 10D and FIG. 11B. FIG. 13C illustrates an example where the separation is performed at an interface between the formation substrate 14 and the resin layer 23.

After the formation substrate 14 and the insulating layer 31 are separated from each other, the protective layer 71 is removed (FIG. 13C).

Figure 13D:
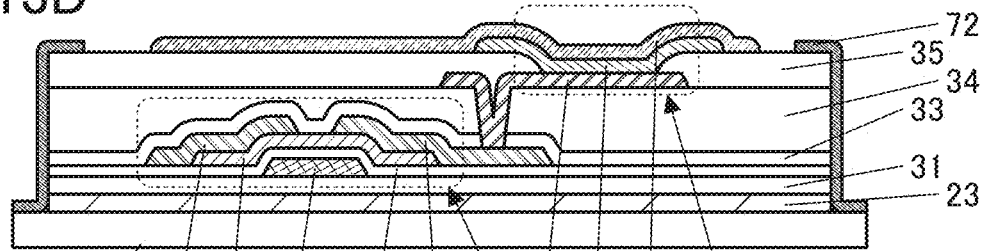

Next, the EL layer 62 and the conductive layer 63 are formed, whereby the display element 60 is completed (FIG. 13D).

The EL layer 62 and the conductive layer 63 may be formed while the resin layer 23 (or the insulating layer 31) is fixed to a stage of a deposition apparatus, but are preferably formed while the substrate 21 is fixed to a supporting substrate 73 by a tape 72 or the like and the supporting substrate 73 is placed on the stage, as illustrated in FIG. 13D. Fixing the resin layer 23 to the supporting substrate 73 can facilitate the transfer of the resin layer 23 in an apparatus and between apparatuses. A substrate similar to the formation substrate 14 can be used as the supporting substrate 73.

Then, in a manner similar to that in Example 1 of manufacturing method, the substrate 22 is bonded onto the display element 60 by the adhesive layer 13. Accordingly, the display element 60 can be sealed by the adhesive layer 13 and the substrate 22.

Figure 13E:
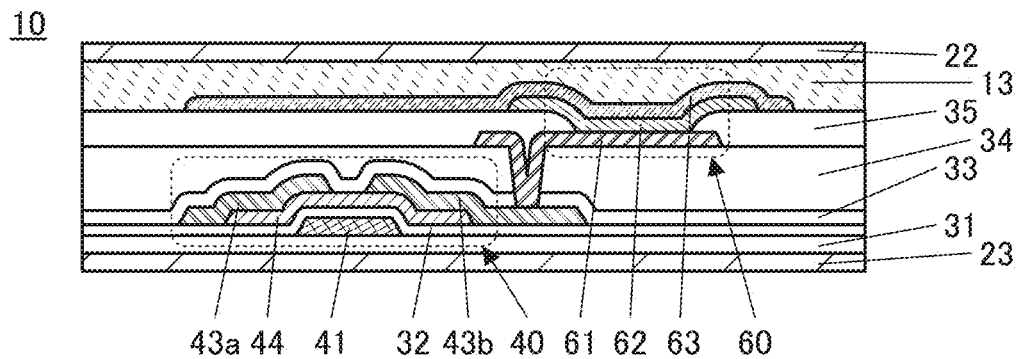

Through the above steps, the display device 10 can be manufactured (FIG. 13E).

In Example 2 of manufacturing method, the EL layer 62 and the conductive layer 63 can be formed after the separation of the formation substrate 14 and the insulating layer 31 and thus can be formed using materials with low heat resistance. Materials with low heat resistance can also be used for the adhesive layer 13 and the substrate 22 provided after the separation. Thus, a material can be selected more freely, leading to fabrication of a highly reliable display device at lower cost.

Example 3 of Manufacturing Method

Here, a manufacturing method partly different from the examples of a manufacturing method will be described. Note that detailed descriptions of portions similar to those in Example 3 of manufacturing method in Embodiment 1 might be omitted.

Figure 14A:
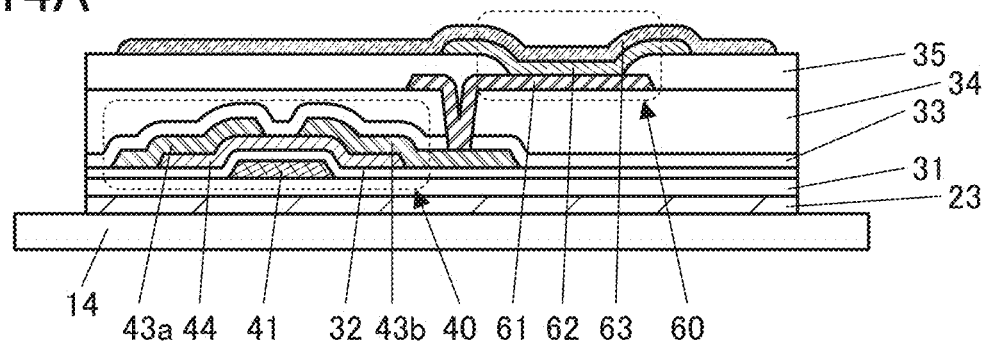
FIGS. 14A to 14D illustrate a method for manufacturing a flexible device.

First, components from the resin layer 23 to the display element 60 are formed in order over the formation substrate 14 in a manner similar to that in Example 1 of manufacturing method (FIG. 14A).

Figure 14B:
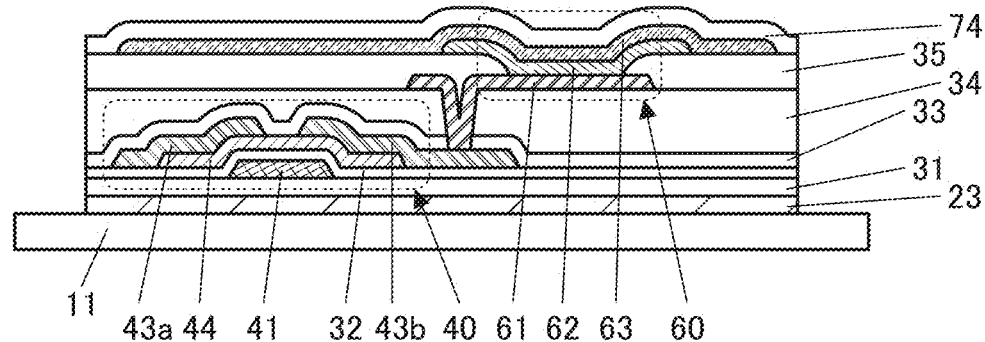

Next, the insulating layer 74 is formed so as to cover the conductive layer 63 (FIG. 14B).

Figure 14C:
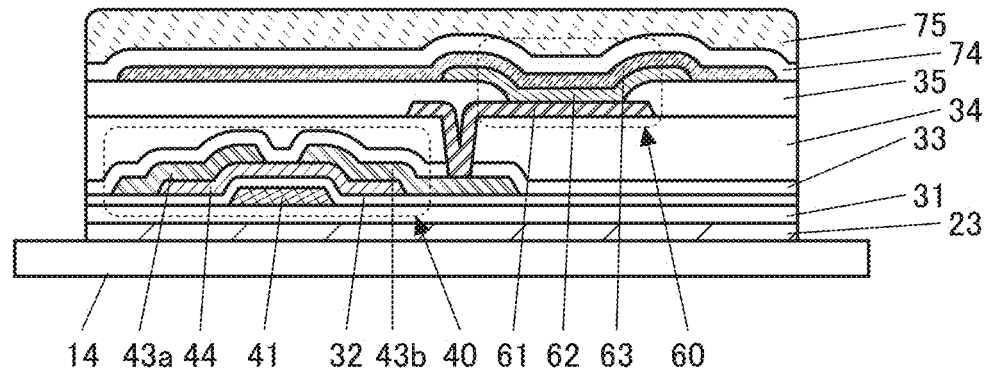

Then, the protective layer 75 is formed over the insulating layer 74 (FIG. 14C).

Figure 14D:
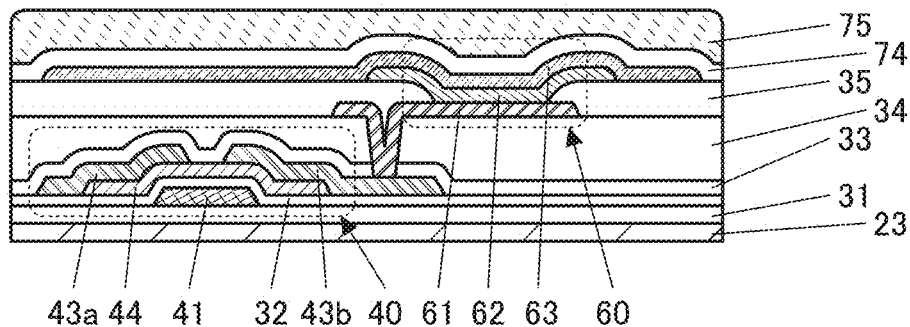

Subsequently, the formation substrate 14 and the insulating layer 31 are separated from each other in a manner similar to that in Example 1 of manufacturing method. In this example, the substrate 22 is not used. To prevent a surface of the protective layer 75 from being damaged, it is preferable to use the drum-shaped member 52 for the separation as illustrated in FIGS. 10C and 10D and FIG. 11B. FIG. 14D illustrates an example where the separation is performed at an interface between the formation substrate 14 and the resin layer 23.

In Example 3 of manufacturing method, as described in Example 2 of manufacturing method, the protective layer 71 that can be removed may be formed after the conductive layer 61 and the insulating layer 35 are formed, and the formation substrate 14 and the insulating layer 31 may be separated from each other before the EL layer 62 and the like are formed. In that case, the EL layer 62, the conductive layer 63, the insulating layer 74, the protective layer 75, and the like may be formed while the insulating layer 31 after the separation is fixed to the supporting substrate 73.

As described above, in the method for manufacturing a flexible device of one embodiment of the present invention, the fabrication process of the transistor and the peeling step by heating can be performed at low temperatures. Furthermore, the resin layer can have a small thickness and low heat resistance. Thus, the material of the resin layer can be selected from a wide range, high mass productivity can be obtained at low cost, and a large substrate can be used, for example.

At least part of this embodiment can be implemented in combination with any of the other embodiments described in this specification as appropriate.

Embodiment 3

In this embodiment, a metal oxide film (hereinafter referred to as an oxide semiconductor film) that can be used in the flexible device of one embodiment of the present invention will be described.
[Composition]

The composition of the oxide semiconductor film will be described below.

The oxide semiconductor film contains indium (In), an element M (M is Al, Ga, Y, or Sn), and zinc (Zn) as described above.

Although the element M is described as aluminum, gallium, yttrium, or tin, other elements may be used as the element M; for example, boron, silicon, titanium, iron, nickel, germanium, zirconium, molybdenum, lanthanum, cerium, neodymium, hafnium, tantalum, tungsten, and magnesium. Note that two or more of the above elements can be used in combination as the element M.

Here, preferred ranges of the atomic ratio of indium, the element M, and zinc contained in the oxide semiconductor film of one embodiment of the present invention are described with reference to FIGS. 16A to 16C. Note that the proportion of oxygen atoms is not illustrated in FIGS. 16A to 16C. The terms of the atomic ratio of indium, the element M, and zinc contained in the oxide semiconductor film are denoted by [In], [M], and [Zn], respectively.

Figure 16A:
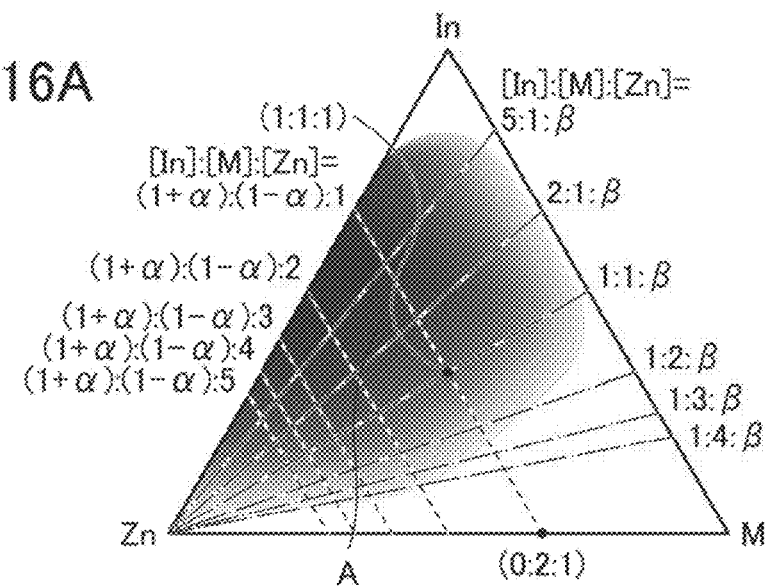
FIGS. 16A to 16C each illustrate an atomic ratio range of an oxide semiconductor film.
Figure 16B:
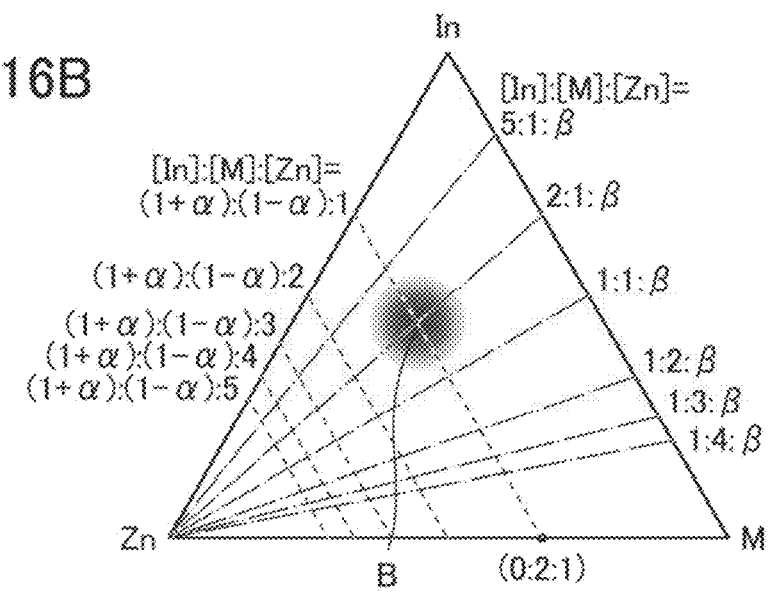
Figure 16C:
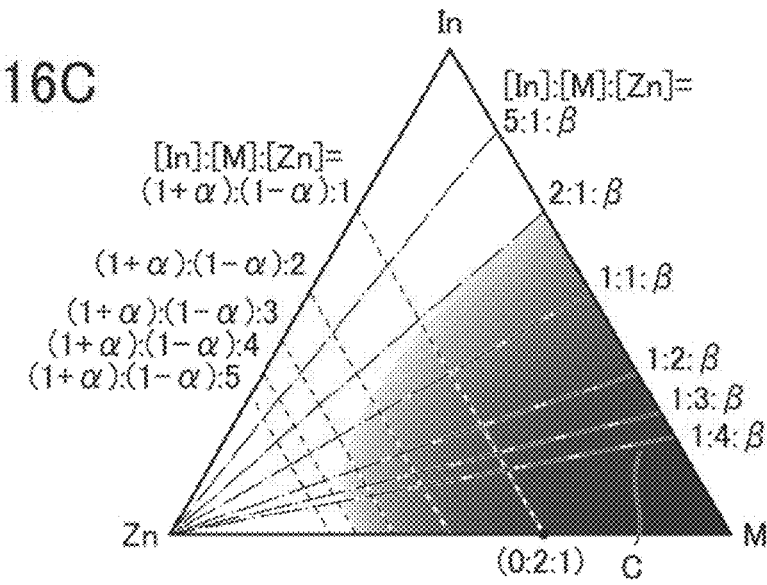

In FIGS. 16A to 16C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \geq 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is 2:1:A and a line where the atomic ratio [In]:[M]:[Zn] is $5:1:\beta$.

An oxide semiconductor with the atomic ratio of [In]:[M]:[Zn]=0:2:1 or a neighborhood thereof in FIGS. 16A to 16C tends to have a spinel crystal structure.

FIGS. 16A and 16B illustrate examples of the preferred ranges of the atomic ratio of indium, the element M, and zinc contained in the oxide semiconductor film of one embodiment of the present invention.

Figure 17:
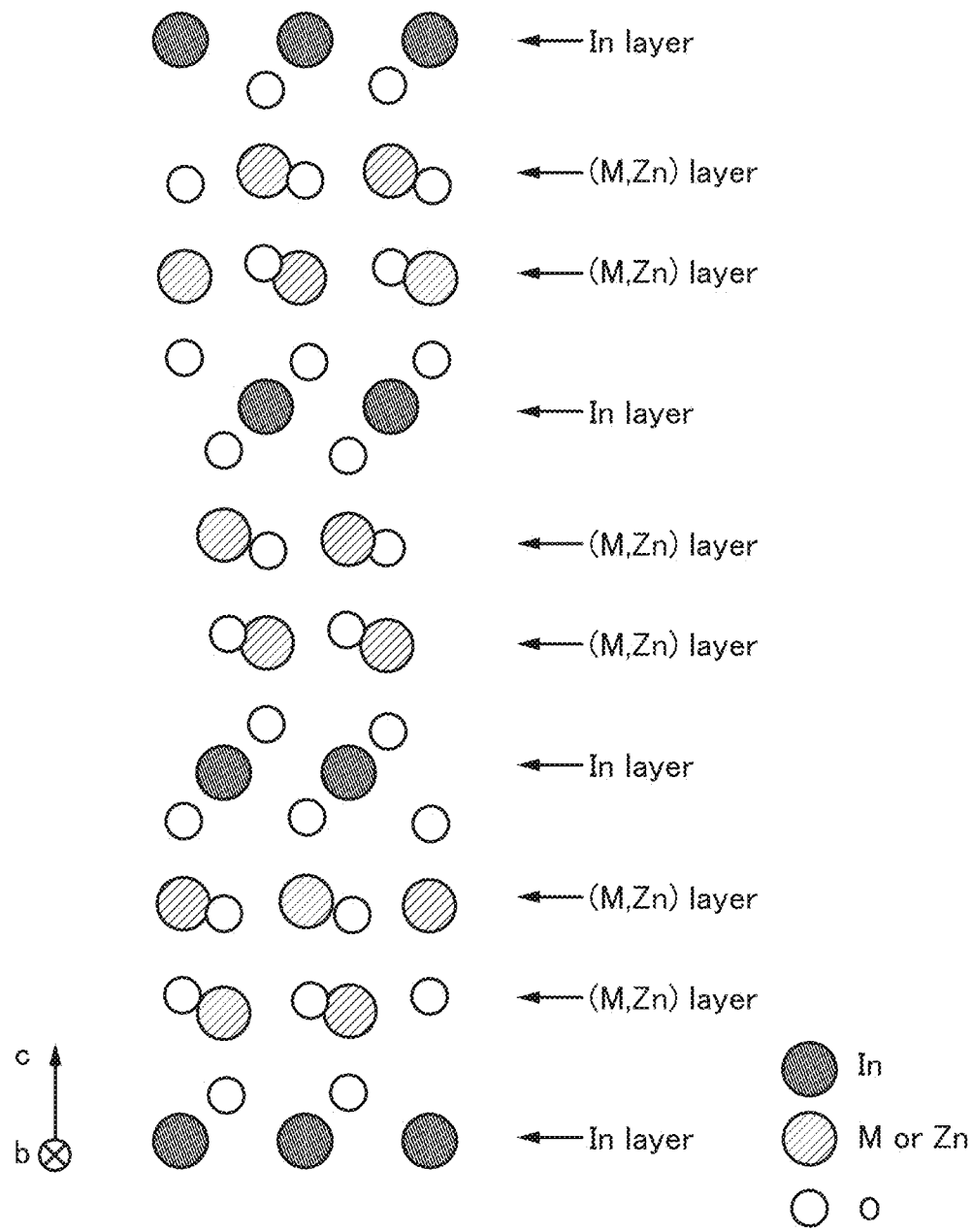
FIG. 17 illustrates a crystal of $InMZnO_4$.

FIG. 17 illustrates an example of the crystal structure of InMZnO$_4$ whose atomic ratio [In]:[M]:[Zn] is 1:1:1. The crystal structure illustrated in FIG. 17 is InMZnO$_4$ observed from a direction parallel to a b-axis. Note that a metal element in a layer that contains M, Zn, and oxygen (hereinafter, this layer is referred to as an "(M,Zn) layer") in FIG. 17 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 17.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of one In layer for every two (M,Zn) layers and a layered structure of one In layer for every three (M,Zn) layers.

For example, in the case where the oxide semiconductor film is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor film in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor film, a grain boundary might be formed between different crystal structures.

In addition, the oxide semiconductor film containing indium in a higher proportion can have high carrier mobility (electron mobility). This is because in an oxide semiconductor film containing indium, the element M, and zinc, the s orbital of heavy metal mainly contributes to carrier transfer, and when the indium content in the oxide semiconductor film is increased, overlaps of the s orbitals of indium atoms are increased; therefore, an oxide semiconductor film having a high content of indium has higher carrier mobility than that of an oxide semiconductor film having a low content of indium.

In contrast, when the indium content and the zinc content in an oxide semiconductor film become lower, carrier mobility becomes lower. Thus, with an atomic ratio of [In]:[M]:[Zn]=0:1:0 and the vicinity thereof (e.g., a region C in FIG. 16C), insulation performance becomes better.

Accordingly, the oxide semiconductor film of one embodiment of the present invention preferably has an atomic ratio represented by a region A in FIG. 16A. With the atomic ratio, a layered structure with high carrier mobility and a few grain boundaries is easily obtained.

A region B in FIG. 16B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide semiconductor film having an atomic ratio represented by the region B is an excellent oxide semiconductor film that has particularly high crystallinity and high carrier mobility.

Note that a condition where an oxide semiconductor film has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor film has a layered structure, and boundaries of the regions A to C are not clear.

[Structure in which Oxide Semiconductor Film is Used in Transistor]

Next, a structure in which the oxide semiconductor is used in a transistor will be described.

Note that when the oxide semiconductor film is used for a transistor, carrier scattering or the like at a grain boundary can be lower than that in the case of a transistor using polycrystalline silicon in a channel region, for example; thus, the transistor can have high field-effect mobility. In addition, the transistor can have high reliability.

The oxide semiconductor film of one embodiment of the present invention is a film containing both crystal parts with orientation and crystal parts with no orientation. With the use of the oxide semiconductor film with such crystallinity, a transistor having both high field-effect mobility and high reliability can be fabricated.

[Carrier Density of Oxide Semiconductor Film]

The carrier density of an oxide semiconductor film will be described below.

Examples of a factor affecting the carrier density of an oxide semiconductor film include oxygen vacancy ($V_O$) and impurities in the oxide semiconductor film.

As the amount of oxygen vacancy in the oxide semiconductor film increases, the density of defect states increases when hydrogen is bonded to the oxygen vacancy (this state is also referred to as $V_O$H). The density of defect states also increases with an increase in the amount of impurity in the oxide semiconductor film. Hence, the carrier density of an oxide semiconductor film can be controlled by controlling the density of defect states in the oxide semiconductor film.

A transistor using the oxide semiconductor film in a channel region will be described below.

The carrier density of the oxide semiconductor film is preferably reduced in order to inhibit the negative shift of the threshold voltage of the transistor or reduce the off-state current of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor film is lower than $8 \times 10^{15}$ cm$^{-3}$, preferably lower than $1 \times 10^{11}$ cm$^{-3}$, and further preferably lower than $1 \times 10^{10}$ cm$^{-3}$ and is higher than or equal to $1 \times 10^{-9}$ cm$^{-3}$.

In contrast, the carrier density of the oxide semiconductor film is preferably increased in order to improve the on-state current of the transistor or improve the field-effect mobility of the transistor. In order to increase the carrier density of the oxide semiconductor film, the impurity concentration or the density of defect states in the oxide semiconductor film is slightly increased. Alternatively, the bandgap of the oxide semiconductor film is preferably narrowed. For example, an oxide semiconductor film that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor film that has a high electron affinity and thus has a narrow bandgap so as to increase the density of thermally excited electrons (carriers) can be regarded as substantially intrinsic. Note that a transistor using an oxide semiconductor film with higher electron affinity has lower threshold voltage.

The aforementioned oxide semiconductor film with an increased carrier density has somewhat n-type conductivity; thus, it can be referred to as a "slightly-n" oxide semiconductor film.

The carrier density of a substantially intrinsic oxide semiconductor film is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 18:
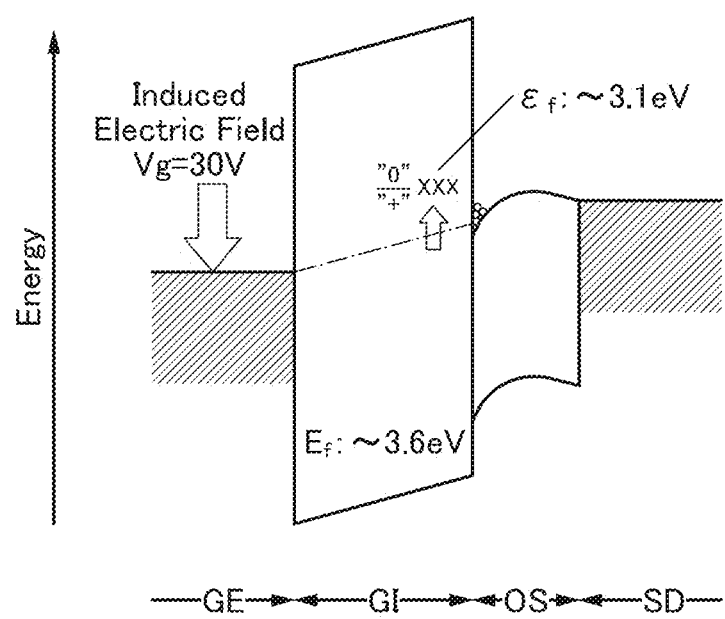
FIG. 18 is an energy band diagram of a transistor including an oxide semiconductor film in a channel region.

The use of the substantially intrinsic oxide semiconductor film may improve the reliability of a transistor. Here, the reason for the improvement in the reliability of a transistor which uses the oxide semiconductor film in its channel region is described with reference to FIG. 18. FIG. 18 is an energy band diagram of a transistor which uses the oxide semiconductor film in its channel region.

In FIG. 18, GE, GI, OS, and SD refer to a gate electrode, a gate insulating film, an oxide semiconductor film, and a source/drain electrode, respectively. In other words, FIG. 18 shows an example of energy bands of the gate electrode, the gate insulating film, the oxide semiconductor film, and the source/drain electrode in contact with the oxide semiconductor film.

In FIG. 18, a silicon oxide film and an In—Ga—Zn oxide are used as the gate insulating film and the oxide semiconductor film, respectively. The transition level ($\in_f$) of a defect that might be formed in the silicon oxide film is assumed to be formed at a position approximately 3.1 eV away from the conduction band minimum of the gate insulating film. Furthermore, the Fermi level ($E_f$) of the silicon oxide film at the interface between the oxide semiconductor film and the silicon oxide film when the gate voltage ($V_g$) is 30 V is assumed to be formed at a position approximately 3.6 eV away from the conduction band minimum of the gate insulating film. Note that the Fermi level of the silicon oxide film changes depending on the gate voltage. For example, the Fermi level ($E_f$) of the silicon oxide film at the interface between the oxide semiconductor film and the silicon oxide film is lowered as the gate voltage is increased. A white circle and x in FIG. 18 represent an electron (carrier) and a defect state in the silicon oxide film, respectively.

As shown in FIG. 18, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level ($E_f$) of the silicon oxide film becomes greater than the transition level ($\in_f$) of the defect, the charge state of the defect states in the silicon oxide film is changed from positive to neutral, so that the threshold voltage of the transistor shifts in the positive direction.

When an oxide semiconductor film with a different electron affinity is used, the Fermi level of the interface between the gate insulating film and the oxide semiconductor film might be changed. When an oxide semiconductor film with a higher electron affinity is used, the conduction band minimum of the gate insulating film becomes relatively high at the interface between the gate insulating film and the oxide semiconductor film or in the vicinity of the interface. In that case, the defect state (x in FIG. 18) which might be formed in the gate insulating film also becomes relatively high, so that the energy difference between the Fermi level of the gate insulating film and the Fermi level of the oxide semiconductor film is increased. The increase in energy difference leads to a reduction in the amount of charge trapped in the gate insulating film. For example, a change in the charge state of the defect states which might be formed in the silicon oxide film becomes smaller, so that a change in the threshold voltage of the transistor by gate bias temperature (GBT) stress can be reduced.

Charges trapped by the defect states in the oxide semiconductor film take a long time to be released and may behave like fixed charges. Thus, a transistor whose channel region is formed in an oxide semiconductor film having a high density of defect states has unstable electrical characteristics in some cases.

To obtain stable electrical characteristics of the transistor, it is effective to reduce the concentration of impurities in the oxide semiconductor film. In addition, to reduce the concentration of impurities in the oxide semiconductor film, the concentration of impurities in a film that is adjacent to the oxide semiconductor film is preferably reduced. Examples of impurities include hydrogen, nitrogen, an alkali metal, an alkaline earth metal, iron, nickel, and silicon.

Here, the influence of impurities in the oxide semiconductor film is described.

When silicon or carbon that is one of Group 14 elements is contained in the oxide semiconductor film, defect states are formed. Thus, the concentration of silicon or carbon in the oxide semiconductor film and around an interface with the oxide semiconductor film (measured by SIMS) is set lower than or equal to $2\times10^{18}$ atoms/cm$^3$, preferably lower than or equal to $2\times10^{17}$ atoms/cm$^3$.

When the oxide semiconductor film contains an alkali metal or an alkaline earth metal, defect states are formed and carriers are generated, in some cases. Thus, a transistor including an oxide semiconductor film that contains an alkali metal or an alkaline earth metal is likely to be normally-on. Therefore, it is preferable to reduce the concentration of an alkali metal or an alkaline earth metal in the oxide semiconductor film. Specifically, the concentration of an alkali metal or an alkaline earth metal in the oxide semiconductor film measured by SIMS is set lower than or equal to $1\times10^{18}$ atoms/cm$^3$, preferably lower than or equal to $2\times10^{16}$ atoms/cm$^3$.

When the oxide semiconductor film contains nitrogen, the oxide semiconductor film easily becomes n-type by generation of electrons serving as carriers and an increase of carrier density. Thus, a transistor whose semiconductor film includes an oxide semiconductor film that contains nitrogen is likely to be normally-on. For this reason, nitrogen in the oxide semiconductor film is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor film reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Accordingly, it is preferable that hydrogen in the oxide semiconductor film be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor film with sufficiently reduced impurity concentration is used for a channel formation region in a transistor, the transistor can have stable electrical characteristics.

The energy gap of the oxide semiconductor film is preferably 2 eV or more or 2.5 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In-M-Zn oxide, as the atomic ratio of metal elements in a sputtering target used for formation of the In-M-Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

At least part of this embodiment can be implemented in combination with any of the other embodiments described in this specification as appropriate.

Embodiment 4

In this embodiment, a semiconductor device that can be used as the flexible device of one embodiment of the present invention will be described with reference to drawings. Here, a transistor will be described in detail, as an example of the semiconductor device.

In this embodiment, top-gate transistors will be described with reference to FIGS. 19A to 19C, FIGS. 20A to 20C, FIGS. 21A and 21B, FIGS. 22A and 22B, FIGS. 23A and 23B, FIGS. 24A and 24B, FIGS. 25A and 25B, FIGS. 26A and 26B, FIGS. 27A and 27B, FIGS. 28A and 28B, FIGS. 29A and 29B, and FIGS. 30A to 30C.

Structure Example 1 of Transistor

Figure 19A:
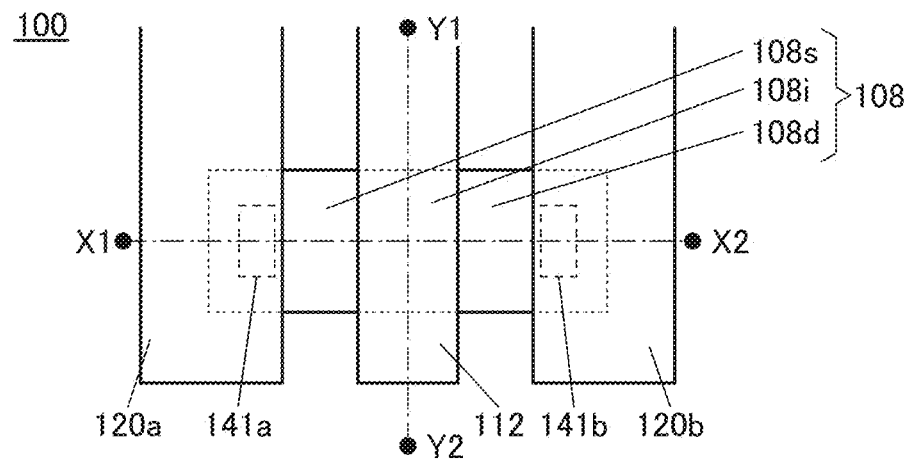
FIGS. 19A to 19C are a top view and cross-sectional views illustrating a semiconductor device.
Figure 19B:
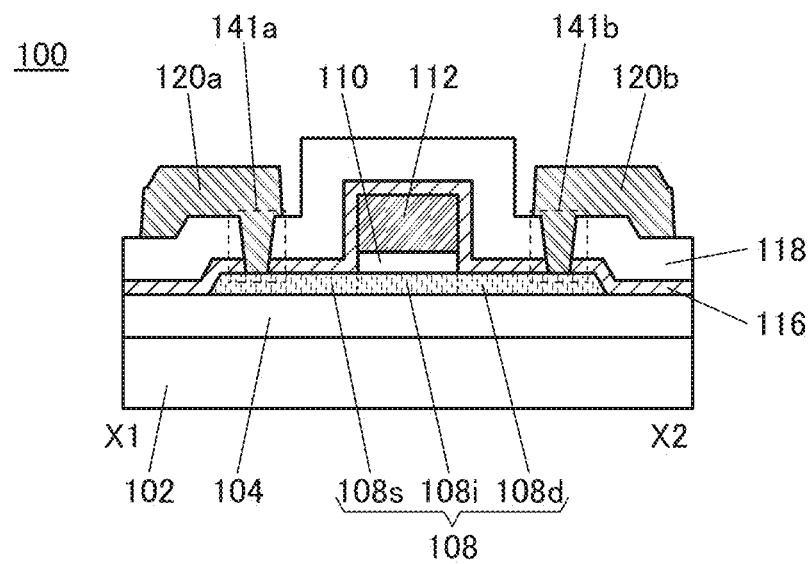
Figure 19C:
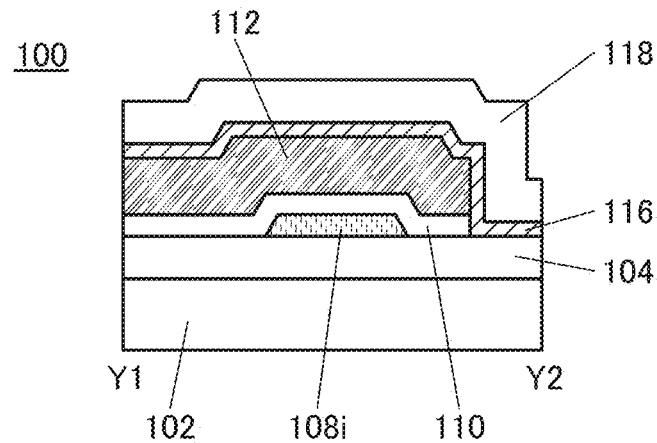

FIG. 19A is a top view of a transistor 100. FIG. 19B is a cross-sectional view taken along the dashed-dotted line X1-X2 in FIG. 19A. FIG. 19C is a cross-sectional view taken along the dashed-dotted line Y1-Y2 in FIG. 19A. For clarity, some components such as an insulating film 110 are not illustrated in FIG. 19A. As in FIG. 19A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 100 illustrated in FIGS. 19A to 19C includes an insulating film 104 over a substrate 102, an oxide semiconductor film 108 over the insulating film 104, the insulating film 110 over the oxide semiconductor film 108, a conductive film 112 over the insulating film 110, and an insulating film 116 over the insulating film 104, the oxide semiconductor film 108, and the conductive film 112. The oxide semiconductor film 108 includes a channel region 108$i$ overlapping with the conductive film 112, a source region 108$s$ in contact with the insulating film 116, and a drain region 108$d$ in contact with the insulating film 116.

The insulating film 116 contains nitrogen or hydrogen. The insulating film 116 is in contact with the source region 108$s$ and the drain region 108$d$, so that nitrogen or hydrogen that is contained in the insulating film 116 is added to the source region 108$s$ and the drain region 108$d$. The source region 108$s$ and the drain region 108$d$ each have a high carrier density when nitrogen or hydrogen is added thereto.

The transistor 100 may further include an insulating film 118 over the insulating film 116, a conductive film 120$a$ electrically connected to the source region 108$s$ through an opening 141$a$ provided in the insulating films 116 and 118, and a conductive film 120$b$ electrically connected to the drain region 108$d$ through an opening 141$b$ provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120$a$ functions as a source electrode, and the conductive film 120$b$ functions as a drain electrode.

The insulating film 110 functions as a gate insulating film. The insulating film 110 includes an excess oxygen region. Since the insulating film 110 includes the excess oxygen region, excess oxygen can be supplied to the channel region 108$i$ included in the oxide semiconductor film 108. As a result, oxygen vacancies that might be formed in the channel region 108$i$ can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. In that case, excess oxygen contained in the insulating film 104 might also be supplied to the source region 108$s$ and the drain region 108$d$ included in the oxide semiconductor film 108. When excess oxygen is supplied to the source region 108$s$ and the drain region 108$d$, the resistance of the source region 108$s$ and the drain region 108$d$ might be increased.

In contrast, in the structure in which the insulating film 110 formed over the oxide semiconductor film 108 contains excess oxygen, excess oxygen can be selectively supplied only to the channel region 108$i$. Alternatively, the carrier density of the source and drain regions 108$s$ and 108$d$ can be selectively increased after excess oxygen is supplied to the channel region 108$i$ and the source and drain regions 108$s$ and 108$d$, in which case an increase in the resistance of the source and drain regions 108$s$ and 108$d$ can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Next, details of the components of the semiconductor device in FIGS. 19A to 19C will be described.

[Substrate]

The substrate 102 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

For the substrate 102, an inorganic material such as a metal may be used. Examples of the inorganic material such as a metal include stainless steel and aluminum.

For the substrate 102, an organic material such as a resin may be used. Examples of the resin include polyester such as PET or PEN, polyolefin, polyamide (e.g., nylon or aramid), polyimide, polycarbonate, polyurethane, acrylic, an epoxy resin, PES, and a resin having a siloxane bond, such as silicone.

For the substrate 102, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrate 102 can at least support films or layers formed thereover or thereunder and may be one or more of an insulating film, a semiconductor film, and a conductive film.

[First Insulating Film]

The insulating film 104 can be formed by a sputtering method, a CVD method, an evaporation method, a PLD method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of a silicon oxide film, a silicon oxynitride film, a silicon nitride oxide film, a silicon nitride film, an aluminum oxide film, a hafnium oxide film, a gallium oxide film, a Ga—Zn oxide film, or the like. In this embodiment, the insulating film 104 has a stacked-layer structure of a silicon nitride film and a silicon oxynitride film. With the insulating film 104 having such a stacked-layer structure including a silicon nitride film as a lower layer and a silicon oxynitride film as an upper layer, oxygen can be efficiently introduced into the oxide semiconductor film 108.

[Oxide Semiconductor Film]

As the oxide semiconductor film 108, the metal oxide film described in Embodiment 1 can be used.

It is suitable to form the oxide semiconductor film 108 by a sputtering method because the film density can be high. In the case where the oxide semiconductor film 108 is formed by a sputtering method, a rare gas (argon, as a typical example), oxygen, or a mixed gas of a rare gas and oxygen is used as a sputtering gas, as appropriate. In addition, increasing the purity of a sputtering gas is necessary. For example, as an oxygen gas or an argon gas used for a sputtering gas, a gas that is highly purified to have a dew point of −60° C. or lower, preferably −100° C. or lower, is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably lower than or equal to $5\times10^{-5}$ Pa.

[Second Insulating Film]

The insulating film 110 functions as a gate insulating film of the transistor 100. In addition, the insulating film 110 has a function of supplying oxygen to the oxide semiconductor film 108, particularly to the channel region 108i. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, a silicon oxide film, a silicon oxynitride film, a silicon nitride oxide film, or a silicon nitride film may be used as the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide ($NO_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1\times10^{17}$ spins/cm$^3$ and lower than $1\times10^{18}$ spins/cm$^3$ as the insulating film 110, for example.

Note that a nitrogen oxide (NO)) such as nitrogen dioxide ($NO_2$) forms a state in the insulating film 110. The state is positioned in the energy gap of the oxide semiconductor film 108. Thus, when nitrogen oxide ($NO_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount of ammonia released by heat treatment in a range of 50° C. to 650° C. or 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, nitrogen concentration in the film is preferably lower than or equal to $6\times10^{20}$ atoms/cm$^3$.

The insulating film 110 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. As the insulating film 116, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. Thus, the concentration of an impurity (nitrogen or hydrogen) in the source region 108s and the drain region 108d in contact with the insulating film 116 is increased, leading to an increase in the carrier density of the source region 108s and the drain region 108d.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 112, 120a, and 120b can be formed by a sputtering method, a vacuum evaporation method, a PLD method, a thermal CVD method, or the like. As each of the conductive films 112, 120a, and 120b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

Note that a tantalum nitride film is preferably used for the conductive films 112, 120a, and 120b. A tantalum nitride film has conductivity and a high barrier property against copper or hydrogen. Because a tantalum nitride film releases little hydrogen from itself, it can be favorably used as a metal film in contact with the oxide semiconductor film 108 or a metal film in the vicinity of the oxide semiconductor film 108.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed layer that can make the conductive film grow may be formed between the diffusion prevention film and the conductive film. The diffusion prevention film can be formed by sputtering, for example. For the diffusion prevention film, a tantalum nitride film or a titanium nitride film can be used, for example. The seed layer can be formed by electroless plating. For the seed layer, a material similar to the material for the conductive film that can be formed by electroless plating can be used.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 112, 120a, and 120b can be greater than or equal to 30 nm and less than or equal to 500 nm, or greater than or equal to 100 nm and less than or equal to 400 nm.

Structure Example 2 of Transistor

Next, a structure of a transistor different from that in FIGS. 19A to 19C will be described with reference to FIGS. 20A to 20C.

Figure 20A:
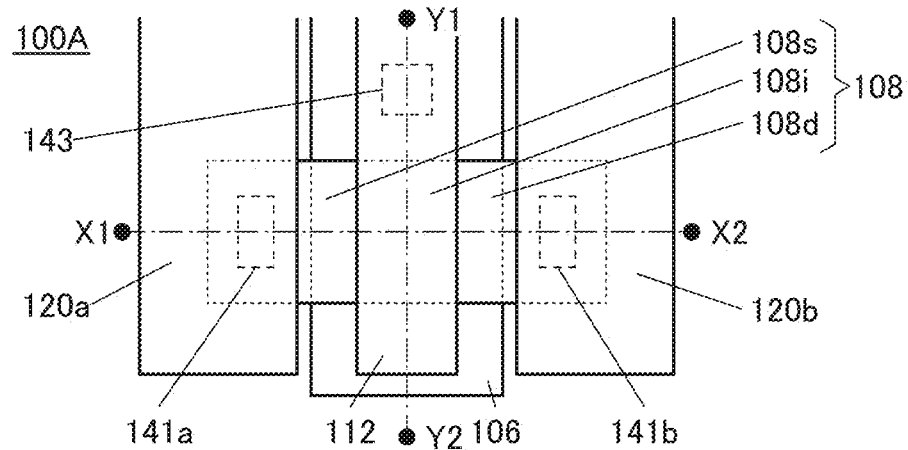
FIGS. 20A to 20C are a top view and cross-sectional views illustrating a semiconductor device.

FIG. 20A is a top view of a transistor 100A. FIG. 20B is a cross-sectional view taken along dashed-dotted line X1-X2 in FIG. 20A. FIG. 20C is a cross-sectional view taken along dashed-dotted line Y1-Y2 in FIG. 20A.

Figure 20B:
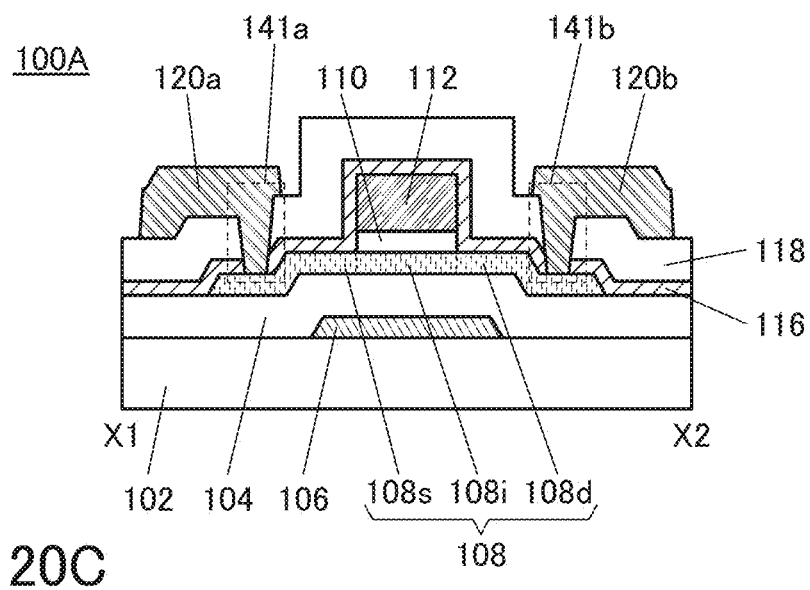
Figure 20C:
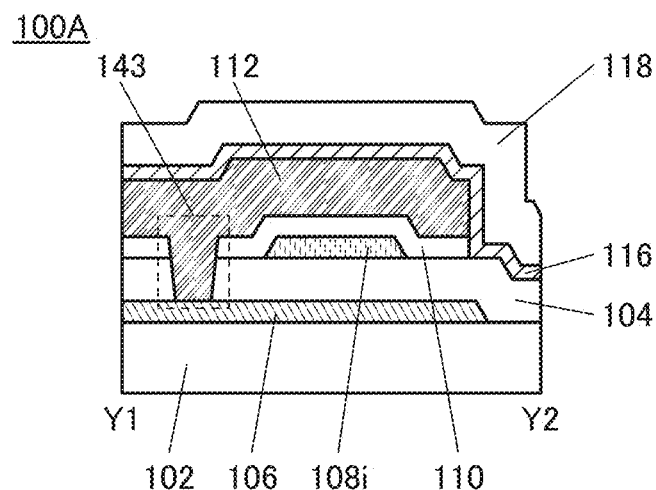

The transistor 100A illustrated in FIGS. 20A to 20C includes a conductive film 106 over the substrate 102, the insulating film 104 over the conductive film 106, the oxide semiconductor film 108 over the insulating film 104, the insulating film 110 over the oxide semiconductor film 108, the conductive film 112 over the insulating film 110, and the insulating film 116 over the insulating film 104, the oxide semiconductor film 108, and the conductive film 112. The oxide semiconductor film 108 includes the channel region 108i overlapping with the conductive film 112, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-shielding film without providing the opening 143. When the conductive film 106 is formed using a light-shielding material, for example, light irradiating the channel region 108i from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 100A as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 20A to 20C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIGS. 20B and 20C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening 143 provided in the insulating films 104 and 110, and the conductive films 106 and 112 surround the oxide semiconductor film 108 with the insulating films 104 and 110 positioned therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of a first gate electrode and a second gate electrode electrically surround an oxide semiconductor film in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_g$s is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_g$s is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3-V4) may be larger than the potential amplitude of the signal A (V1-V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 100A are similar to those of the transistor 100 described above and have similar effects.

Figure 21A:
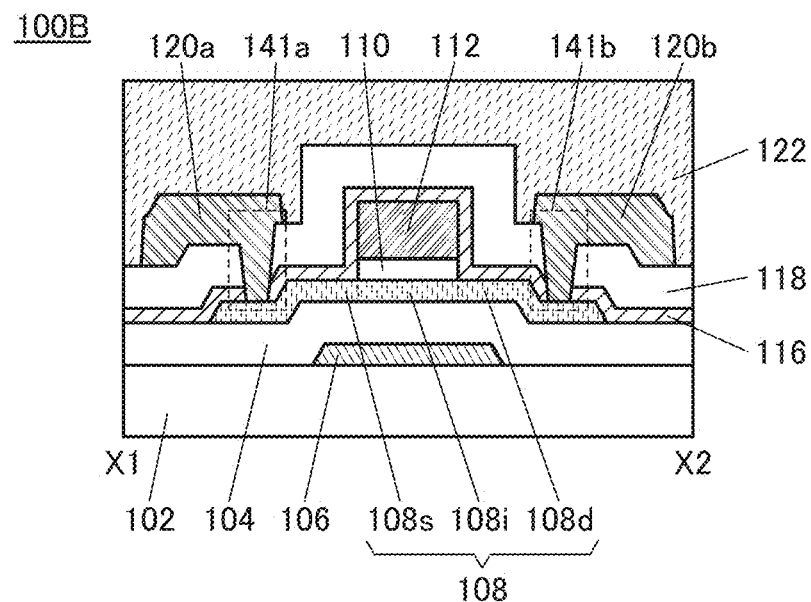
FIGS. 21A and 21B are cross-sectional views illustrating a semiconductor device.
Figure 21B:
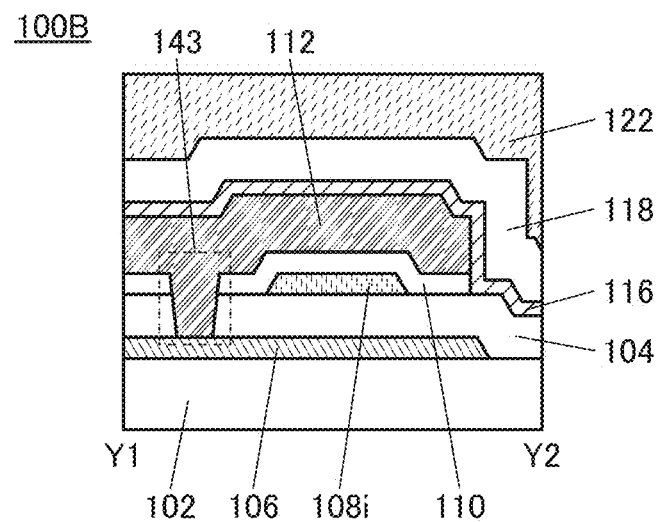

An insulating film may further be formed over the transistor 100A. An example of such a case is illustrated in FIGS. 21A and 21B. FIGS. 21A and 21B are cross-sectional views of the transistor 100B. The top view of the transistor 100B is not illustrated because it is similar to that of the transistor 100A in FIG. 20A.

The transistor 100B illustrated in FIGS. 21A and 21B includes an insulating film 122 over the conductive films 120a and 120b and the insulating film 118. The other components of the transistor 100B are similar to those of the transistor 100A and have similar effects.

The insulating film 122 has a function of covering unevenness and the like caused by the transistor or the like. The insulating film 122 has an insulating property and is formed using an inorganic material or an organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Structure Example 3 of Transistor

Next, structures of transistors different from the structure of the transistor illustrated in FIGS. 20A to 20C will be described with reference to FIGS. 22A and 22B, FIGS. 23A and 23B, and FIGS. 24A and 24B.

Figure 22A:
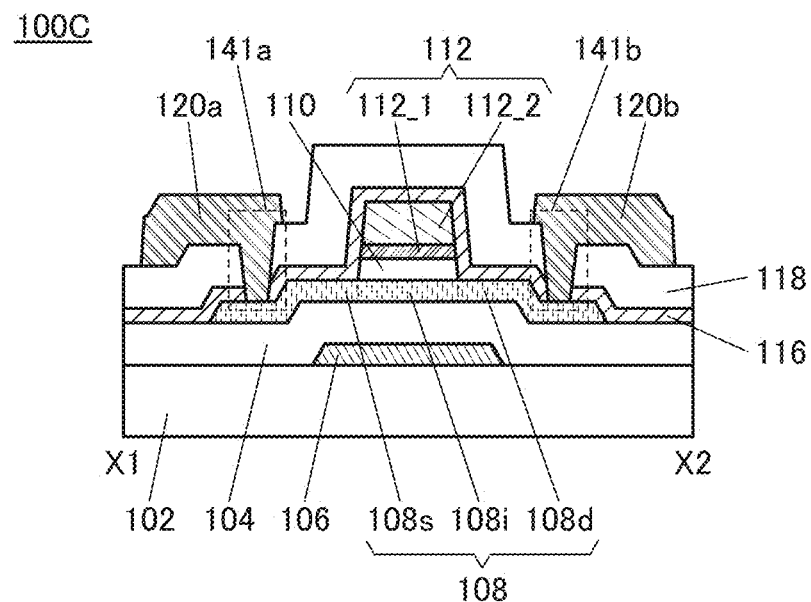
FIGS. 22A and 22B are cross-sectional views illustrating a semiconductor device.
Figure 22B:
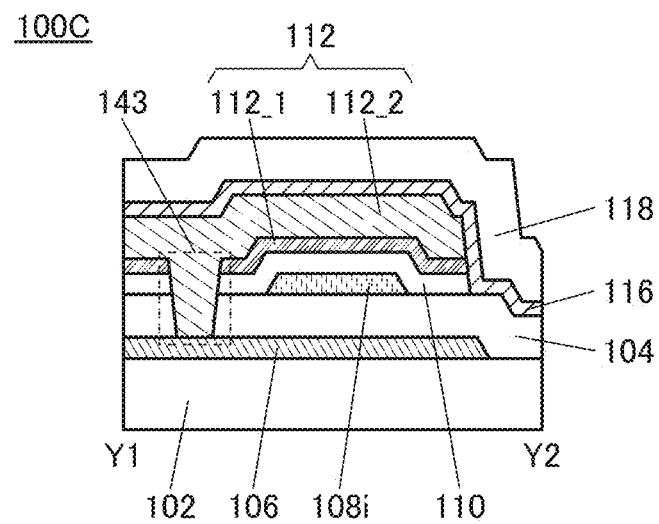
Figure 23A:
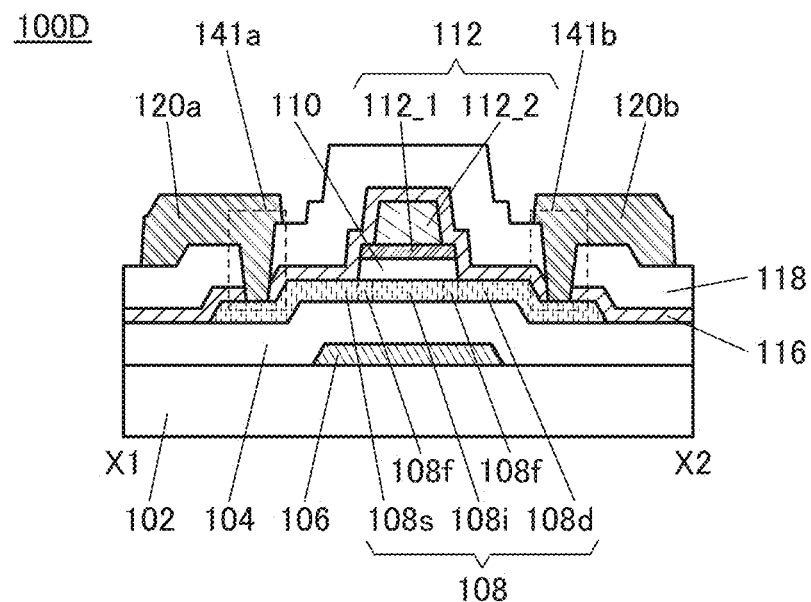
FIGS. 23A and 23B are cross-sectional views illustrating a semiconductor device.
Figure 23B:
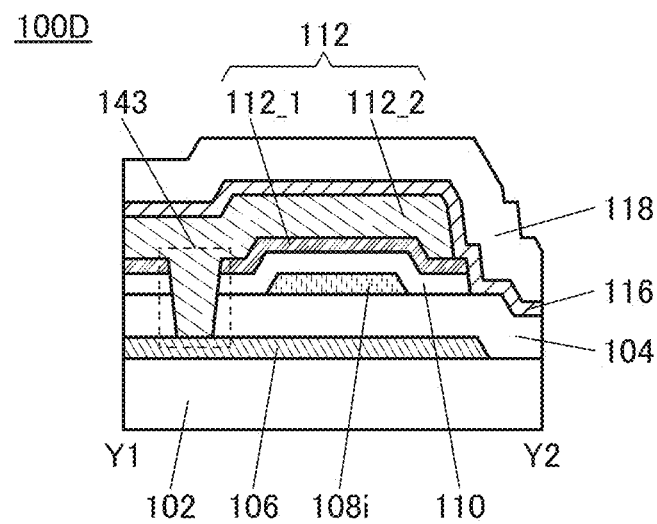
Figure 24A:
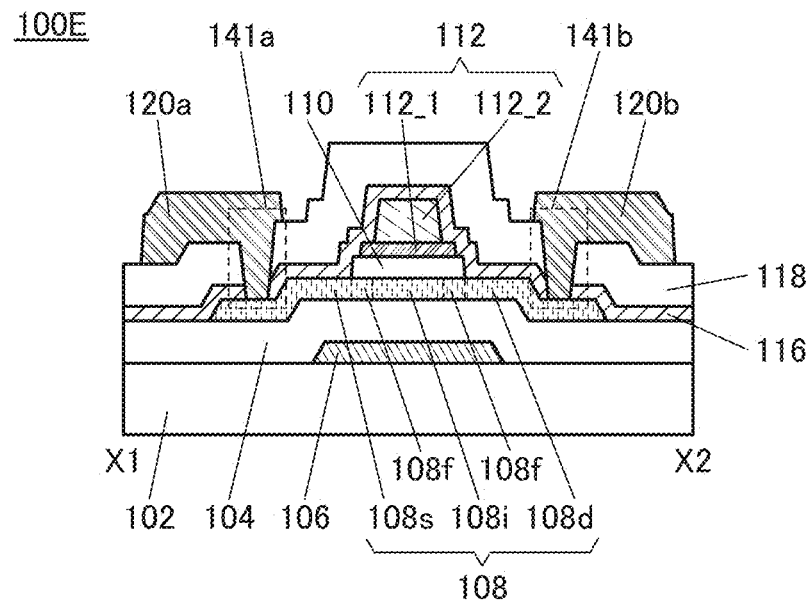
FIGS. 24A and 24B are cross-sectional views illustrating a semiconductor device.
Figure 24B:
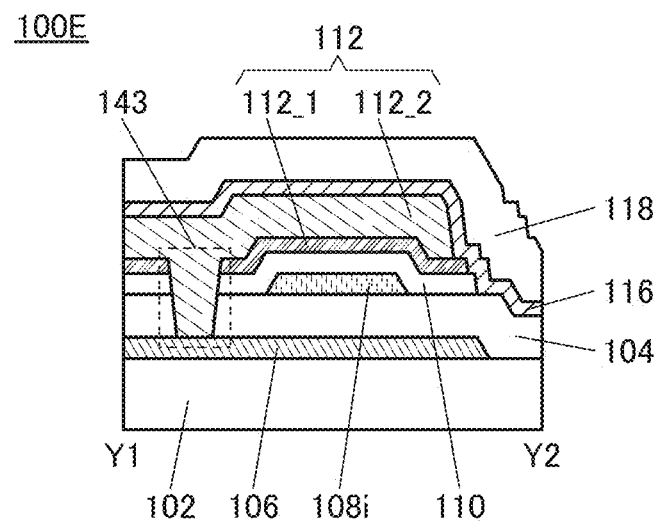

FIGS. 22A and 22B are cross-sectional views of a transistor 100C. FIGS. 23A and 23B are cross-sectional views of a transistor 100D. FIGS. 24A and 24B are cross-sectional views of a transistor 100E. The top views of the transistors 100C, 100D, and 100E are not illustrated because they are similar to the top view of the transistor 100A in FIG. 20A.

The transistor 100C illustrated in FIGS. 22A and 22B is different from the transistor 100A in the stacked-layer structure of the conductive film 112, the shape of the conductive film 112, and the shape of the insulating film 110.

The conductive film 112 in the transistor 100C includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide film containing indium and tin, an oxide film containing tungsten and indium, an oxide film containing tungsten, indium, and zinc, an oxide film containing titanium and indium, an oxide film containing titanium, indium, and tin, an oxide film containing indium and zinc, an oxide film containing silicon, indium, and tin, or an oxide film containing indium, gallium, and zinc can be used, for example.

As illustrated in FIG. 22B, the conductive film 1122 is connected to the conductive film 106 through the opening 143. By forming the opening 143 after a conductive film to be the conductive film 112_1 is formed, the shape illustrated in FIG. 22B can be obtained. In the case where an oxide conductive film is used as the conductive film 112_1, the structure in which the conductive film 1122 is connected to the conductive film 106 can decrease the contact resistance between the conductive film 112 and the conductive film 106.

The conductive film 112 and the insulating film 110 in the transistor 100C have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

It is suitable that the conductive film 112 and the insulating film 110 have tapered shapes as in the transistor 100C, because the coverage with the insulating film 116 can be high as compared with the case of the transistor 100A in which the conductive film 112 and the insulating film 110 are rectangular.

The other components of the transistor 100C are similar to those of the transistor 100A described above and have similar effects.

The transistor 100D illustrated in FIGS. 23A and 23B is different from the transistor 100A in the stacked-layer structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is located outward from a lower end portion of the conductive film 1122. The conductive film 112_1, the conductive film 1122, and the insulating film 110 can be formed by processing with the same mask. To obtain the above structure, for example, the conductive film 112_2 is processed by a wet etching method and the conductive film 112_1 and the insulating film 110 are processed by a dry etching method.

With the structure of the transistor 100D, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112_2 functioning as a gate electrode. In the case where the regions 108f are high-resistance regions, the regions 108f function as offset regions. To suppress a decrease in the on-state current of the transistor 100D, the regions 108f functioning as offset regions may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity element is added to the oxide semiconductor film 108 through the conductive film 112_1 and the insulating film 110.

As illustrated in FIG. 23B, the conductive film 1122 is connected to the conductive film 106 through the opening 143.

The other components of the transistor 100D are similar to those of the transistor 100A described above and have similar effects.

The transistor 100E illustrated in FIGS. 24A and 24B is different from the transistor 100A in the stacked-layer structure of the conductive film 112, the shape of the conductive film 112, and the shape of the insulating film 110.

The conductive film 112 in the transistor 100E includes the conductive film 112_1 over the insulating film 110 and the conductive film 112_2 over the conductive film 112_1. A lower end portion of the conductive film 112_1 is located outward from a lower end portion of the conductive film 112_2. Furthermore, a lower end portion of the insulating film 110 is located outward from the lower end portion of the conductive film 112_1. The conductive film 112_1, the conductive film 112_2, and the insulating film 110 can be formed by processing with the same mask. To obtain the above structure, for example, the conductive film 112_2 and the conductive film 112_1 are processed by a wet etching method and the insulating film 110 is processed by a dry etching method.

Like the transistor 100D, regions 108f are formed in the oxide semiconductor film 108 in the transistor 100E, in some cases. The regions 108f are formed between the channel region 108i and the source region 108s and between the channel region 108i and the drain region 108d.

As illustrated in FIG. 24B, the conductive film 1122 is connected to the conductive film 106 through the opening 143.

The other components of the transistor 100E are similar to those of the transistor 100A described above and have similar effects.

Structure Example 4 Transistor

Next, structures of transistors different from the structure of the transistor 100A illustrated in FIGS. 20A to 20C will be described with reference to FIGS. 25A and 25B, FIGS. 26A and 26B, FIGS. 27A and 27B, FIGS. 28A and 28B, and FIGS. 29A and 29B.

Figure 25A:
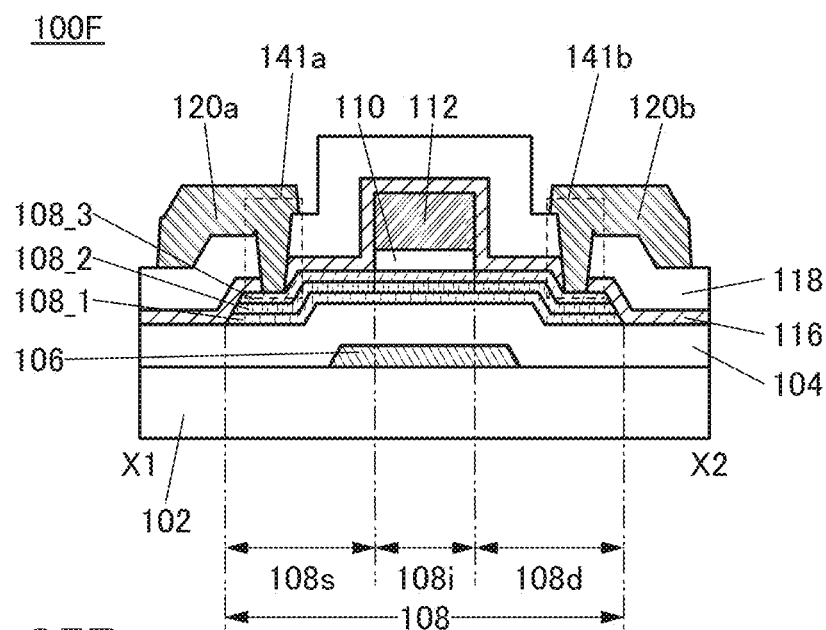
FIGS. 25A and 25B are cross-sectional views illustrating a semiconductor device.
Figure 25B:
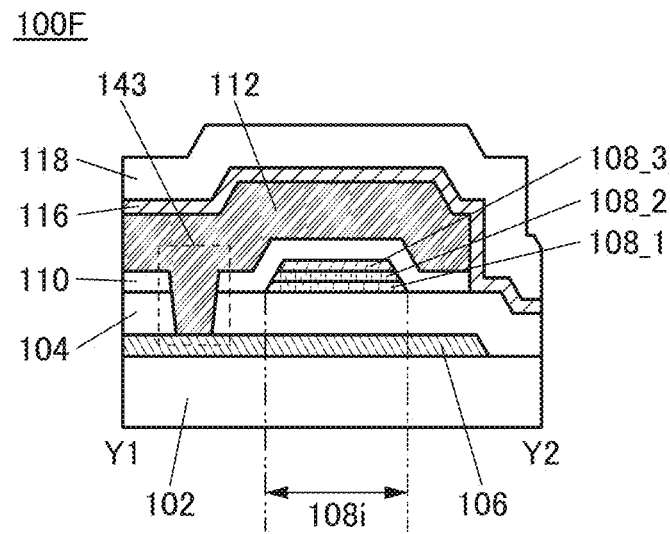
Figure 26A:
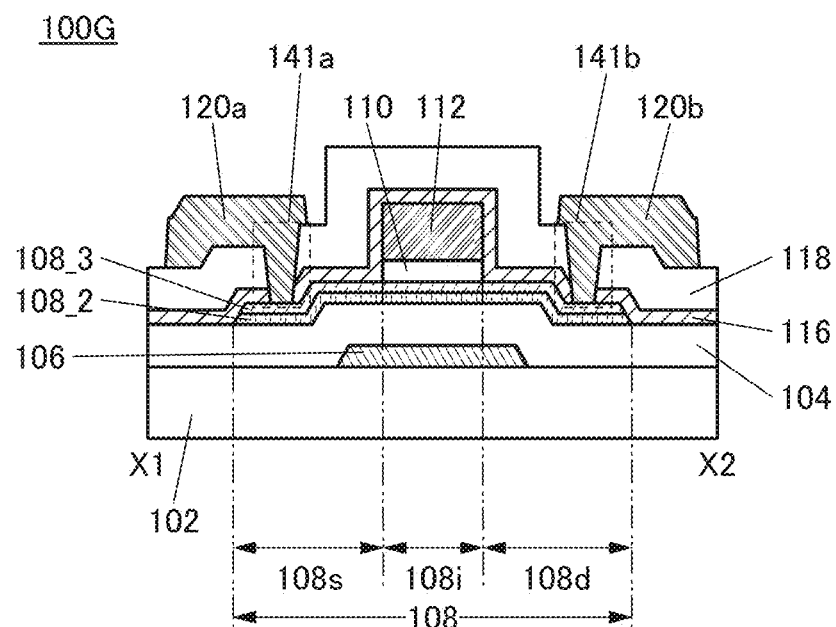
FIGS. 26A and 26B are cross-sectional views illustrating a semiconductor device.
Figure 26B:
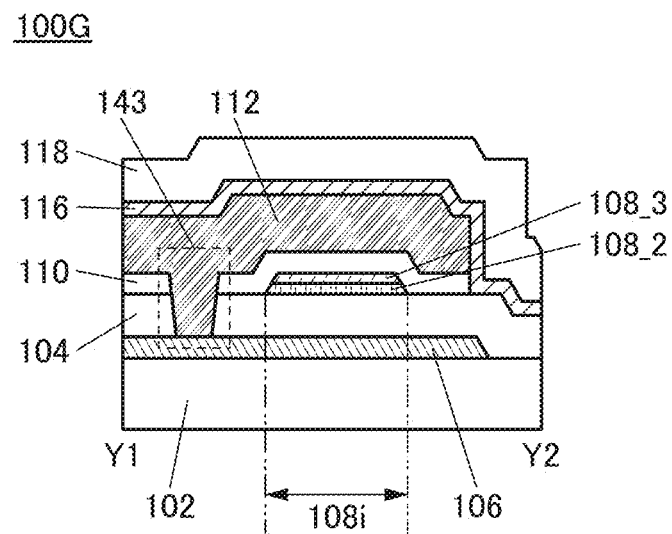
Figure 27A:
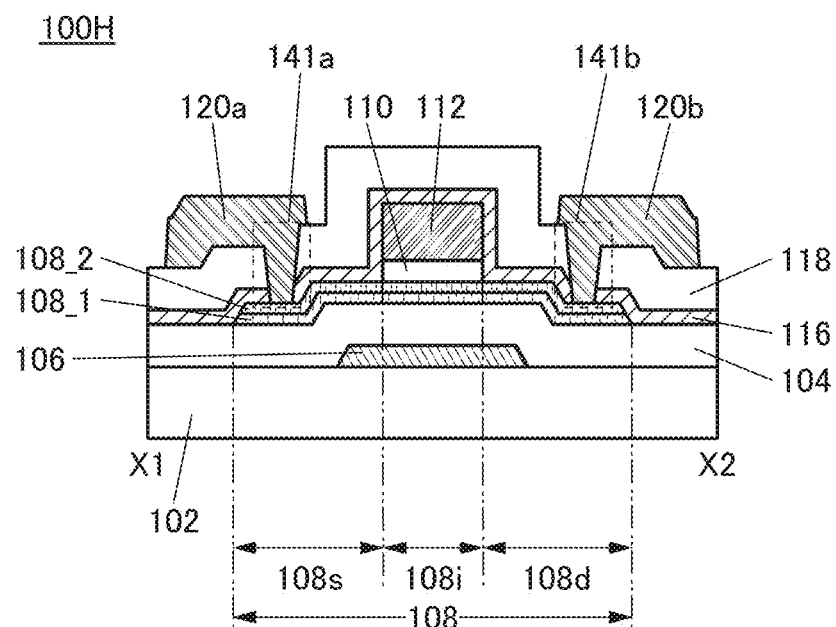
FIGS. 27A and 27B are cross-sectional views illustrating a semiconductor device.
Figure 27B:
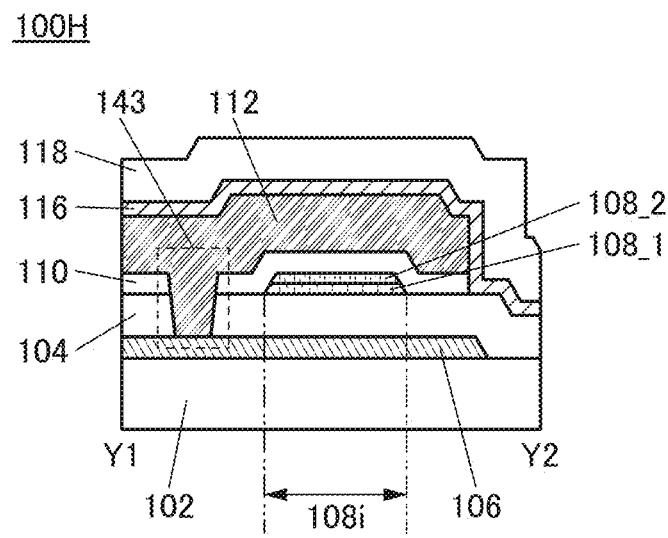
Figure 28A:
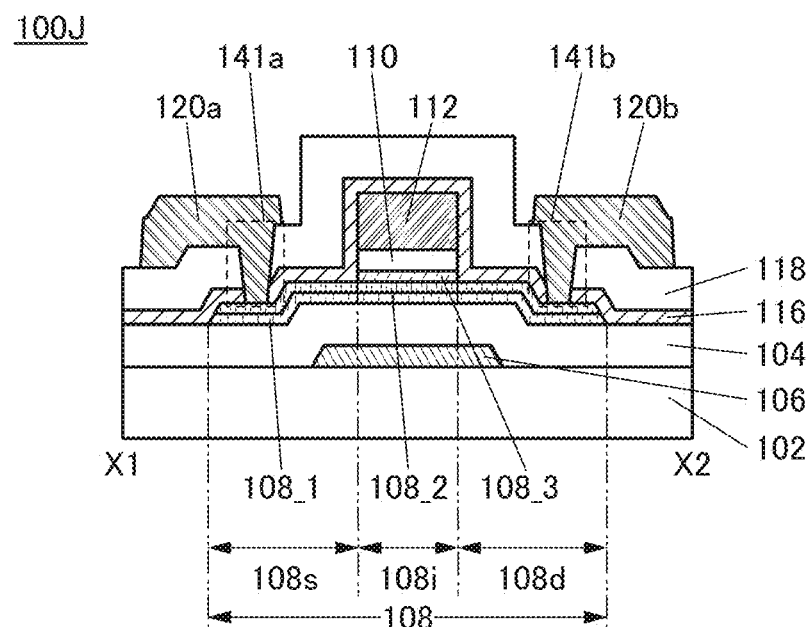
FIGS. 28A and 28B are cross-sectional views illustrating a semiconductor device.
Figure 28B:
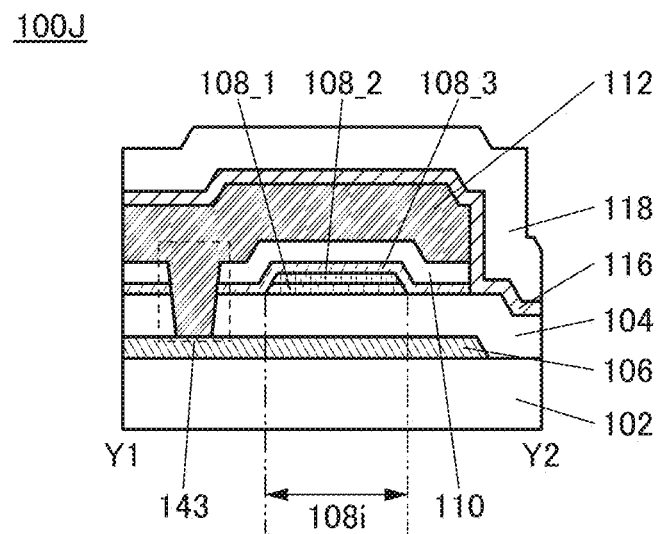
Figure 29A:
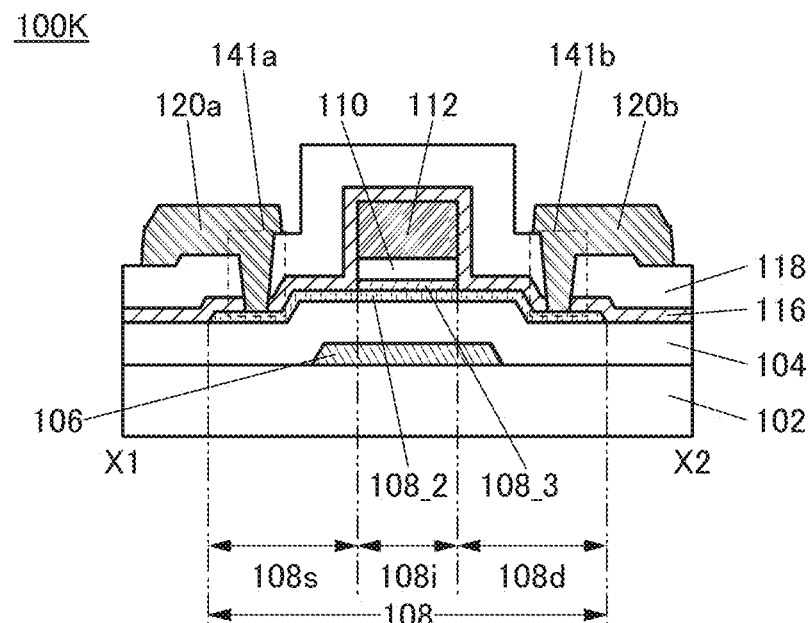
FIGS. 29A and 29B are cross-sectional views illustrating a semiconductor device.
Figure 29B:
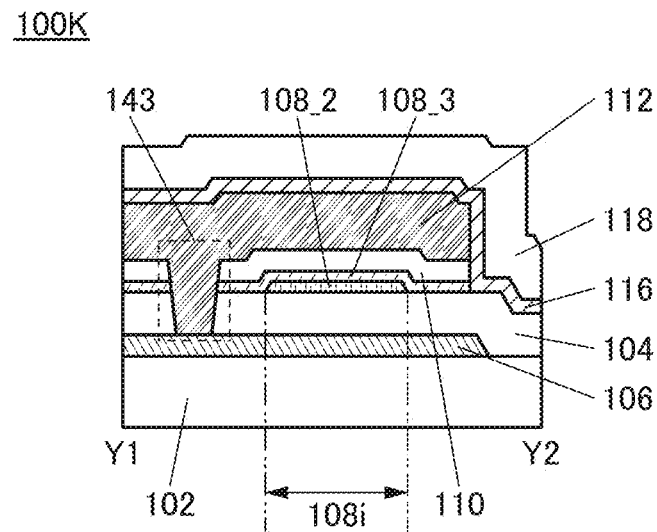

FIGS. 25A and 25B are cross-sectional views of a transistor 100F. FIGS. 26A and 26B are cross-sectional views of a transistor 100G. FIGS. 27A and 27B are cross-sectional views of a transistor 100H. FIGS. 28A and 28B are cross-sectional views of a transistor 100J. FIGS. 29A and 29B are cross-sectional views of a transistor 100K. The top views of the transistors 100F, 100G, 100H, 100J, and 100K are not illustrated because they are similar to the top view of the transistor 100A in FIG. 20A.

The transistors 100F, 100G, 100H, 100J, and 100K are different from the above-described the transistor 100A in the structure of the oxide semiconductor film 108. The other components are similar to those of the transistor 100A and have similar effects.

The oxide semiconductor film 108 of the transistor 100F illustrated in FIGS. 25A and 25B includes an oxide semiconductor film 108_1 over the insulating film 104, an oxide semiconductor film 1082 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 1082, and the oxide semiconductor film 108_3.

The oxide semiconductor film 108 of the transistor 100G illustrated in FIGS. 26A and 26B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 1082 and the oxide semiconductor film 1083.

The oxide semiconductor film 108 of the transistor 100H illustrated in FIGS. 27A and 27B includes the oxide semiconductor film 108_1 over the insulating film 104, and the oxide semiconductor film 108_2 over the oxide semiconductor film 108_1. The channel region 108i, the source region 108s, and the drain region 108d each have a two-layer structure of the oxide semiconductor film 108_1 and the oxide semiconductor film 1082.

The oxide semiconductor film 108 of the transistor 100J illustrated in FIGS. 28A and 28B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 1082. Note that in the cross section of the transistor 100J in the channel width (W) direction, the oxide semiconductor film 108_3 covers side surfaces of the oxide semiconductor film 108_1 and the oxide semiconductor film 108_2 (FIG. 28B).

The oxide semiconductor film 108 of the transistor 100K illustrated in FIGS. 29A and 29B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 1082. Note that in the cross section of the transistor 100K in the channel width (W) direction, the oxide semiconductor film 108_3 covers side surfaces of the oxide semiconductor film 108_2 (FIG. 29B).

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100J and the transistor 100K, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

[Band Structure]

Here, examples of a band structure of the channel region 108i in the transistor will be described with reference to FIGS. 30A to 30C.

Figure 30A:
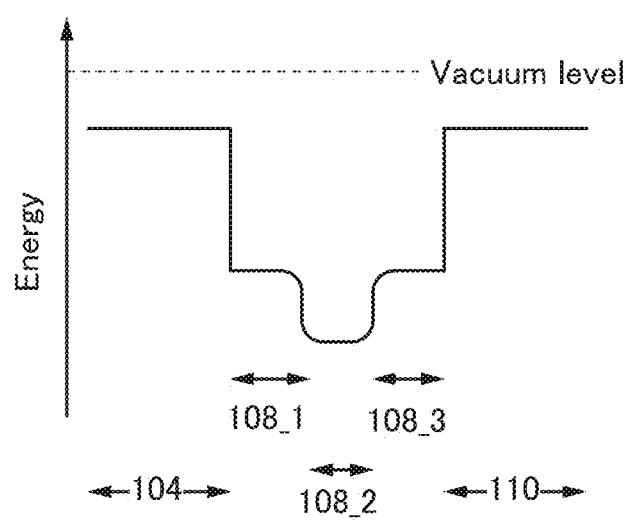
FIGS. 30A to 30C illustrate band structures.

FIG. 30A shows an example of a band structure in the thickness direction of a stack including the insulating film 104, the oxide semiconductor films 108_1, 108_2, and 108_3, and the insulating film 110. FIG. 30B shows an example of a band structure in the thickness direction of a stack including the insulating film 104, the oxide semiconductor films 108_2 and 108_3, and the insulating film 110. FIG. 30C shows an example of a band structure in the thickness direction of a stack including the insulating film 104, the oxide semiconductor films 108_1 and 108_2, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 30A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 1082, and an oxide semiconductor film formed using a metal oxide target whose atomic ratio of In to Ga and Zn is 1:3:2 is used as the oxide semiconductor film 1083.

Figure 30B:
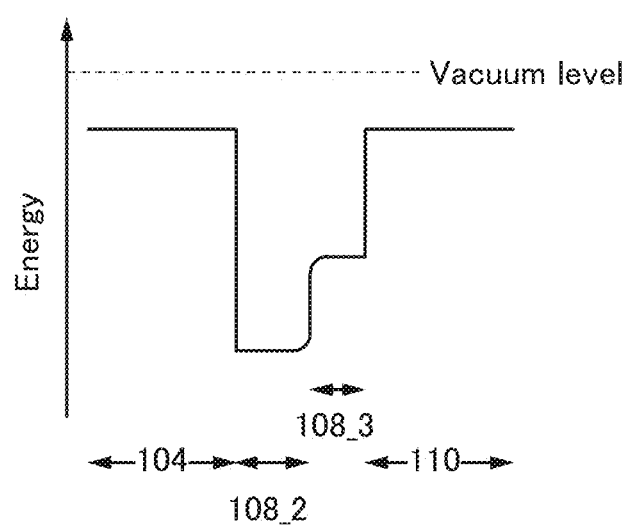
Figure 30C:
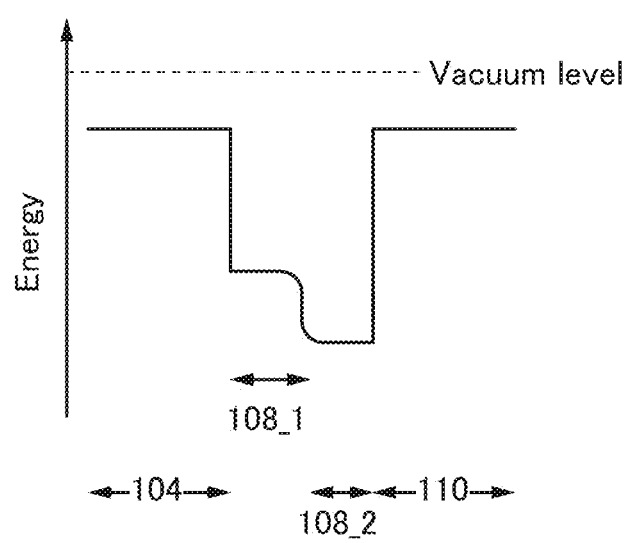

Films used as the insulating films and the oxide semiconductor films in the cases of FIGS. 30B and 30C are similar to those in the case of FIG. 30A.

As illustrated in FIG. 30A, the conduction band minimum gradually varies between the oxide semiconductor films 1081, 1082, and 1083. As illustrated in FIG. 30B, the conduction band minimum gradually varies between the oxide semiconductor films 108_2 and 108_3. As illustrated in FIG. 30C, the conduction band minimum gradually varies between the oxide semiconductor films 108_1 and 1082. In other words, the conduction band minimum is continuously changed or continuously connected. To obtain such a band structure, there exists no impurity, which forms a defect state such as a trap center or a recombination center, at the interface between the oxide semiconductor films 108_1 and 1082 or the interface between the oxide semiconductor films 1082 and 1083.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 30A, FIG. 30B, or FIG. 30C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from defect states.

In addition, the defect states might be more distant from the vacuum level than the conduction band minimum ($E_c$) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum ($E_c$) of the oxide semiconductor film 108_2. Such a structure inhibits accumulation of electrons in the defect states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 1082 and the conduction band minimum of each of the oxide semiconductor films 108_1 and 1083 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that the oxide semiconductor films 108_1 and 1083 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 1082 or at the interface between the oxide semiconductor film 1082 and the oxide semiconductor film 1083. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 1083. Thus, the oxide semiconductor films 108_1 and 1083 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 1082 and the conduction band minimum of each of the oxide semiconductor films 108_1 and 1083 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120*a* and 120*b* might be diffused into the oxide semiconductor film 108_2 at the interface between the spinel crystal structure and another region.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. It is suitable that an oxide semiconductor film formed using a metal oxide target whose atomic ratio of In to Ga and Zn is 1:1:1 is used as the oxide semiconductor film 108_2 and an oxide semiconductor film formed using a metal oxide target whose atomic ratio of Ga to Zn is 10:1 is used as each of the oxide semiconductor films 108_1 and 108_3 because the difference between the conduction band minimum of the oxide semiconductor film 1082 and the conduction band minimum of the oxide semiconductor film 108_1 or 1083 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be $\beta 1 : \beta 2$ ($0 < \beta 1 \leq 2$, $0 < \beta \leq 2$). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be $1 : \beta 3 : \beta 4$ ($1 \leq \beta 3 \leq 5$, $2 \leq \beta 4 \leq 6$). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be $1 : \beta 5 : \beta 6$ ($1 \leq \beta 5$, $4 \leq \beta 6 \leq 8$).

At least part of this embodiment can be implemented in combination with any of the other embodiments described in this specification as appropriate.

Embodiment 5

In this embodiment, a semiconductor device that can be used as the flexible device of one embodiment of the present invention will be described with reference to drawings. Here, a transistor will be described in detail, as an example of the semiconductor device.

In this embodiment, bottom-gate transistors will be described with reference to FIGS. 31A to 31C, FIGS. 32A to 32C, FIGS. 33A to 33C, FIGS. 34A to 34C, FIGS. 35A and 35B, FIGS. 36A and 36B, and FIGS. 37A to 37C.

Structure Example 1 of Transistor

Figure 31A:
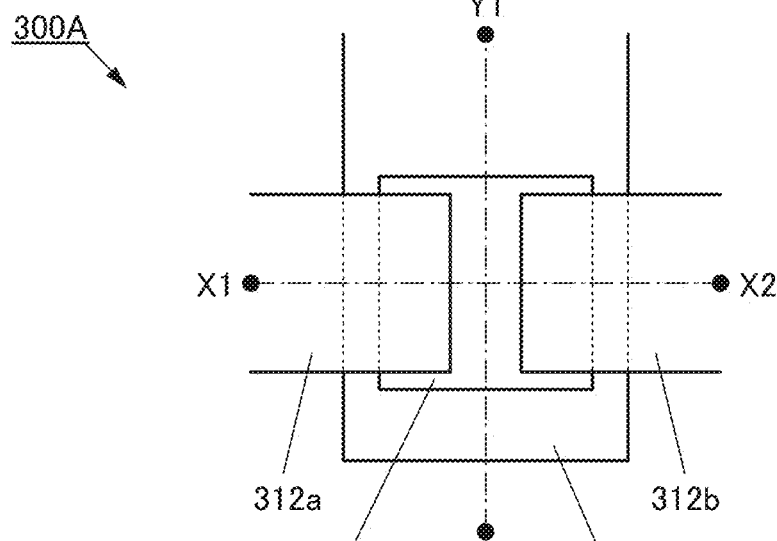
FIGS. 31A to 31C are a top view and cross-sectional views illustrating a semiconductor device.
Figure 31B:
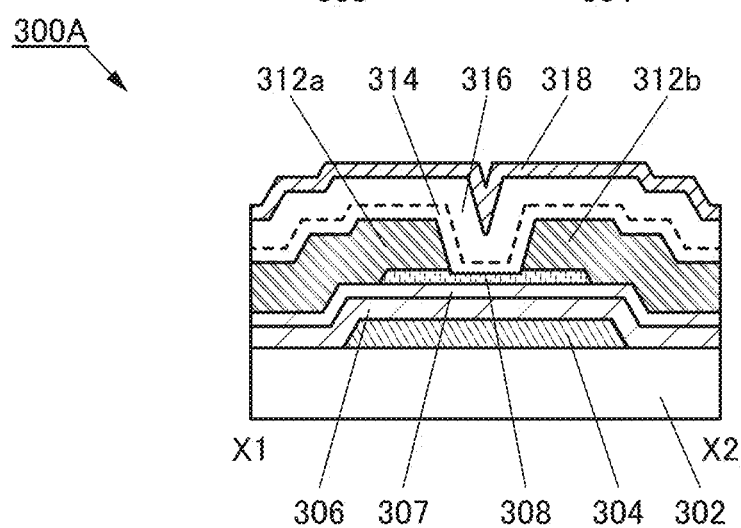
Figure 31C:
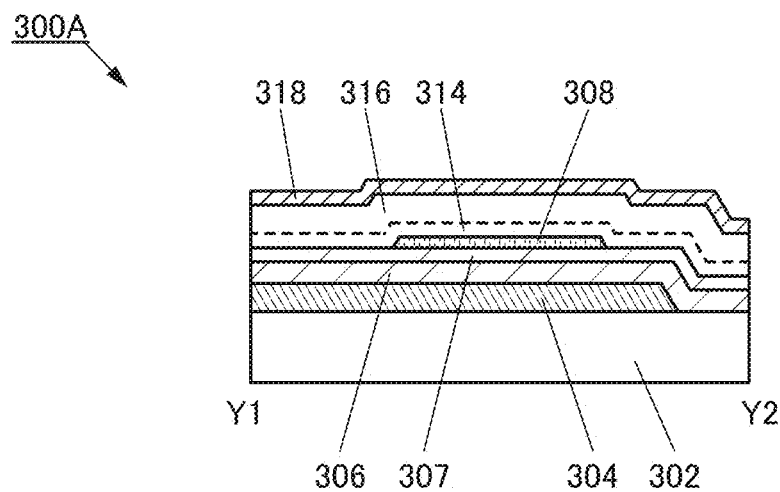

FIG. 31A is a top view of a transistor 300A. FIG. 31B is a cross-sectional view taken along dashed-dotted line X1-X2 in FIG. 31A. FIG. 31C is a cross-sectional view taken along dashed-dotted line Y1-Y2 in FIG. 31A. Note that in FIG. 31A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 31A, some components are not illustrated in some cases in top views of transistors described below.

The transistor 300A illustrated in FIGS. 31A to 31C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312*a* over the oxide semiconductor film 308, and a conductive film 312*b* over the oxide semiconductor film 308. Over the transistor 300A, specifically, over the conductive films 312*a* and 312*b* and the oxide semiconductor film 308, an insulating film 314, an insulating film 316, and an insulating film 318 are provided.

In the transistor 300A, the insulating films 306 and 307 each function as the gate insulating film of the transistor 300A, and the insulating films 314, 316, and 318 each function as a protective insulating film of the transistor 300A. Furthermore, in the transistor 300A, the conductive film 304 functions as a gate electrode, the conductive film 312*a* functions as a source electrode, and the conductive film 312*b* functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 31A to 31C is a channel-etched transistor.

Structure Example 2 of Transistor

Figure 32A:
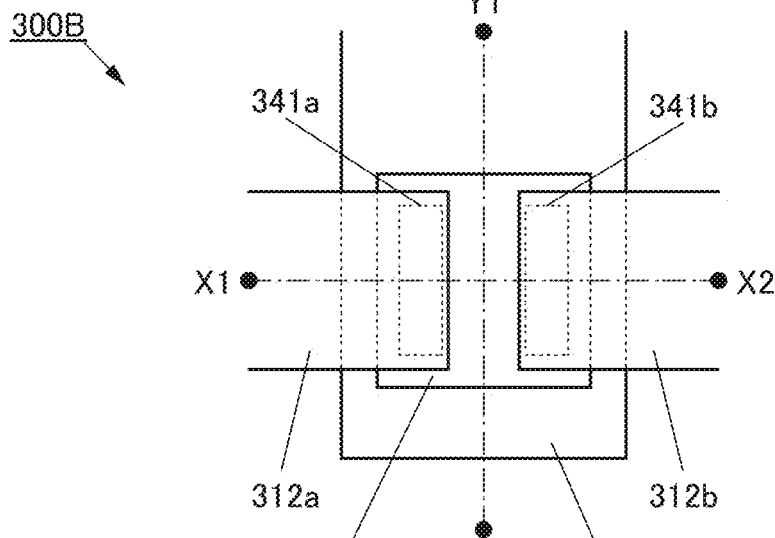
FIGS. 32A to 32C are a top view and cross-sectional views illustrating a semiconductor device.
Figure 32B:
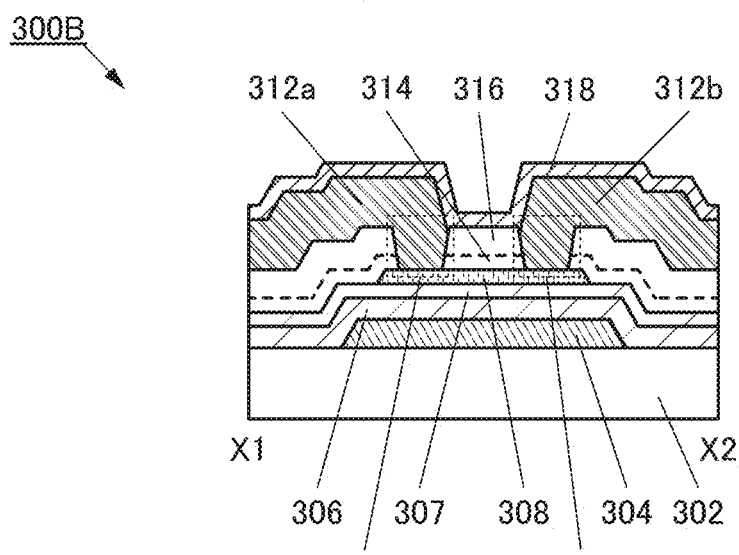
Figure 32C:
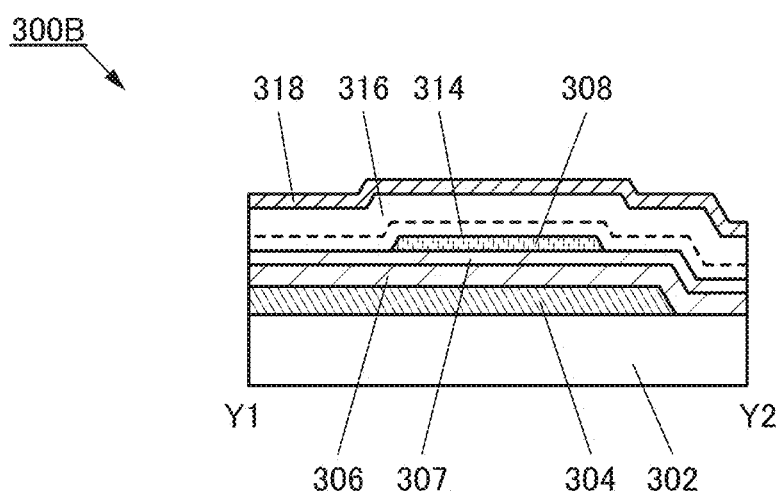

FIG. 32A is a top view of a transistor 300B. FIG. 32B is a cross-sectional view taken along dashed-dotted line X1-X2 in FIG. 32A. FIG. 32C is a cross-sectional view taken along dashed-dotted line Y1-Y2 in FIG. 32A.

The transistor 300B illustrated in FIGS. 32A to 32C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating films 314 and 316, and the conductive film 312b electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

In the transistor 300B, the insulating films 306 and 307 each function as a gate insulating film of the transistor 300B, the insulating films 314 and 316 each function as a protective insulating film of the oxide semiconductor film 308, and the insulating film 318 functions as a protective insulating film of the transistor 300B. Furthermore, in the transistor 300B, the conductive film 304 functions as a gate electrode, the conductive film 312a functions as a source electrode, and the conductive film 312b functions as a drain electrode.

The transistor 300A illustrated in FIGS. 31A to 31C has a channel-etched structure, whereas the transistor 300B in FIGS. 32A to 32C has a channel-protective structure.

Structure Example 3 of Transistor

Figure 33A:
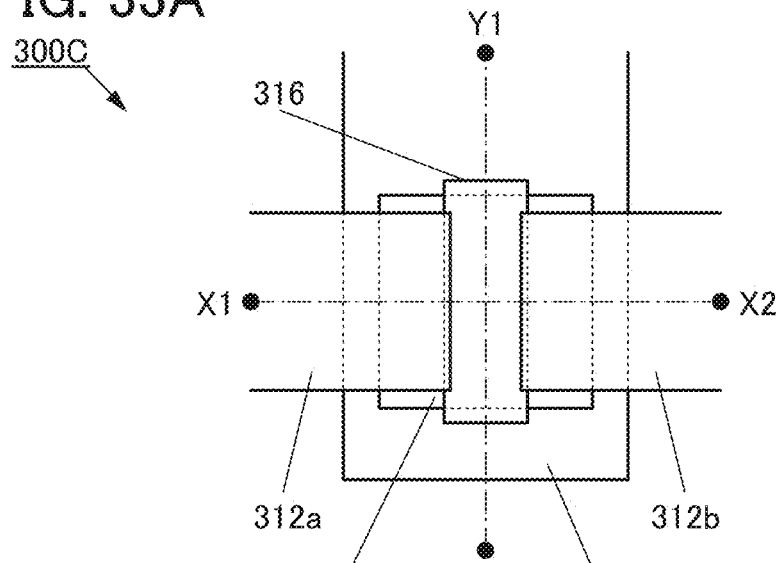
FIGS. 33A to 33C are a top view and cross-sectional views illustrating a semiconductor device.
Figure 33B:
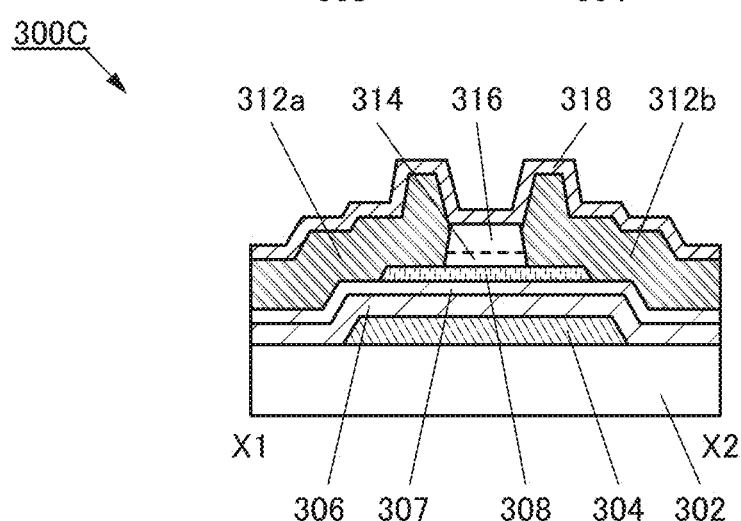
Figure 33C:
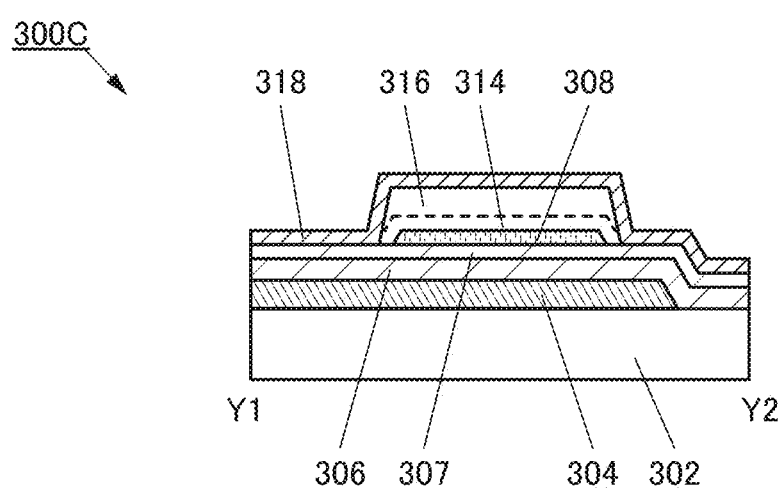

FIG. 33A is a top view of a transistor 300C. FIG. 33B is a cross-sectional view taken along dashed-dotted line X1-X2 in FIG. 33A. FIG. 33C is a cross-sectional view taken along dashed-dotted line Y1-Y2 in FIG. 33A.

The transistor 300C illustrated in FIGS. 33A to 33C is different from the transistor 300B in FIGS. 32A to 32C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

Structure Example 4 of Transistor

Figure 34A:
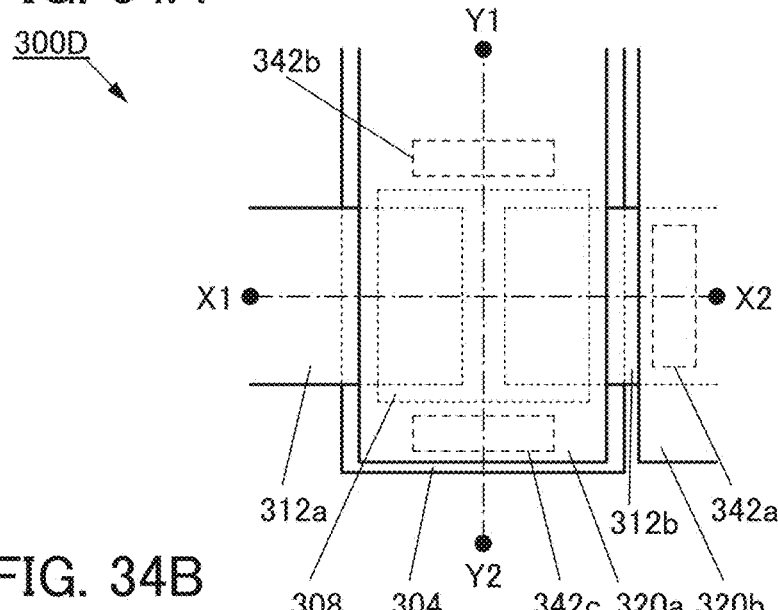
FIGS. 34A to 34C are a top view and cross-sectional views illustrating a semiconductor device.
Figure 34B:
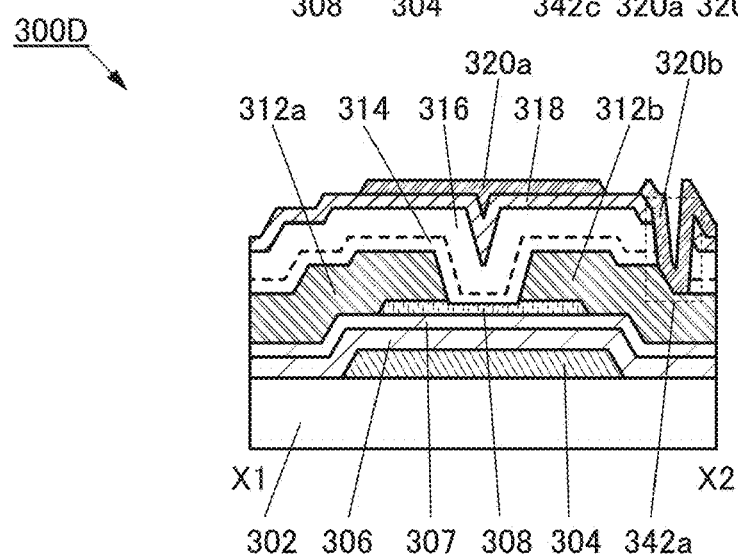
Figure 34C:
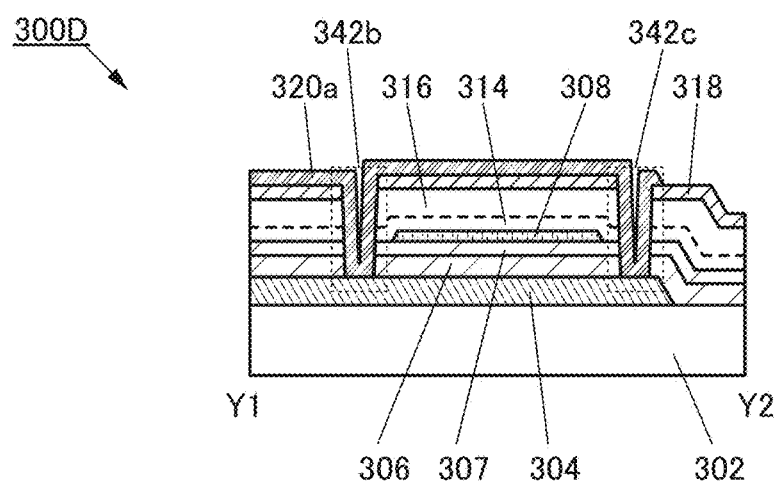

FIG. 34A is a top view of a transistor 300D. FIG. 34B is a cross-sectional view taken along dashed-dotted line X1-X2 in FIG. 34A. FIG. 34C is a cross-sectional view taken along dashed-dotted line Y1-Y2 in FIG. 34A.

The transistor 300D illustrated in FIGS. 34A to 34C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 each function as a first gate insulating film of the transistor 300D, and the insulating films 314, 316, and 318 each function as a second gate insulating film of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 34C, the conductive film 320a is connected to the conductive film 304 in an opening 342b and an opening 342c provided in the insulating films 306, 307, 314, 316, and 318. Thus, the same potential is applied to the conductive film 320a and the conductive film 304.

The structure of the transistor 300D is not limited to that described above, in which the openings 342b and 342c are provided so that the conductive film 320a is connected to the conductive film 304. For example, a structure in which only one of the openings 342b and 342c is provided so that the conductive film 320a is connected to the conductive film 304, or a structure in which the openings 342b and 342c are not provided and the conductive film 320a and the conductive film 304 are not connected to each other may be employed. Note that in the case where the conductive film 320a and not connected to the conductive film 304 are not connected to each other, it is possible to apply different potentials to the conductive film 320a and the conductive film 304.

The conductive film 320b is connected to the conductive film 312b through an opening 342a provided in the insulating films 314, 316, and 318.

Note that the transistor 300D has the S-channel structure described above.

Structure Example 5 Transistor

The oxide semiconductor film 308 included in the transistor 300A in FIGS. 31A to 31C may have a stacked-layer structure. FIGS. 35A and 35B and FIGS. 36A and 36B illustrate examples of such a case.

Figure 35A:
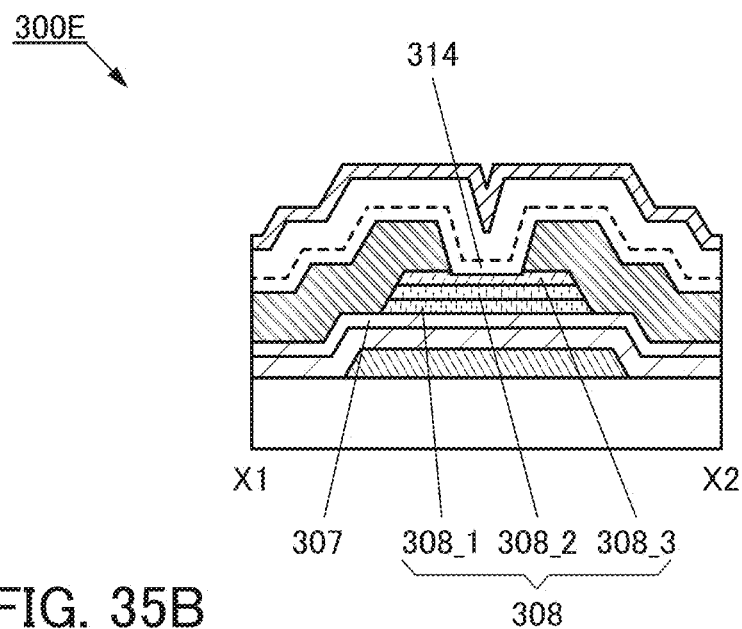
FIGS. 35A and 35B are cross-sectional views illustrating a semiconductor device.
Figure 35B:
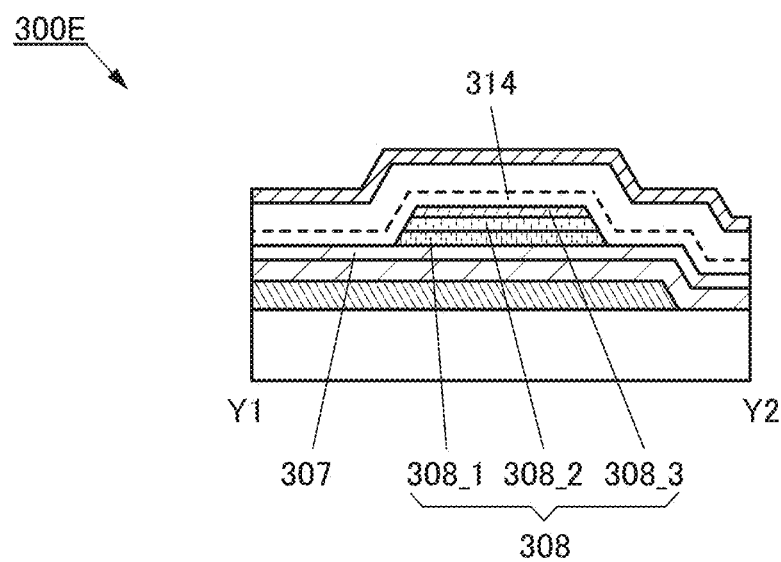
Figure 36A:
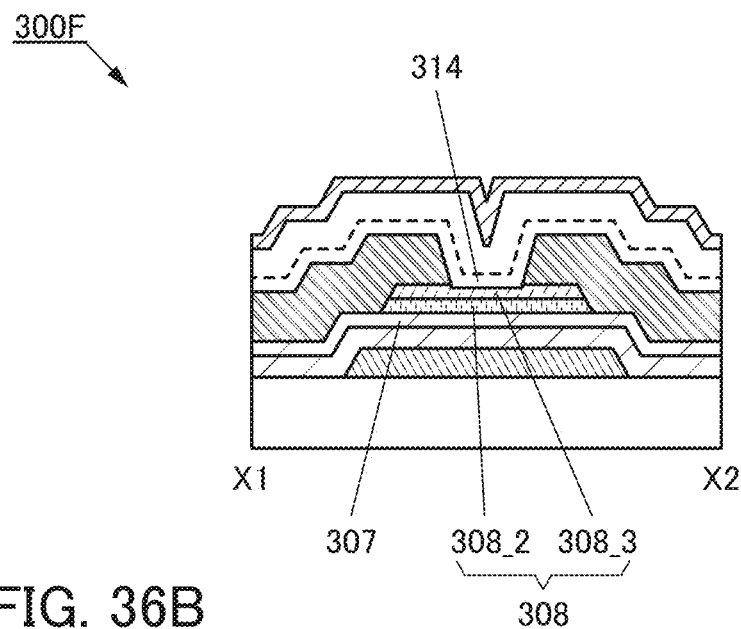
FIGS. 36A and 36B are cross-sectional views illustrating a semiconductor device.
Figure 36B:
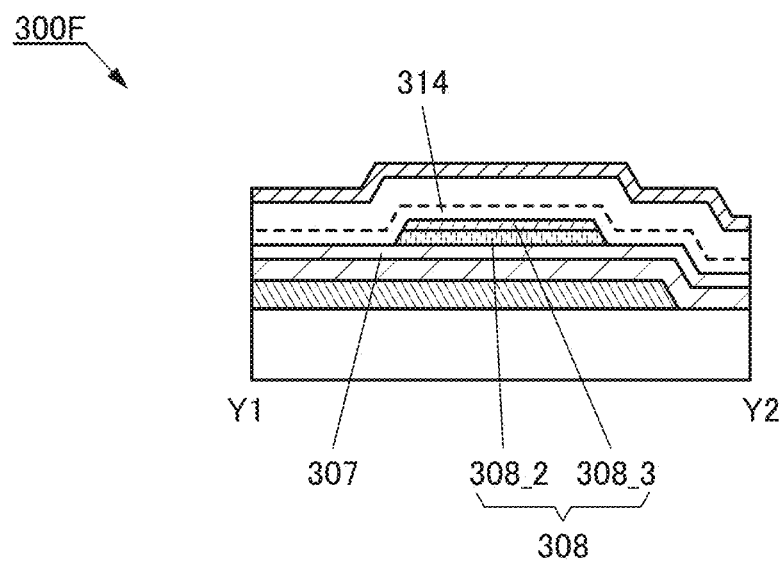

FIGS. 35A and 35B are cross-sectional views of a transistor 300E and FIGS. 36A and 36B are cross-sectional views of a transistor 300F. The top views of the transistors 300E and 300F are similar to that of the transistor 300A illustrated in FIG. 31A.

The oxide semiconductor film 308 of the transistor 300E illustrated in FIGS. 35A and 35B includes an oxide semiconductor film 308_1, an oxide semiconductor film 3082, and an oxide semiconductor film 3083. The oxide semiconductor film 308 of the transistor 300F illustrated in FIGS. 36A and 36B includes the oxide semiconductor film 3082 and the oxide semiconductor film 3083.

Note that the conductive film 304 can be formed using the materials of the conductive film 106; the insulating film 306 and the insulating film 318 can be formed using the materials of the insulating film 116; the insulating film 307 can be formed using the materials of the insulating film 110; the oxide semiconductor film 308, the oxide semiconductor film 308_1, the oxide semiconductor film 308_2, and the oxide semiconductor film 308_3 can be formed using the materials of the oxide semiconductor film 108, the oxide semiconductor film 108_1, the oxide semiconductor film 108_2, and the oxide semiconductor film 108_3, respectively; the conductive films 312a and 312b can be formed using the materials of the conductive films 120a and 120b; the insulating film 314 can be formed using the materials of the insulating film 104; the insulating film 316 can be formed using the materials of the insulating film 118; and the conductive films 320a and 320b can be formed using the materials of the conductive film 112, as described in Embodiment 4.

Structure Example 6 Transistor

Figure 37A:
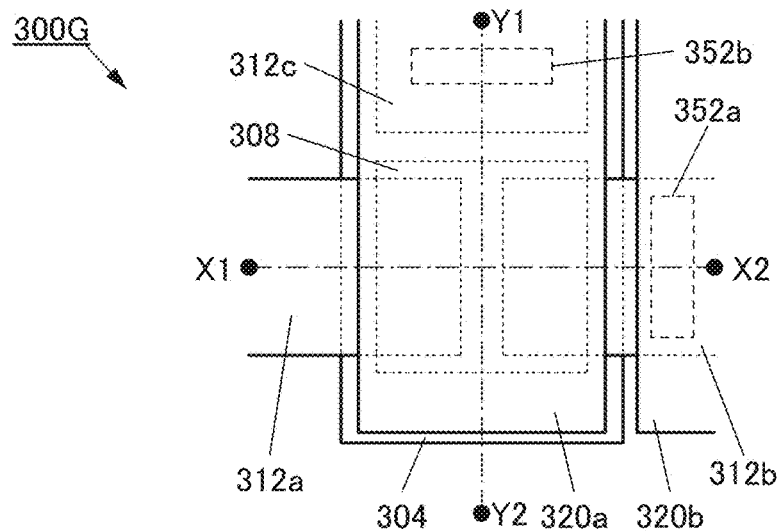
FIGS. 37A to 37C are a top view and cross-sectional views illustrating a semiconductor device.
Figure 37B:
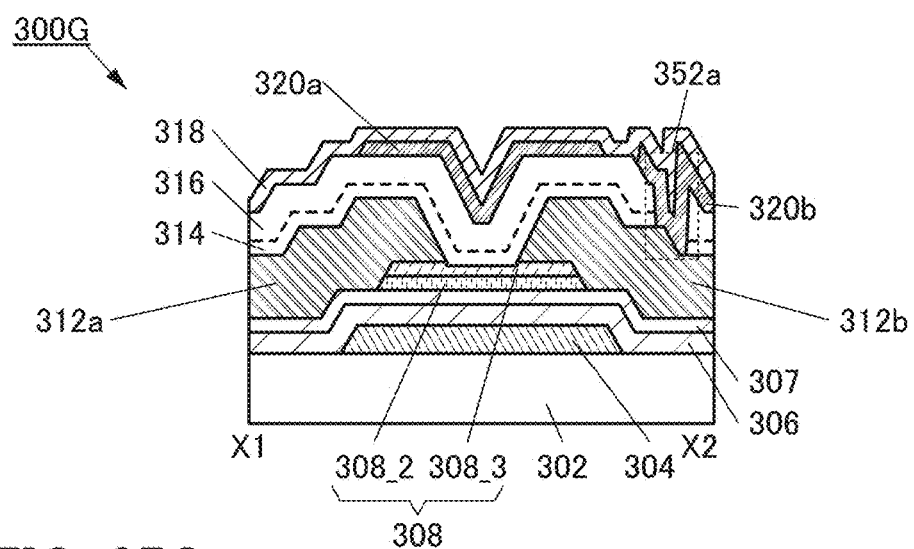
Figure 37C:
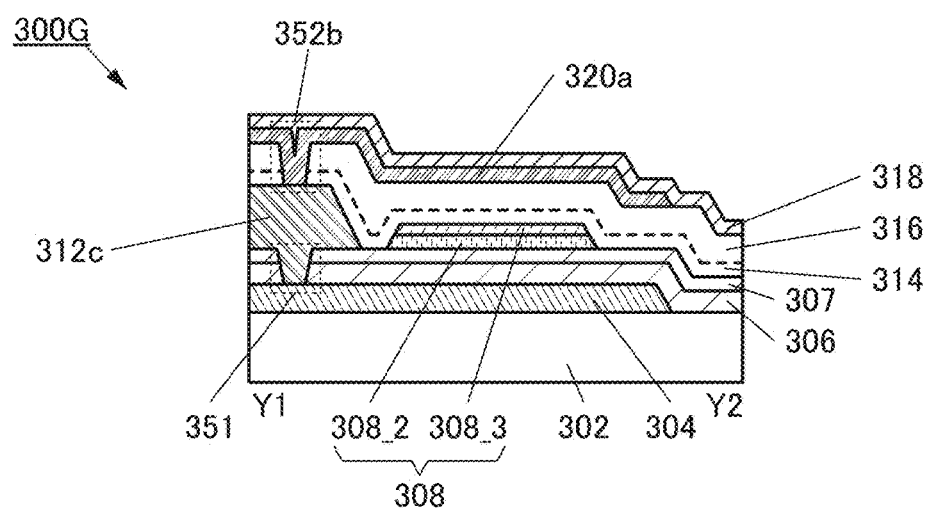

FIG. 37A is a top view of a transistor 300G. FIG. 37B is a cross-sectional view taken along dashed-dotted line X1-X2 in FIG. 37A. FIG. 37C is a cross-sectional view taken along dashed-dotted line Y1-Y2 in FIG. 37A.

The transistor 300G illustrated in FIGS. 37A to 37C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the conductive film 320a over the insulating film 316, and the conductive film 320b over the insulating film 316.

The insulating films 306 and 307 have an opening 351. A conductive film 312c, which is electrically connected to the conductive film 304 through the opening 351, is formed over the insulating films 306 and 307. The insulating films 314 and 316 have an opening 352a that reaches the conductive film 312b and an opening 352b that reaches the conductive film 312c.

The oxide semiconductor film 308 includes the oxide semiconductor film 3082 on the conductive film 304 side and the oxide semiconductor film 3083 over the oxide semiconductor film 308_2.

The insulating film 318 is provided over the transistor 300G. The insulating film 318 is formed to cover the insulating film 316, the conductive film 320a, and the conductive film 320b.

In the transistor 300G, the insulating films 306 and 307 each function as a first gate insulating film of the transistor 300G, and the insulating films 314 and 316 each function as a second gate insulating film of the transistor 300G, and the insulating film 318 functions as a protective insulating film of the transistor 300G. Furthermore, in the transistor 300G, the conductive film 304 functions as a first gate electrode, the conductive film 320a functions as a second gate electrode, and the conductive film 320b functions as a pixel electrode used for a display device. Moreover, in the transistor 300G, the conductive film 312a functions as a source electrode, the conductive film 312b functions as a drain electrode, and the conductive film 312c functions as a connection electrode.

Note that the transistor 300G has the S-channel structure described above.

The structures of the transistors 300A to 300G can be freely combined with each other.

At least part of this embodiment can be implemented in combination with any of the other embodiments described in this specification as appropriate.

Embodiment 6

In this embodiment, the flexible device of one embodiment of the present invention will be described with reference to drawings. Described in this embodiment is an example of a display device.

There is no limitation on a display element included in the display device of one embodiment of the present invention. Any of a variety of elements, such as a liquid crystal element, an optical element that utilizes micro electro mechanical systems (MEMS), an EL element, a light-emitting element such as an LED, and an electrophoretic element, can be used as the display element.

The thickness of the display device of one embodiment of the present invention can be, for example, greater than or equal to 30 μm and less than or equal to 300 μm and is preferably greater than or equal to 50 μm and less than or equal to 200 μm, further preferably greater than or equal to 50 μm and less than or equal to 150 μm, and still further preferably greater than or equal to 50 μm and less than or equal to 100 μm. To increase the mechanical strength of the display device, the thickness of the display device is preferably greater than or equal to 50 μm. To increase the flexibility of the display device, the thickness of the display device is preferably less than or equal to 200 μm and further preferably less than or equal to 100 μm. A display device with a thickness of less than or equal to 100 μm, for example, can be bent with a radius of curvature of 1 mm, or can be repeatedly bent (e.g., more than 100000 times) with a radius of curvature of 5 mm.

Structure Example 1

FIG. 38 is a schematic perspective view of a display device 400A of one embodiment of the present invention. In the display device 400A, a substrate 471 and a substrate 472 are bonded to each other. In FIG. 38, the substrate 472 is shown by a dashed line.

The display device 400A includes a display portion 481 and a driver circuit portion 482. A flexible printed circuit (FPC) 473 and an IC 474 are mounted on the display device 400A.

The display portion 481 includes a plurality of pixels and has a function of displaying images.

Each of the pixels includes a plurality of subpixels. For example, a subpixel exhibiting red, a subpixel exhibiting green, and a subpixel exhibiting blue can form one pixel, leading to full-color display in the display portion 481. Note that the colors exhibited by subpixels are not limited to red, green, and blue. For example, a subpixel exhibiting white, yellow, magenta, cyan, or the like may be included in a pixel. In this specification and the like, in some cases, a subpixel is referred to as a pixel.

The display device 400A may include either, both, or neither of a scan line driver circuit and a signal line driver circuit. In the case where the display device 400A includes a sensor such as a touch sensor, the display device 400A may include a sensor driver circuit. In an example described in this embodiment, a scan line driver circuit is included as the driver circuit portion 482. The scan line driver circuit has a function of outputting a scan signal to a scan line included in the display portion 481.

In the display device 400A, the IC 474 is mounted on the substrate 471 by a chip on glass (COG) method or the like. The IC 474 includes, for example, any one or more of a signal line driver circuit, a scan line driver circuit, and a sensor driver circuit.

The FPC 473 is electrically connected to the display device 400A. Through the FPC 473, a signal and power from the outside are supplied to the IC 474 and the driver circuit portion 482. In addition, a signal from the IC 474 can be output to the outside through the FPC 473.

An IC may be mounted on the FPC 473 by a chip on film (COF) method or the like. For example, an IC including any one or more of a signal line driver circuit, a scan line driver circuit, and a sensor driver circuit may be mounted on the FPC 473.

A signal and power are supplied to the display portion 481 and the driver circuit portion 482 through a wiring 407. The signal and power are input to the wiring 407 from the IC 474 or from the outside through the FPC 473.

FIG. 39A is a cross-sectional view of the display device 400A, illustrating the display portion 481, the driver circuit portion 482, and the wiring 407. The display device 400A is a top-emission display device using a color filter method.

The display device 400A includes the substrate 471, an insulating layer 478, a plurality of transistors, a capacitor 405, the wiring 407, an insulating layer 412, an insulating layer 413, an insulating layer 414, an insulating layer 415, a light-emitting element 404, a conductive layer 455, a spacer 416, an adhesive layer 417, a coloring layer 425, a light-blocking layer 426, an insulating layer 476, and the substrate 472.

The driver circuit portion 482 includes a transistor 401. The display portion 481 includes a transistor 402 and a transistor 403.

Each of the transistors includes a gate, an insulating layer 411, a semiconductor layer, a source, and a drain. The gate and the semiconductor layer overlap with each other with the insulating layer 411 provided therebetween. Part of the insulating layer 411 functions as a gate insulating layer, and another part of the insulating layer 411 functions as a dielectric of the capacitor 405. A conductive layer that functions as the source or the drain of the transistor 402 also functions as one electrode of the capacitor 405.

The transistors illustrated in FIG. 39A have bottom-gate structures. The transistors in the driver circuit portion 482 and the transistors in the display portion 481 may have different structures. The driver circuit portion 482 and the display portion 481 may each include a plurality of kinds of transistors.

The capacitor 405 includes a pair of electrodes and the dielectric therebetween. The capacitor 405 includes a conductive layer that is formed using the same material and the same step as the gates of the transistors, and a conductive layer that is formed using the same material and the same step as the sources and the drains of the transistors.

The insulating layer 412, the insulating layer 413, and the insulating layer 414 are each provided to cover the transistors and the like. There is no particular limitation on the number of the insulating layers covering the transistors and the like. The insulating layer 414 functions as a planarization layer. It is preferable that at least one of the insulating layer 412, the insulating layer 413, and the insulating layer 414 be formed using a material inhibiting diffusion of impurities such as water and hydrogen. Diffusion of impurities from the outside into the transistors can be effectively inhibited, leading to improved reliability of the display device.

In FIG. 39A, the insulating layer 414 is provided all over the display device. The structure illustrated in FIG. 39A is preferable because the yield of the fabrication process of a flexible device of one embodiment of the present invention can be increased.

In the case of using an organic material for the insulating layer 414, impurities such as moisture might enter the light-emitting element 404 or the like from the outside of the display device through the insulating layer 414 exposed at an end portion of the display device. Deterioration of the light-emitting element 404 due to the entry of impurities can lead to deterioration of the display device. For this reason, the insulating layer 414 is preferably not positioned at the end portion of the display device, as illustrated in FIG. 39B. Since an insulating layer formed using an organic material is not positioned at the end portion of the display device in the structure of FIG. 39B, entry of impurities into the light-emitting element 404 can be inhibited.

As in a display device 400C in FIG. 41A described later, an opening that reaches an inorganic film (the insulating layer 413 in the case of FIG. 41A) is preferably provided in the insulating layer 414 and the insulating layer 415. In the structure illustrated in FIG. 41A, even when impurities such as moisture enters from the outside of the display device, the impurities do not easily reach the light-emitting element 404.

The light-emitting element 404 includes an electrode 421, an EL layer 422, and an electrode 423. The light-emitting element 404 may include an optical adjustment layer 424. The light-emitting element 404 has a top-emission structure with which light is emitted to the coloring layer 425 side.

The transistors, the capacitor, the wiring, and the like are positioned so as to overlap with a light-emitting region of the light-emitting element 404; accordingly, the aperture ratio of the display portion 481 can be increased.

One of the electrode 421 and the electrode 423 functions as an anode and the other functions as a cathode. When a voltage higher than the threshold voltage of the light-emitting element 404 is applied between the electrode 421 and the electrode 423, holes are injected to the EL layer 422 from the anode side and electrons are injected to the EL layer 422 from the cathode side. The injected electrons and holes are recombined in the EL layer 422 and a light-emitting substance contained in the EL layer 422 emits light.

The electrode 421 is electrically connected to the source or the drain of the transistor 403 directly or through a conductive layer. The electrode 421 functioning as a pixel electrode is provided for each light-emitting element 404. Two adjacent electrodes 421 are electrically insulated from each other by the insulating layer 415.

The EL layer 422 contains a light-emitting substance.

The electrode 423 functioning as a common electrode is shared by a plurality of light-emitting elements 404. A fixed potential is supplied to the electrode 423.

The light-emitting element 404 overlaps with the coloring layer 425 with the adhesive layer 417 provided therebetween. The spacer 416 overlaps with the light-blocking layer 426 with the adhesive layer 417 provided therebetween. Although FIG. 39A illustrates the case where a space is provided between the electrode 423 and the light-blocking layer 426, the electrode 423 and the light-blocking layer 426 may be in contact with each other. Although the spacer 416 is provided on the substrate 471 side in the structure illustrated in FIG. 39A, the spacer 416 may be provided on the substrate 472 side (e.g., in a position closer to the substrate 471 than that of the light-blocking layer 426).

Owing to the combination of a color filter (the coloring layer 425) and a microcavity structure (the optical adjustment layer 424), light with high color purity can be extracted from the display device. The thickness of the optical adjustment layer 424 is varied depending on the color of the pixel.

The coloring layer 425 is a coloring layer that transmits light in a specific wavelength range. For example, a color filter for transmitting light in a red, green, blue, or yellow wavelength range can be used.

Note that one embodiment of the present invention is not limited to a color filter method, and a separate coloring method, a color conversion method, a quantum dot method, and the like may be employed.

The light-blocking layer 426 is provided between the adjacent coloring layers 425. The light-blocking layer 426 blocks light emitted from an adjacent light-emitting element 404 to inhibit color mixture between adjacent light-emitting elements 404. Here, the coloring layer 425 is provided such that its end portion overlaps with the light-blocking layer 426, whereby light leakage can be reduced. For the light-blocking layer 426, a material that blocks light emitted from the light-emitting element can be used. Note that it is preferable to provide the light-blocking layer 426 in a region other than the display portion 481, such as a driver circuit portion 482, in which case undesired leakage of guided light or the like can be inhibited.

As illustrated in FIG. 39B, the display device of one embodiment of the present invention may include an overcoat 436 that covers the coloring layer 425 and the light-blocking layer 426. The overcoat 436 can prevent impurities and the like contained in the coloring layer 425 from being diffused into the light-emitting element. The overcoat 436 is formed with a material that transmits light emitted from the light-emitting element; for example, an inorganic insulating film such as a silicon nitride film or a silicon oxide film, or an organic insulating film such as an acrylic film or a polyimide film can be used, and further, a stacked-layer structure of an organic insulating film and an inorganic insulating film may be employed.

In the case where a material of the adhesive layer 417 is applied to the coloring layer 425 and the light-blocking layer 426, a material with high wettability with respect to the material of the adhesive layer 417 is preferably used as a material of the overcoat 436. For example, an oxide conductive film such as an ITO film or a metal film such as an Ag film which is thin enough to transmit light is preferably used as the overcoat 436.

When the overcoat 436 is formed using a material that has high wettability with respect to the material for the adhesive layer 417, the material for the adhesive layer 417 can be uniformly applied. Thus, entry of bubbles in the step of bonding the pair of substrates to each other can be prevented, and thus defective display can be inhibited.

The insulating layer 478 is formed on a surface of the substrate 471. The insulating layer 476 is formed on a surface of the substrate 472. The insulating layer 476 and the insulating layer 478 are preferably highly resistant to moisture. The light-emitting element 404, the transistors, and the like are preferably provided between a pair of insulating layers which are highly resistant to moisture, in which case impurities such as water can be prevented from entering these elements, leading an increase in the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

A connection portion 406 includes the wiring 407 and the conductive layer 455. The wiring 407 is electrically connected to the conductive layer 455. The wiring 407 can be formed using the same material and the same step as those of the sources and the drains of the transistors. The conductive layer 455 is electrically connected to an external input terminal through which a signal and a potential from the outside is transmitted to the driver circuit portion 482. Here, an example in which the FPC 473 is provided as the external input terminal is described. The FPC 473 is electrically connected to the conductive layer 455 through a connection layer 419.

Structure Example 2

Figure 40A:
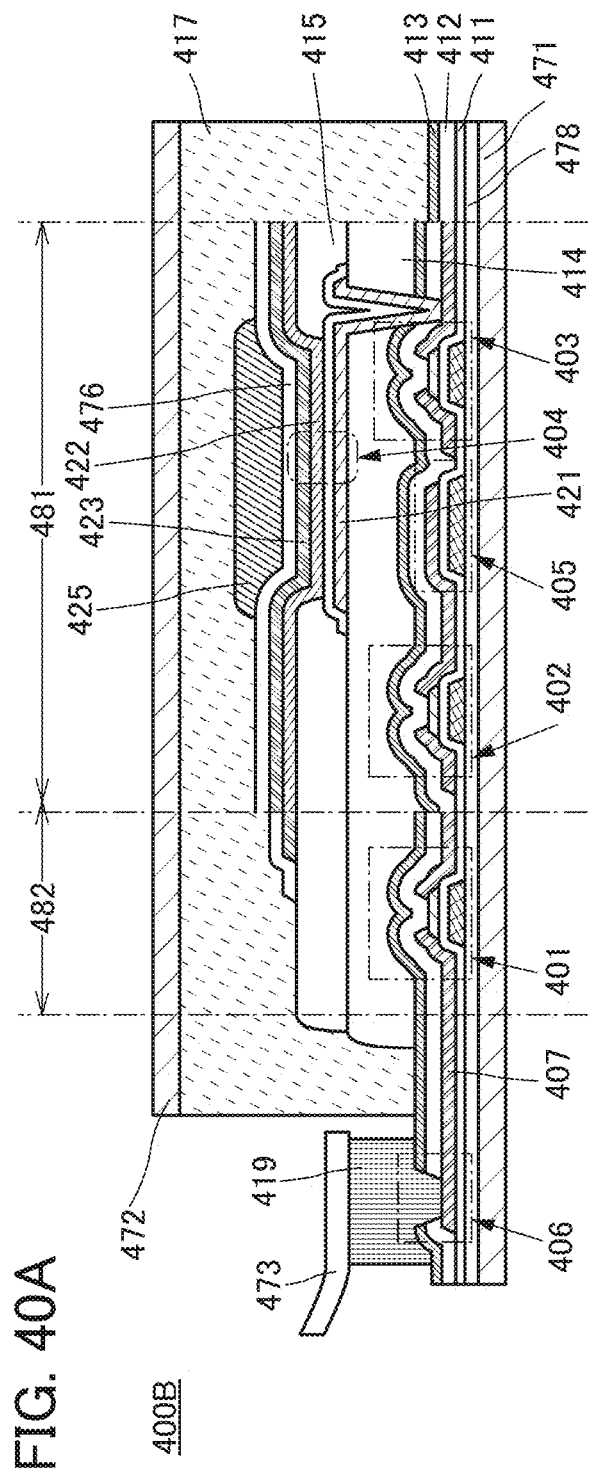
FIGS. 40A and 40B are cross-sectional views each illustrating a display device.

FIG. 40A is a cross-sectional view of a display device 400B. The display device 400B is a top-emission display device using a color filter method. Note that the perspective view of the display device 400B is similar to that of the display device 400A illustrated in FIG. 38. In structure examples described below, components similar to those in the above structure examples are not described in detail.

The display device 400B illustrated in FIG. 40A includes the substrate 471, the insulating layer 478, a plurality of transistors, the capacitor 405, the wiring 407, the insulating layer 412, the insulating layer 413, the insulating layer 414, the insulating layer 415, the light-emitting element 404, the insulating layer 476, the coloring layer 425, the adhesive layer 417, and the substrate 472.

The driver circuit portion 482 includes the transistor 401. The display portion 481 includes the transistor 402 and the transistor 403.

The light-emitting element 404 emits light to the coloring layer 425 side. The light-emitting element 404 overlaps with the coloring layer 425 with the insulating layer 476 provided therebetween. FIG. 40A illustrates an example in which a light-blocking layer and a spacer are not provided.

In the display device 400B, the insulating layer 476 is in contact with the light-emitting element 404. The insulating layer 476 covers an end portion of the electrode 423. The insulating layer 476 functions as a sealing layer for the light-emitting element 404. The coloring layer 425 is over the insulating layer 476. Since the insulating layer 476, the coloring layer 425, and the like do not need to be provided on the substrate 472, the selection range of the material of the substrate 472 can be widened.

Figure 40B:
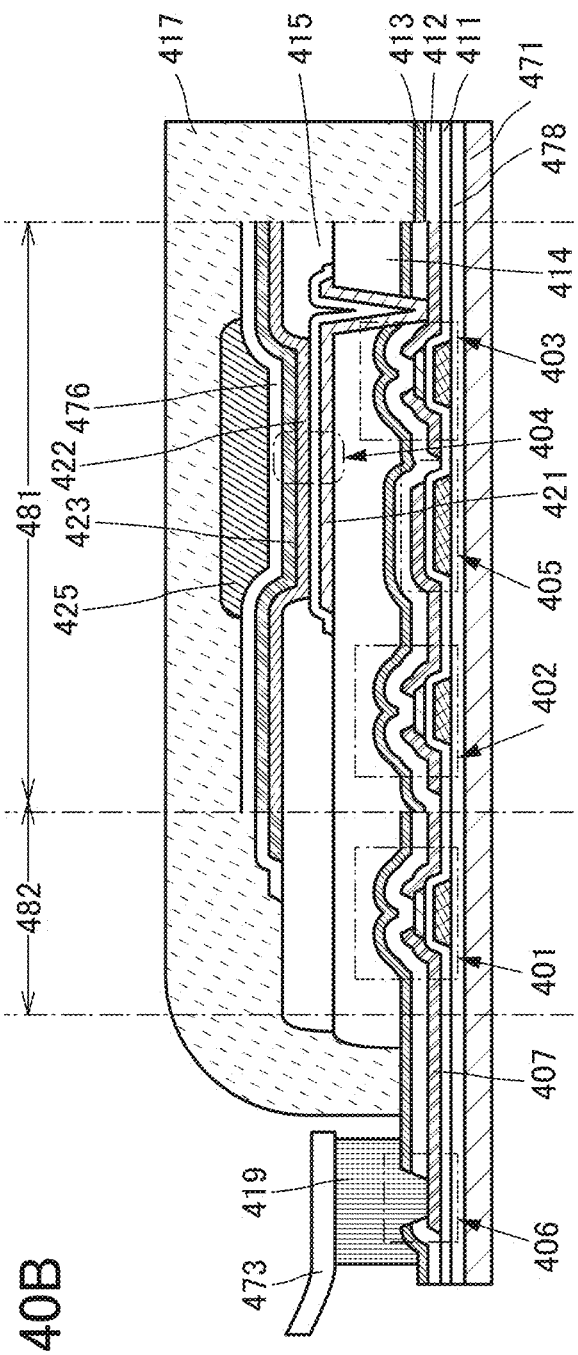

The display device of one embodiment of the present invention does not necessarily include the substrate 472. FIG. 40B illustrates an example where the light-emitting element 404 is sealed by the insulating layer 476 and the coloring layer 425 is sealed by the adhesive layer 417.

The connection portion 406 includes the wiring 407. The wiring 407 is electrically connected to the FPC 473 through the connection layer 419.

Structure Example 3

FIG. 41A is a cross-sectional view of a display device 400C. The display device 400C is a bottom-emission display device using a color filter method. Note that the perspective view of the display device 400C is similar to that of the display device 400A illustrated in FIG. 38.

The display device 400C illustrated in FIG. 41A includes the substrate 471, the insulating layer 478, a plurality of transistors, the wiring 407, the insulating layer 412, the insulating layer 413, the insulating layer 414, the insulating layer 415, the light-emitting element 404, the insulating layer 476, the coloring layer 425, the adhesive layer 417, and the substrate 472.

The driver circuit portion 482 includes the transistor 401. The display portion 481 includes the transistor 403.

Each transistor includes two gates, the insulating layer 411, a semiconductor layer, a source, and a drain. The two gates each overlap with the semiconductor layer with the insulating layer provided therebetween. FIG. 41A illustrates an example where each transistor has a structure in which the semiconductor layer is sandwiched between the two gates. Such transistors can have higher field-effect mobility and thus have higher on-state current than other transistors. Consequently, a circuit capable of high-speed operation can be obtained. Furthermore, the area occupied by a circuit can be reduced. The use of a transistor having high on-state current can reduce signal delay in wirings and can reduce display luminance variation even in a display device in which the number of wirings is increased because of an increase in size or resolution. FIG. 41A illustrates an example in which one of the gates is formed using the same material and the same step as the electrode 421.

The light-emitting element 404 emits light to the coloring layer 425 side. The light-emitting element 404 overlaps with the coloring layer 425 with the insulating layer 414 provided therebetween. The coloring layer 425 is provided between the light-emitting element 404 and the substrate 471. FIG. 41A illustrates an example in which the coloring layer 425 is provided over the insulating layer 413.

In the display device 400C, the insulating layer 476 is in contact with the light-emitting element 404. The insulating layer 476 covers an end portion of the electrode 423. The insulating layer 476 functions as a sealing layer for the light-emitting element 404.

Structure Example 4

FIG. 41B is a cross-sectional view of a display device 400D. The display device 400D is a top-emission display device employing a separate coloring method. Note that the perspective view of the display device 400D is similar to that of the display device 400A illustrated in FIG. 38.

The display device 400D illustrated in FIG. 41B includes the substrate 471, the insulating layer 478, a plurality of transistors, the capacitor 405, the wiring 407, the insulating layer 412, the insulating layer 413, the insulating layer 414, the insulating layer 415, the light-emitting element 404, the insulating layer 476, the adhesive layer 417, and the substrate 472.

The driver circuit portion 482 includes the transistor 401. The display portion 481 includes the transistor 402, the transistor 403, and the capacitor 405.

Each transistor includes two gates, the insulating layer 411, a semiconductor layer, a source, and a drain. The two gates each overlap with the semiconductor layer with the insulating layer provided therebetween. FIG. 41B illustrates an example where each transistor has a structure in which the semiconductor layer is sandwiched between the two gates. In the example illustrated in FIG. 41B, one of the gates is formed between the insulating layer 413 and the insulating layer 414.

The light-emitting element 404 emits light to the substrate 472 side. In the example illustrated in FIG. 41B, the light-emitting element 404 does not include an optical adjustment layer. The insulating layer 476 functions as a sealing layer for the light-emitting element 404. The insulating layer 476 covers an end portion of the electrode 423, an end portion of the insulating layer 414, and an end portion of the insulating layer 415. When an inorganic insulating film covers the light-emitting element 404 and an organic insulating film, the reliability of the display device can be increased.

The connection portion 406 includes the wiring 407. The wiring 407 is electrically connected to the FPC 473 through the connection layer 419.

Structure Example 5

Figure 42:
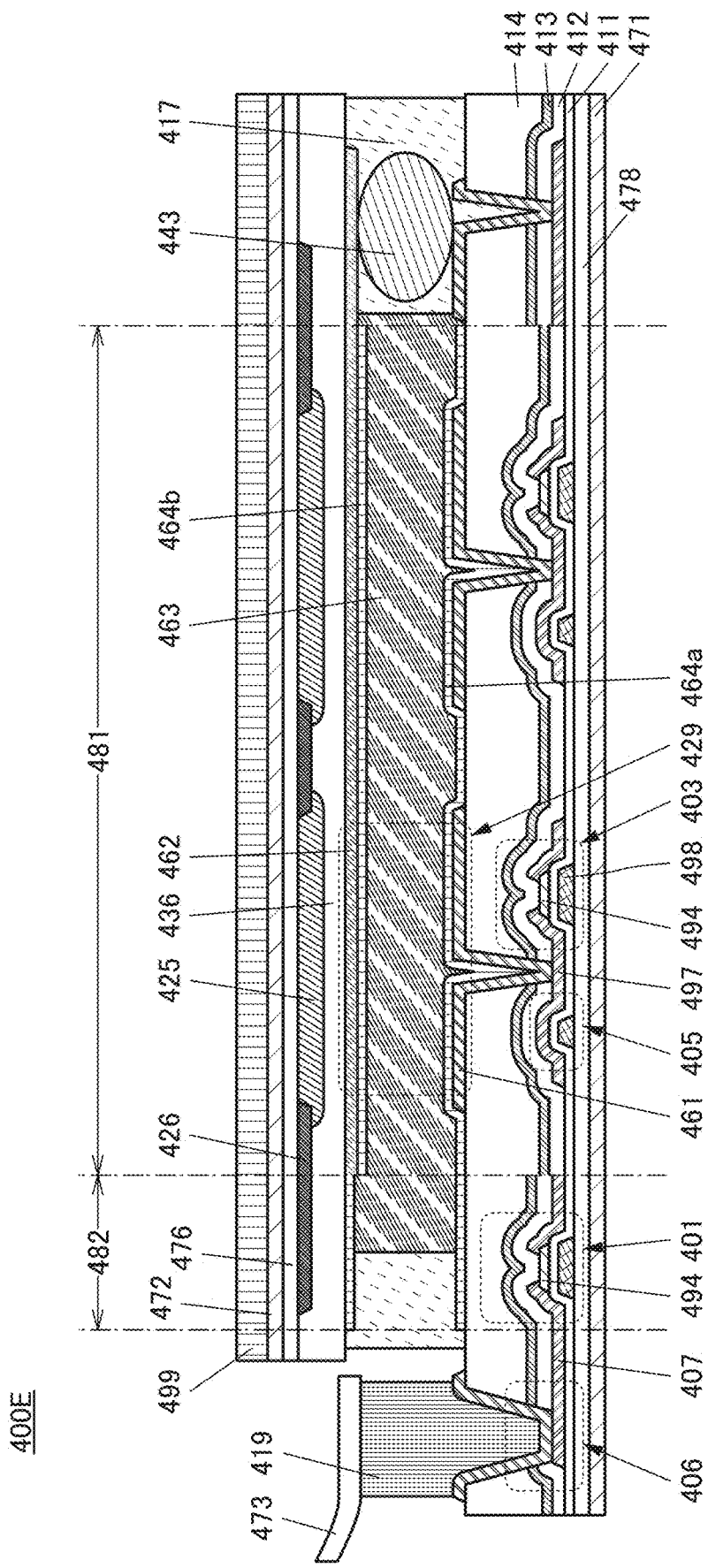
FIG. 42 is a cross-sectional view illustrating a display device.

FIG. 42 is a cross-sectional view of a display device 400E. The display device 400E is a liquid crystal display device employing a vertical electric field mode. Note that the perspective view of the display device 400E is similar to that of the display device 400A illustrated in FIG. 38.

The display device 400E illustrated in FIG. 42 includes the substrate 471, the insulating layer 478, a plurality of transistors, the capacitor 405, the wiring 407, the insulating layer 412, the insulating layer 413, the insulating layer 414, a liquid crystal element 429, an alignment film 464a, an alignment film 464b, the adhesive layer 417, the overcoat 436, the coloring layer 425, the light-blocking layer 426, the insulating layer 476, and the substrate 472.

The substrate 471 and the substrate 472 are bonded to each other by the adhesive layer 417. A liquid crystal 463 is sealed in a region surrounded by the substrate 471, the substrate 472, and the adhesive layer 417. A polarizing plate 499 is positioned on an outer surface of the substrate 472.

The liquid crystal element 429 includes an electrode 461, an electrode 462, and the liquid crystal 463. The electrode 461 functions as a pixel electrode. The electrode 462 functions as a common electrode. Alignment of the liquid crystal 463 can be controlled with an electric field generated between the electrode 461 and the electrode 462. The alignment film 464a is provided between the liquid crystal 463 and the electrode 461. The alignment film 464b is provided between the liquid crystal 463 and the electrode 462.

The substrate 472 is provided with the coloring layer 425, the light-blocking layer 426, the insulating layer 476, the overcoat 436, the electrode 462, the alignment film 464b, and the like.

The substrate 471 is provided with the electrode 461, the alignment film 464a, the transistor 401, the transistor 403, the capacitor 405, the connection portion 406, the wiring 407, and the like.

Insulating layers such as the insulating layer 411, the insulating layer 412, the insulating layer 413, and the insulating layer 414 are provided over the substrate 471. Part of the insulating layer 411 functions as a gate insulating layer of each transistor, and another part thereof functions as a dielectric of the capacitor 405. The insulating layer 412, the insulating layer 413, and the insulating layer 414 are provided to cover each transistor, the capacitor 405, and the like. The insulating layer 414 functions as a planarization layer. Note that an example where the three insulating layers, the insulating layers 412, 413, and 414, are provided to cover the transistors and the like is described here; however, the present invention is not limited to this example, and four or more insulating layers, a single insulating layer, or two insulating layers may be provided. The insulating layer 414 functioning as a planarization layer is not necessarily provided when not needed.

The transistors 401 and 403 each include a conductive layer 498 part of which functions as a gate, a conductive layer 497 part of which functions as a source or a drain, and a semiconductor layer 494. Here, a plurality of layers obtained by processing the same conductive film are shown with the same hatching pattern.

Note that the conductive layer part of which functions as the source or the drain of the transistor 401, whichever is not electrically connected to the electrode 461, may function as part of a signal line. The conductive layer 498 functioning as the gate of the transistor 401 may function as part of a scan line.

FIG. 42 illustrates, as an example, a cross section of two pixels (subpixels) in the display portion 481. One subpixel includes, for example, the transistor 403, the capacitor 405, the liquid crystal element 429, and the coloring layer 425.

For example, the coloring layers 425 are selectively formed so that a subpixel exhibiting red, a subpixel exhibiting green, and a subpixel exhibiting blue are arranged; thus, full-color display can be achieved.

FIG. 42 illustrates an example of the driver circuit portion 482 in which the transistor 401 is provided.

A material through which impurities such as water and hydrogen do not easily diffuse is preferably used for at least one of the insulating layers 412 and 413 which cover the transistors. That is, the insulating layer 412 or the insulating layer 413 can function as a barrier film. Such a structure can effectively suppress diffusion of the impurities into the transistors from the outside, and a highly reliable display device can be provided.

The electrode 461 is provided over the insulating layer 414. The electrode 461 is electrically connected to one of a source and a drain of the transistor 403 through an opening formed in the insulating layer 414, the insulating layer 413, the insulating layer 412, and the like. The electrode 461 is electrically connected to one electrode of the capacitor 405.

The overcoat 436 is provided on the substrate 472 side so as to cover the coloring layer 425 and the light-blocking layer 426. The overcoat 436 may function as a planarization layer. The overcoat 436 enables the electrode 462 to have an almost flat surface, resulting in a uniform alignment state of the liquid crystal 463.

In the case where the display device 400E is a transmissive liquid crystal display device, a conductive material that transmits visible light is used for both the electrode 461 and the electrode 462. In the case where the display device 400E is a reflective liquid crystal display device, a conductive material that reflects visible light is used for the electrode 461 and a conductive material that transmits visible light is used for the electrode 462.

For example, a material containing one or more of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well.

Examples of the conductive material that reflects visible light include aluminum, silver, and an alloy including any of these metal elements. A metal material such as aluminum, gold, platinum, silver, nickel, tungsten, chromium, molybdenum, iron, cobalt, copper, or palladium, or an alloy including any of these metal materials can also be used. The metal material or the alloy may contain lanthanum, neodymium, germanium, or the like. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

As the polarizing plate 499, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element 429 are controlled depending on the kind of the polarizing plate 499 so that desirable contrast is obtained.

The electrode 462 is electrically connected to a conductive layer on the substrate 471 side through a connector 443 in a portion close to an end portion of the substrate 472. Thus, a potential or a signal supplied from an FPC, an IC, or the like placed on the substrate 471 side to the electrode 462.

As the connector 443, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 443, a material capable of elastic deformation or plastic deformation is preferably used. As illustrated in FIG. 42, the connector 443, which is the conductive particle, has a shape that is vertically crushed in some cases. With the crushed shape, the contact area between the connector 443 and a conductive layer electrically connected to the connector 443 can be increased, thereby reducing contact resistance and suppressing the generation of problems such as disconnection.

The connector 443 is preferably provided so as to be covered with the adhesive layer 417. For example, the connectors 443 are dispersed in the adhesive layer 417 before curing of the adhesive layer 417.

The connection portion 406 is provided in a region near an end portion of the substrate 471. The connection portion 406 is electrically connected to the FPC 473 through the connection layer 419. In the example of the structure illustrated in FIG. 42, the connection portion 406 is formed by stacking part of the wiring 407 and a conductive layer that is obtained by processing the same conductive film as the electrode 461.

Structure Example 6

Figure 43:
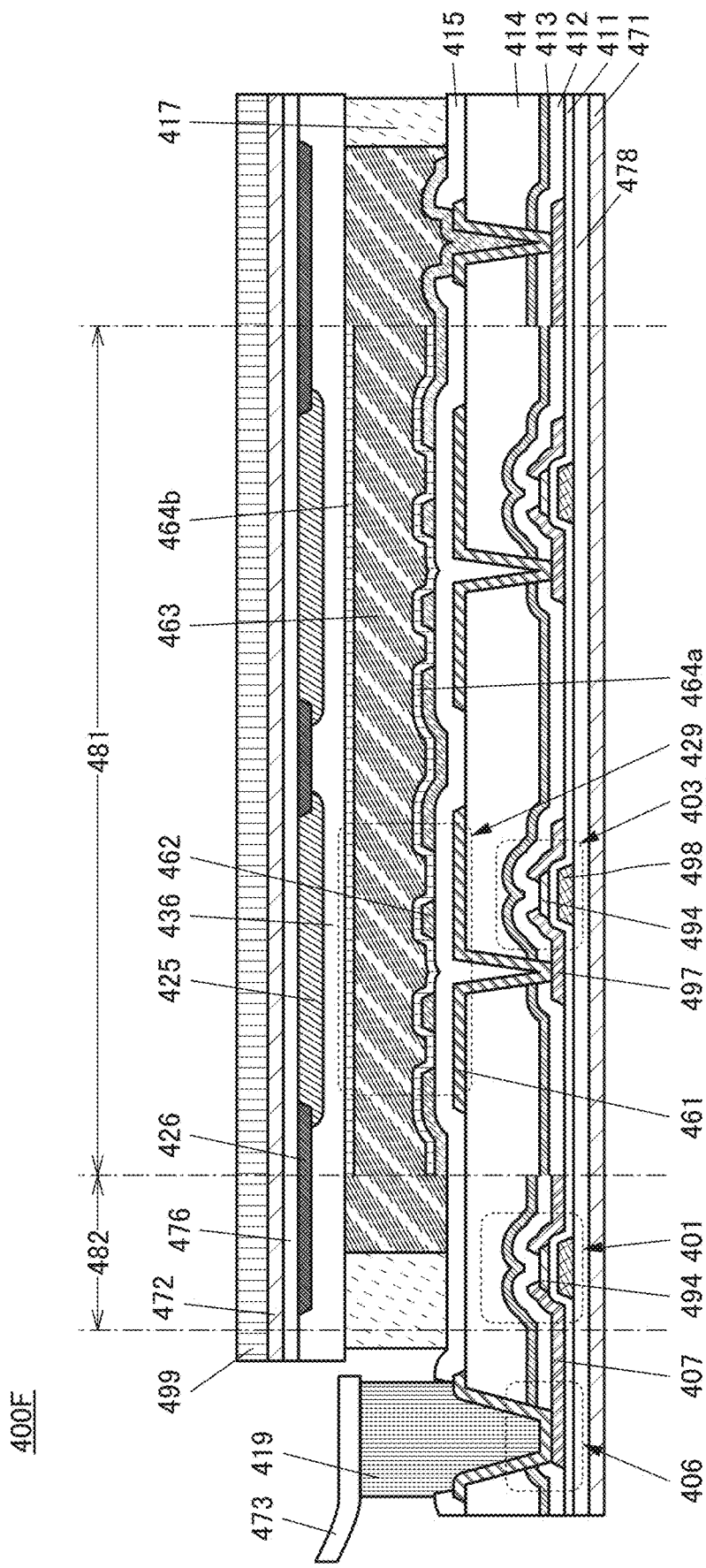
FIG. 43 is a cross-sectional view illustrating a display device.

FIG. 43 is a cross-sectional view of a display device 400F. The display device 400F is a liquid crystal display device employing a horizontal electric field mode. Note that the perspective view of the display device 400F is similar to that of the display device 400A illustrated in FIG. 38.

The display device 400F illustrated in FIG. 43 includes the substrate 471, the insulating layer 478, a plurality of transistors, the wiring 407, the insulating layer 412, the insulating layer 413, the insulating layer 414, the insulating layer 415, the liquid crystal element 429, the alignment film 464a, the alignment film 464b, the adhesive layer 417, the overcoat 436, the coloring layer 425, the light-blocking layer 426, the insulating layer 476, and the substrate 472.

FIG. 43 illustrates an example where a liquid crystal element employing a fringe field switching (FFS) mode is used. The liquid crystal element 429 includes the electrode 461 and the electrode 462 formed on the substrate 471 side.

The insulating layer 415 is provided so as to cover the electrode 461 and the insulating layer 414, and the electrode 462 is provided over the insulating layer 415.

The electrode 462 has a comb-like top surface shape or a top surface shape with a slit. The electrode 462 is provided to overlap with the electrode 461. There is a portion where the electrode 462 is not provided over the electrode 461, in a region overlapping with the coloring layer 425.

FIG. 43 illustrates an example where the electrode 462 having a comb-like top surface shape or a top surface shape with a slit is provided over the insulating layer 415 and the electrode 461 is provided under the insulating layer 415. The electrode 461 may be provided over the insulating layer 415 and the electrode 462 may be provided under the insulating layer 415. In that case, the electrode 461 over the insulating layer 415 may have a comb-like top surface shape or a top surface shape with a slit. In addition, the electrode 461 may be electrically connected to one of a source and a drain of the transistor 403 through an opening provided in the insulating layer 415, the insulating layer 414, and the like.

As illustrated in FIG. 43, the electrode 461 and the electrode 462 are stacked with the insulating layer 415 positioned therebetween to form a capacitor. Thus, the capacitor 405 illustrated in FIG. 42 is not necessary.

[Components]

The above components will be described below. Note that some of the components already described in the above embodiments and the like are not described here. The materials described below can also be used as appropriate for a display device (including a touch panel) and the like described in the following embodiments.

<Substrate>

A flexible substrate can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display device can be reduced by using a thin substrate. A flexible display device can be obtained by using a substrate that is thin enough to have flexibility.

Since the substrate through which light is not extracted does not need to have a light-transmitting property, a metal substrate or the like can be used in addition to the above-mentioned substrates.

[Transistor]

The transistor includes a conductive layer serving as a gate, a semiconductor layer, a conductive layer serving as a source, a conductive layer serving as a drain, and an insulating layer serving as a gate insulating layer.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Here, a staggered transistor has a structure in which a gate electrode is located above a semiconductor layer and a source electrode and a drain electrode are located below the semiconductor layer. Meanwhile, an inverted staggered transistor has a structure in which a gate electrode is located below a semiconductor layer and a source electrode and a drain electrode are located above the semiconductor layer. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

As a semiconductor material used for the transistor, for example, an element of Group 14 (e.g., silicon or germanium), a compound semiconductor, or an oxide semiconductor can be used. Typically, a semiconductor containing silicon, a semiconductor containing gallium arsenide, an oxide semiconductor containing indium, or the like can be used. As described in Embodiment 1, an oxide semiconductor having a wider band gap than silicon is preferably used.

For example, the oxide semiconductor preferably contains at least indium (In) or zinc (Zn). The oxide semiconductor more preferably includes an In-M-Zn-based oxide (M is a metal such as Al, Ti, Ga, Ge, Y, Zr, Sn, La, Ce, or Hf).

For the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display device is bent is prevented. Therefore, such an oxide semiconductor can be preferably used for a flexible display device which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current and therefore can hold charges stored in a capacitor that is series-connected to the transistor for a long time. When such a transistor is used for a pixel, operation of a driver circuit can be stopped while a gray scale of an image displayed in each display region is maintained. As a result, a display device with extremely low power consumption can be obtained.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even in the case of a display device with an extremely high definition, a scan line driver circuit and a signal line driver circuit can be formed over a substrate over which pixels are formed, and the number of components of an electronic device can be reduced.

Alternatively, transistors including different semiconductors may be provided. For example, a transistor including polycrystalline silicon and a transistor including an oxide semiconductor may be provided in combination. At this time, polycrystalline silicon is preferably used for a transistor to which large current needs to be supplied, such as a transistor in a driver circuit or a transistor for current control. Furthermore, an oxide semiconductor is preferably used for a transistor which holds electric charge accumulated in a capacitor or the like that is series-connected to the transistor, such as a switching transistor in a pixel.

[Conductive Layer]

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, an FFS mode, an axially symmetric aligned micro-cell (ASM) mode, an optically compensated birefringence (OCB) mode, a ferroelectric liquid crystal (FLC) mode, or an antiferroelectric liquid crystal (AFLC) mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a semi-transmissive liquid crystal element, or the like.

In the case where a transmissive or semi-transmissive liquid crystal element is used, two polarizing plates are provided such that a pair of substrates is sandwiched therebetween. Furthermore, a backlight is provided on the outer side of the polarizing plate. The backlight may be a direct-below backlight or an edge-light backlight. The direct-below backlight including an LED is preferably used because local dimming is easily performed to improve contrast. The edge-light type backlight is preferably used because the thickness of a module including the backlight can be reduced.

In the case where a reflective liquid crystal element is used, a polarizing plate is provided on a display surface. In addition, a light diffusion plate is preferably provided on the display surface to improve visibility.

[Light-Emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, dual emission light-emitting element, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be included. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer provided therebetween.

The conductive film that transmits visible light can be formed using, for example, indium oxide, indium tin oxide, indium zinc oxide, zinc oxide, or zinc oxide containing gallium. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stacked film of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium, or an alloy including any of these metal materials can be used. Lanthanum, neodymium, germanium, or the like may be contained in the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may each be formed by an evaporation method or a sputtering method. Alternatively, a discharge method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC resin, a PVB resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display device.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

At least part of this embodiment can be implemented in combination with any of the other embodiments described in this specification as appropriate.

Embodiment 7

In this embodiment, structure examples of an input device (touch sensor) applicable to the display device of one embodiment of the present invention, an input/output device (touch panel) that is an example of the display device of one embodiment of the present invention, and the like will be described.

Note that in this specification and the like, a display panel as one embodiment of the display device has a function of displaying (outputting) an image or the like on (to) a display surface; hence, the display panel is one embodiment of an output device.

In this specification and the like, a structure in which a connector such as an FPC or a tape carrier package (TCP) is attached to a substrate of a display panel, or a structure in which an IC is mounted on a substrate by a COG method or the like is referred to as a display panel module or a display module, or simply referred to as a display panel or the like in some cases.

In this specification and the like, a touch sensor has a function of sensing contact, press, approach, or the like of an object such as a finger or a stylus. In addition, the touch sensor may have a function of sensing the positional information of the object. Thus, the touch sensor is one embodiment of an input device.

In this specification and the like, a substrate provided with a touch sensor is referred to as a touch sensor panel or simply referred to as a touch sensor or the like in some cases.

Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact, press, approach, or the like of an object such as a finger or a stylus on or to the display surface. Thus, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as a TCP is attached to a substrate of a touch panel, or a structure in which an IC is mounted on a substrate by a COG method or the like is referred to as a touch panel module or a display module, or simply referred to as a touch panel or the like in some cases.

<Structure Example of Touch Sensor>

A structure example of the input device (touch sensor) will be described below with reference to drawings.

Figure 44A:
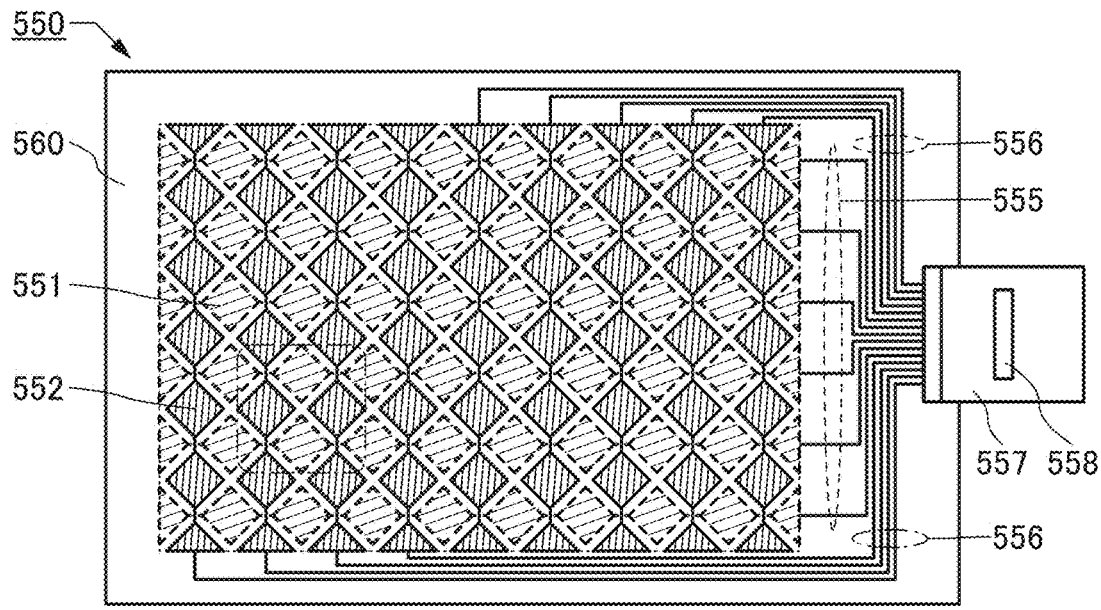
FIGS. 44A to 44D each illustrate an input device.

FIG. 44A is a schematic top view of an input device 550. The input device 550 includes a plurality of conductive layers 551, a plurality of conductive layers 552, a plurality of wirings 555, and a plurality of wirings 556 over a substrate 560. The substrate 560 is provided with an FPC 557 which is electrically connected to each of the plurality of conductive layers 551 and the plurality of conductive layers 552. FIG. 44A illustrates an example in which the FPC 557 is provided with an IC 558.

Figure 44B:
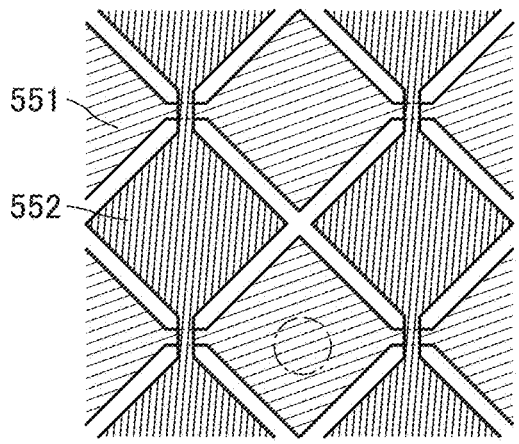

FIG. 44B is an enlarged view of a region surrounded by a dashed dotted line in FIG. 44A. The conductive layers 551 are each in the form of a row of rhombic electrode patterns arranged in a lateral direction. The row of rhombic electrode patterns are electrically connected to each other. The conductive layers 552 are also each in the form of a row of rhombic electrode patterns arranged in a longitudinal direction, and the row of rhombic electrode patterns are electrically connected. Part of the conductive layer 551 and part of the conductive layer 552 overlap and intersect with each other. At this intersection portion, an insulator is sandwiched in order to avoid an electrical short-circuit between the conductive layer 551 and the conductive layer 552.

Figure 44C:
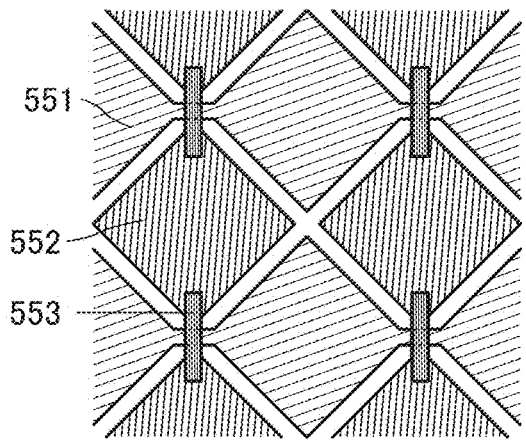

As illustrated in FIG. 44C, a plurality of island-shape rhombic conductive layers 552 may be connected to each other by conductive layers 553. The island-shape rhombic conductive layers 552 are arranged in the longitudinal direction, and two adjacent conductive layers 552 are electrically connected to each other by the conductive layer 553. Such a structure allows the conductive layers 551 and the conductive layers 552 to be formed at the same time by processing the same conductive film. This can prevent variations in the thickness of these conductive layer, and can prevent the resistance value and the light transmittance of each electrode from varying from place to place. Note that although the conductive layers 552 include the conductive layers 553 here, the conductive layers 551 may have such a structure.

Figure 44D:
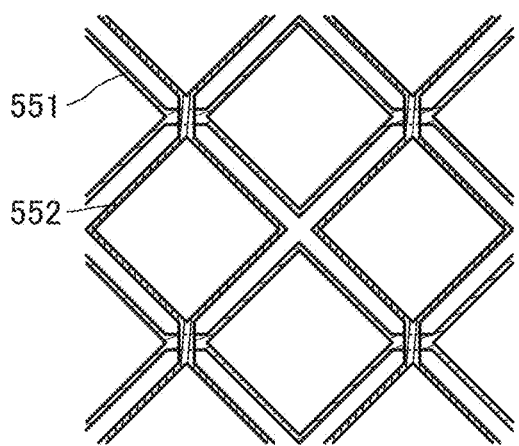

As illustrated in FIG. 44D, a design in which rhombic electrode patterns of the conductive layers 551 and 552 illustrated in FIG. 44B are hollowed out and only edge portions are left may be used. At that time, when the conductive layers 551 and 552 are narrow enough to be invisible to the users, the conductive layers 551 and 552 can be formed using a light-blocking material such as a metal or an alloy, as will be described later. In addition, either the conductive layers 551 or the conductive layers 552 illustrated in FIG. 44D may include the above conductive layers 553.

One of the conductive layers 551 is electrically connected to one of the wirings 555. One of the conductive layers 552 is electrically connected to one of the wirings 556. Here, either one of the conductive layers 551 and 552 corresponds to a row wiring, and the other corresponds to a column wiring.

The IC 558 has a function of driving the touch sensor. A signal output from the IC 558 is supplied to either of the conductive layers 551 and 552 through the wirings 555 or 556. A current (or a potential) flowing to either of the conductive layers 551 and 552 is input to the IC 558 through the wirings 555 or 556.

When a touch panel is formed in such a manner that the input device 550 is stacked over a display screen of the display panel, a light-transmitting conductive material is preferably used for the conductive layers 551 and 552. In the case where a light-transmitting conductive material is used for the conductive layers 551 and 552 and light from the display panel is extracted through the conductive layers 551 and 552, it is preferable that a conductive film containing the same conductive material be arranged between the conductive layers 551 and 552 as a dummy pattern. Part of a space between the conductive layers 551 and 552 is filled with the dummy pattern, which can reduce variation in light transmittance. As a result, unevenness in luminance of light transmitted through the input device 550 can be reduced.

As the light-transmitting conductive material, a conductive oxide such as indium oxide, indium tin oxide, indium zinc oxide, zinc oxide, or zinc oxide containing gallium can be used. Note that a film containing graphene may be used as well.

Alternatively, a metal film or an alloy film which is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride), or the like may be used. Alternatively, a stacked film in which two or more of conductive films containing the above materials are stacked may be used.

For the conductive layers 551 and 552, a conductive film that is processed to be thin enough to be invisible to the users may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 µm, preferably greater than or equal to 50 nm and less than or equal to 50 µm, and further preferably greater than or equal to 50 nm and less than or equal to 20 µm. In particular, the conductive film having the pattern width of 10 µm or less is hardly visible to the users, which is preferable.

Figure 45A:
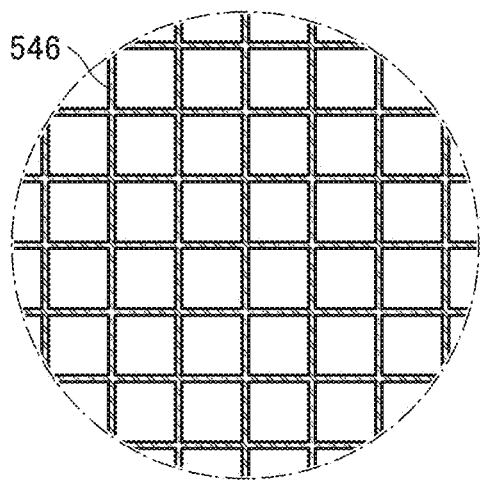
FIGS. 45A to 45D each illustrate an input device.

FIGS. 45A to 45D each illustrate an example of an enlarged schematic diagram of part of the conductive layer 551 or the conductive layer 552 (e.g., a region surrounded by a circle in FIG. 44B). FIG. 45A illustrates an example where a lattice-shape conductive film 546 is used. The conductive film 546 is preferably placed so as not to overlap with the display element included in the display device because light from the display device is not blocked. In that case, it is preferable that the direction of the lattice be the same as the direction of the display element arrangement and that the pitch of the lattice be an integer multiple of the pitch of the display element arrangement.

Figure 45B:
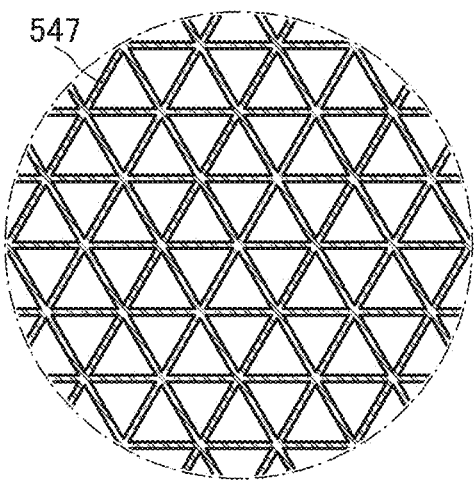

FIG. 45B illustrates an example of a lattice-shape conductive film 547, which is processed so as to be provided with triangle openings. Such a structure makes it possible to further reduce the resistance compared with the structure illustrated in FIG. 45A.

Figure 45C:
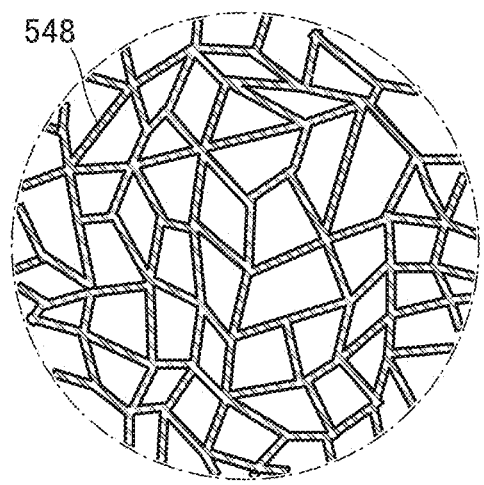

In addition, a conductive film 548, which has an irregular pattern shape, may be used as illustrated in FIG. 45C. Such a structure can prevent generation of moire when overlapping with the display portion of the display device.

Figure 45D:
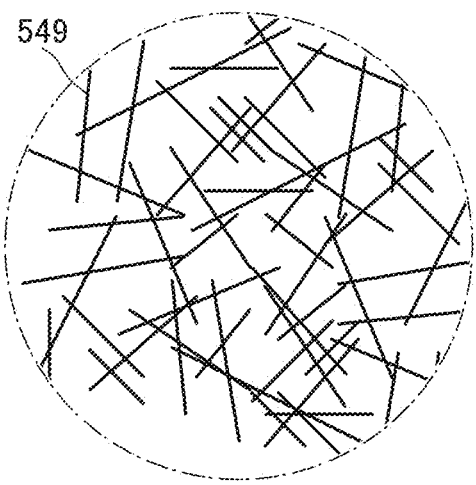

Conductive nanowires may be used for the conductive layers 551 and 552. FIG. 45D illustrates an example where nanowires 549 are used. The nanowires 549 are dispersed at appropriate density so as to be in contact with the adjacent nanowires, which can form a two-dimensional network; therefore, the nanowires 549 can function as a conductive film with extremely high light-transmitting property. For example, nanowires which have a mean diameter of greater than or equal to 1 nm and less than or equal to 100 nm, preferably greater than or equal to 5 nm and less than or equal to 50 nm, and further preferably greater than or equal to 5 nm and less than or equal to 25 nm, can be used. As the nanowire 549, a metal nanowire such as an Ag nanowire, a Cu nanowire, or an Al nanowire, a carbon nanotube, or the like can be used. In the case of using an Ag nanowire, a light transmittance of 89% or more and a sheet resistance of 40 ohms per square or more and 100 ohms per square or less can be achieved.

The above is the description of the structure example of the touch sensor.

Structure Example 1 of Touch Panel

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive touch sensor include a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously.

The touch panel of one embodiment of the present invention can have any of a variety of structures, including a structure in which a display device and a sensor element that are separately formed are bonded to each other and a structure in which an electrode and the like included in a sensor element are provided on one or both of a substrate supporting a display element and a counter substrate.

Figure 46A:
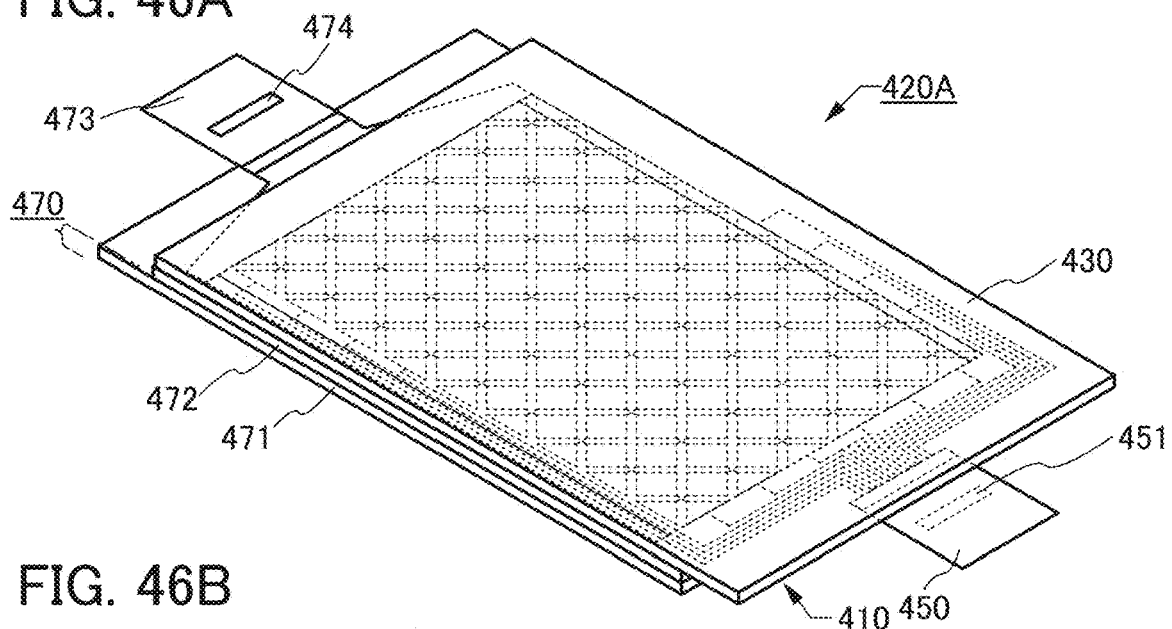
FIGS. 46A and 46B are perspective views illustrating a display device.
Figure 46B:
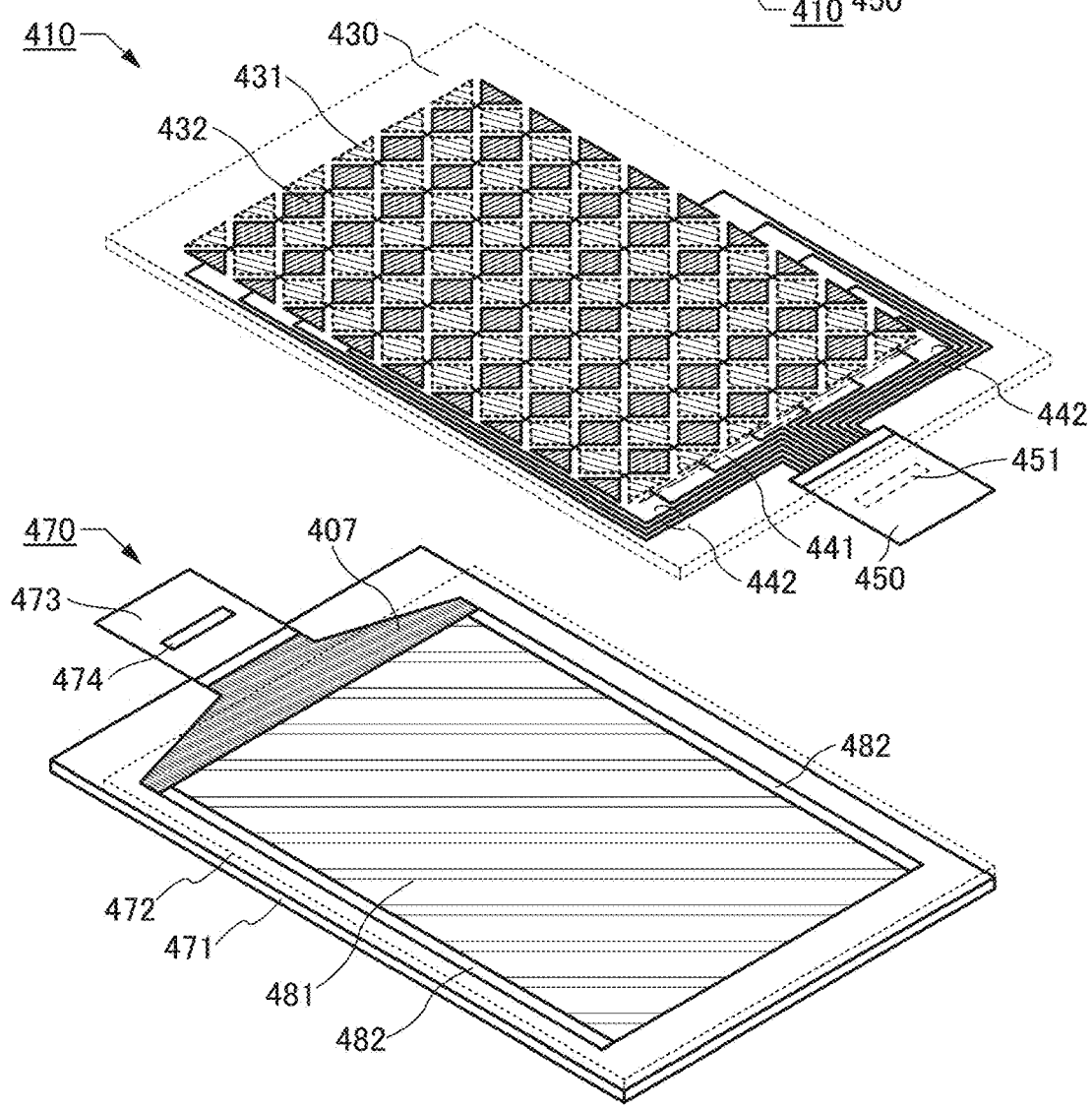

FIG. 46A is a schematic perspective view of a touch panel 420A. FIG. 46B is a developed view of the schematic perspective view of FIG. 46A. Note that only typical components are illustrated for simplicity. In FIG. 46B, some components (such as a substrate 430 and the substrate 472) are illustrated only in dashed outline.

The touch panel 420A includes an input device 410 and a display device 470, which are provided to overlap with each other.

The input device 410 includes the substrate 430, an electrode 431, an electrode 432, a plurality of wirings 441, and a plurality of wirings 442. An FPC 450 is electrically connected to each of the plurality of wirings 441 and the plurality of wirings 442. The FPC 450 is provided with an IC 451.

The display device 470 includes the substrate 471 and the substrate 472 which are provided so as to face each other. The display device 470 includes the display portion 481 and the driver circuit portion 482. The wiring 407 and the like are provided over the flexible substrate 471. The FPC 473 is electrically connected to the wiring 407. The FPC 473 is provided with an IC 474.

The wiring 407 has a function of supplying a signal and power to the display portion 481 and the driver circuit portion 482. The signal and power are each input to the wiring 407 from the outside or the IC 474 through the FPC 473.

Figure 47:
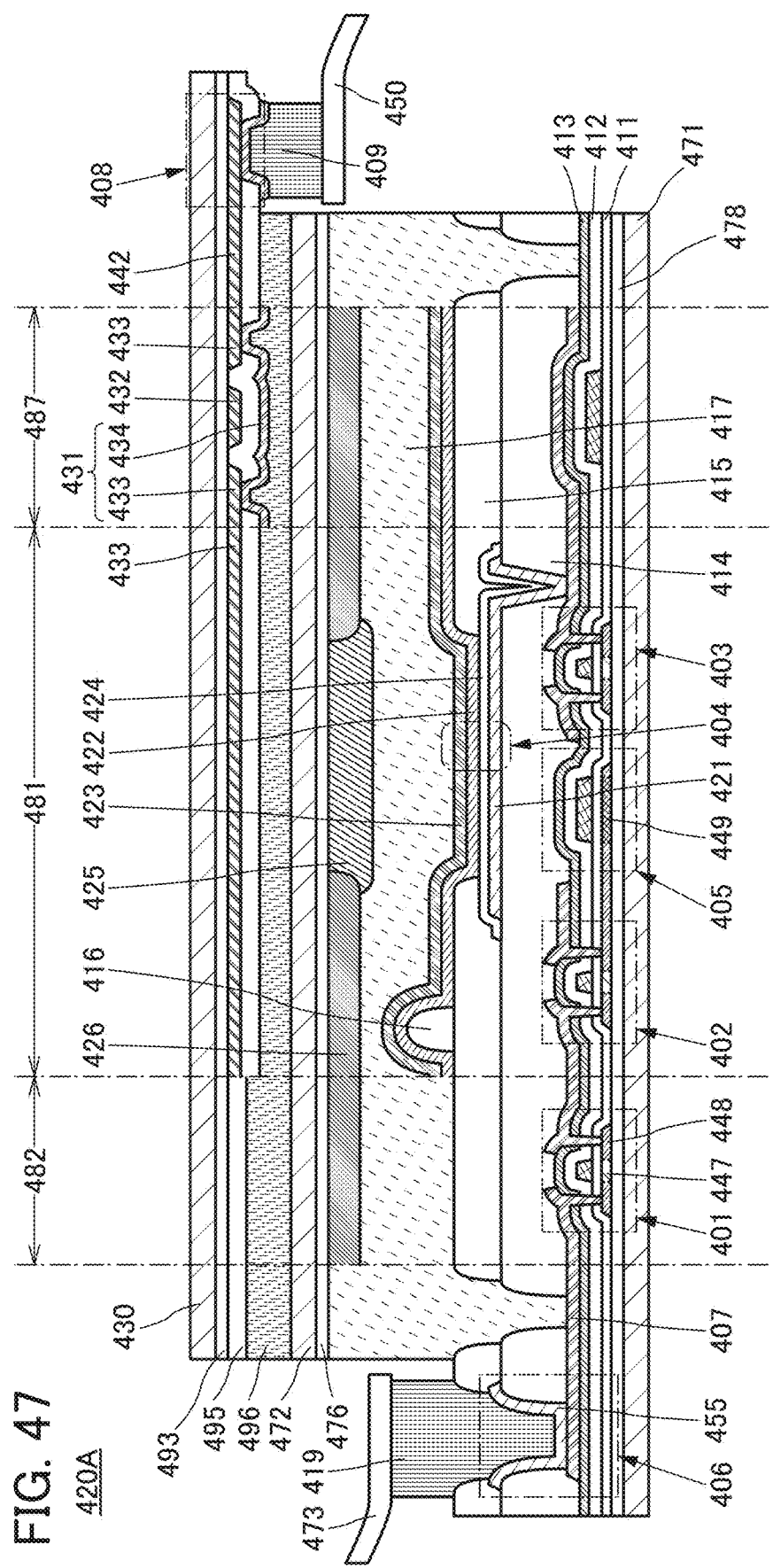
FIG. 47 is a cross-sectional view illustrating a display device.

FIG. 47 illustrates an example of a cross-sectional view of the touch panel 420A. FIG. 47 shows cross-sectional structures of the display portion 481, the driver circuit portion 482, the region including the FPC 473, the region including the FPC 450, and the like. Furthermore, FIG. 47 illustrates a cross-sectional structure of an intersection portion 487 where a wiring formed by processing a conductive layer used for forming the gate of the transistor and a wiring formed by processing a conductive layer used for forming the source and the drain of the transistor cross each other.

The substrate 471 and the substrate 472 are bonded to each other by the adhesive layer 417. The substrate 472 and the substrate 430 are bonded to each other by an adhesive layer 496. Here, the layers from the substrate 471 to the substrate 472 correspond to the display device 470. Furthermore, the layers from the substrate 430 to an electrode 434 correspond to the input device 410. In other words, the adhesive layer 496 bonds the display device 470 and the input device 410 together.

[Display Device 470]

The display device 470 illustrated in FIG. 47 is different from the display device illustrated in FIG. 39A in the structures of the transistor 401, the transistor 402, the transistor 403, the insulating layer 414, the insulating layer 415, and the capacitor 405.

FIG. 47 illustrates top-gate transistors.

Each transistor includes a gate, the insulating layer 411, a semiconductor layer, a source, and a drain. The gate and the semiconductor layer overlap with each other with the insulating layer 411 provided therebetween. The semiconductor layer may include low-resistance regions 448. The low-resistance regions 448 function as the source and drain of the transistor.

The conductive layer over the insulating layer 413 functions as a lead wiring. The conductive layer is electrically connected to the region 448 through an opening provided in the insulating layer 413, the insulating layer 412, and the insulating layer 411.

In FIG. 47, the capacitor 405 has a stacked-layer structure that includes a layer formed by processing a semiconductor layer used for forming the above-described semiconductor layer, the insulating layer 411, and a layer formed by processing a conductive layer used for forming the gate. Here, part of the semiconductor layer of the capacitor 405 preferably has a region 449 having a higher conductivity than a region 447 where the channel of the transistor is formed.

The region 448 and the region 449 each can be a region containing more impurities than the region 447 where the channel of the transistor is formed, a region with a high carrier concentration, a region with low crystallinity, or the like.

Each of the transistors illustrated in FIG. 47 can have a structure in which the semiconductor layer is sandwiched between two gates.

The insulating layer 414 and the insulating layer 415 include an opening that reaches the insulating layer 413.

[Input Device 410]

The electrode 431 and the electrode 432 are provided on a side, which faces the substrate 472, of the substrate 430 with an insulating layer 493 provided between the substrate 430 and the electrodes 431 and 432. Here, an example where the electrode 431 includes an electrode 433 and the electrode 434 is described. As in the intersection portion 487 illustrated in FIG. 47, the electrode 432 and the electrode 433 are formed on the same plane. An insulating layer 495 is provided so as to cover the electrode 432 and the electrode 433. The electrode 434 is electrically connected to two electrodes 433 between which the electrode 432 is sandwiched, through openings provided in the insulating layer 495.

A connection portion 408 is provided in a region near an end portion of the substrate 430. The connection portion 408 has a stack including the wiring 442 and a conductive layer obtained by processing the same conductive layer as the electrode 434. The connection portion 408 is electrically connected to the FPC 450 through a connection layer 409.

Structure Example 2 of Touch Panel

FIGS. 48A and 48B are schematic perspective views of a touch panel 420B.

The touch panel 420B includes a touch sensor and the light-emitting element 404 between a pair of flexible substrates (the substrate 471 and the substrate 472). When two flexible substrates are used, the touch panel can be thin, lightweight, and flexible. In FIGS. 48A and 48B, an input device 418 is provided on the substrate 472. The wiring 441, the wiring 442, and the like of the input device 418 are electrically connected to the FPC 473 provided for the display device 479.

With the above structure, the FPC connected to the touch panel 420B can be provided only on one substrate side (on the substrate 471 side in this embodiment). Although two or more FPCs may be attached to the touch panel 420B, it is preferable that the touch panel 420B be provided with one FPC 473 and signals be supplied from the FPC 473 to both the display device 479 and the input device 418 as illustrated in FIGS. 48A and 48B, for the simplicity of the structure.

The IC 474 can have a function of driving the input device 418. Alternatively, an IC for driving the input device 418 may further be provided. Further alternatively, an IC for driving the input device 418 may be mounted on the substrate 471.

Figure 49:
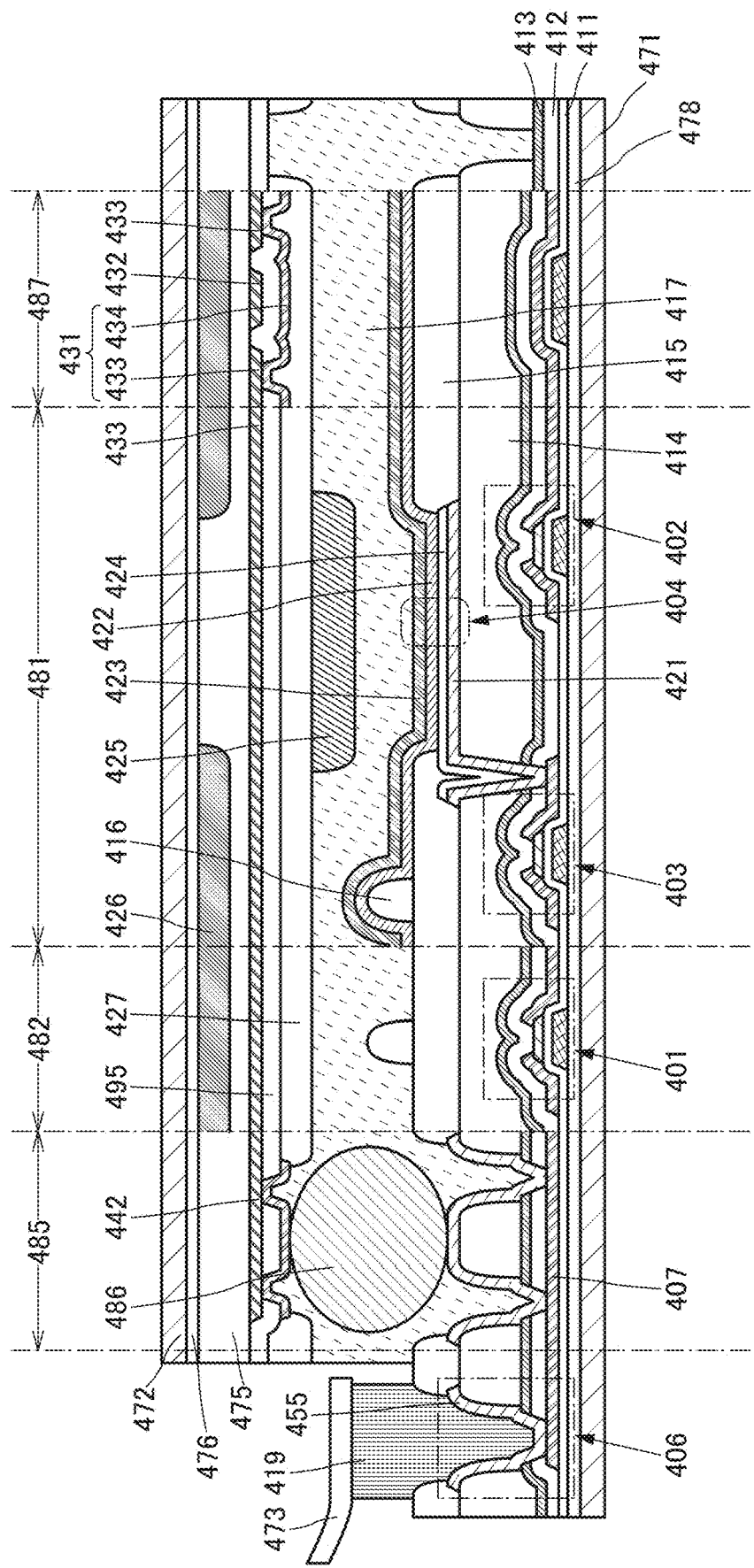
FIG. 49 is a cross-sectional view illustrating a display device.

FIG. 49 is a cross-sectional view illustrating a region including the FPC 473, a connection portion 485, the driver circuit portion 482, and the display portion 481 in FIGS.

48A and 48B. As in FIG. 47, FIG. 49 also illustrates the cross-sectional structure of the intersection portion 487.

In the connection portion 485, one of the wirings 442 (or the wirings 441) and one of the wirings 407 are electrically connected to each other through a connector 486.

As the connector 486, a conductive particle can be used, for example. For the connector 486, a material similar to that of the connector 443 can be used.

The connector 486 is preferably provided so as to be covered with the adhesive layer 417. For example, the connectors 486 are dispersed in the adhesive layer 417 before curing of the adhesive layer 417. A structure in which the connection portion 485 is provided in a portion where the adhesive layer 417 is provided can be similarly applied not only to a structure in which the adhesive layer 417 is also provided over the light-emitting element 404 as illustrated in FIG. 49 (also referred to as a solid sealing structure) but also to, for example, a hollow sealing structure in which the adhesive layer 417 is provided in the periphery of a light-emitting device, a liquid crystal display device, or the like.

FIG. 49 illustrates an example in which the optical adjustment layer 424 does not cover an end portion of the electrode 421. In the example in FIG. 49, the spacer 416 is also provided in the driver circuit portion 482.

In the touch panel 420B illustrated in FIG. 49, the light-blocking layer 426 is provided between the electrodes and the like in the touch sensor and the substrate 472. Specifically, the light-blocking layer 426 is provided between the insulating layer 476 and an insulating layer 475. Conductive layers such as the electrode 432, the electrode 433, and the wiring 442 are on the insulating layer 475, the insulating layer 495 covers the conductive layers, and the electrode 434 and the like are on the insulating layer 495. Furthermore, the insulating layer 427 is on the electrode 434 and the insulating layer 495, and the coloring layer 425 is on the insulating layer 427.

The insulating layers 427 and 495 function as a planarization film. Note that the insulating layer 427 is not necessarily provided when not needed.

With such a structure, the light-blocking layer 426 provided in a position closer to the substrate 472 side than the electrodes and the like of the touch sensor can prevent the electrodes and the like from being seen by a user. Thus, a touch panel with not only a small thickness but also improved display quality can be achieved.

In addition to the light-blocking layer 426 between the insulating layer 475 and the insulating layer 476, another light-blocking layer may be provided on the same plane as the coloring layer 425. In that case, light leakage can be inhibited more surely.

Structure Example 3 of Touch Panel

Figure 50:
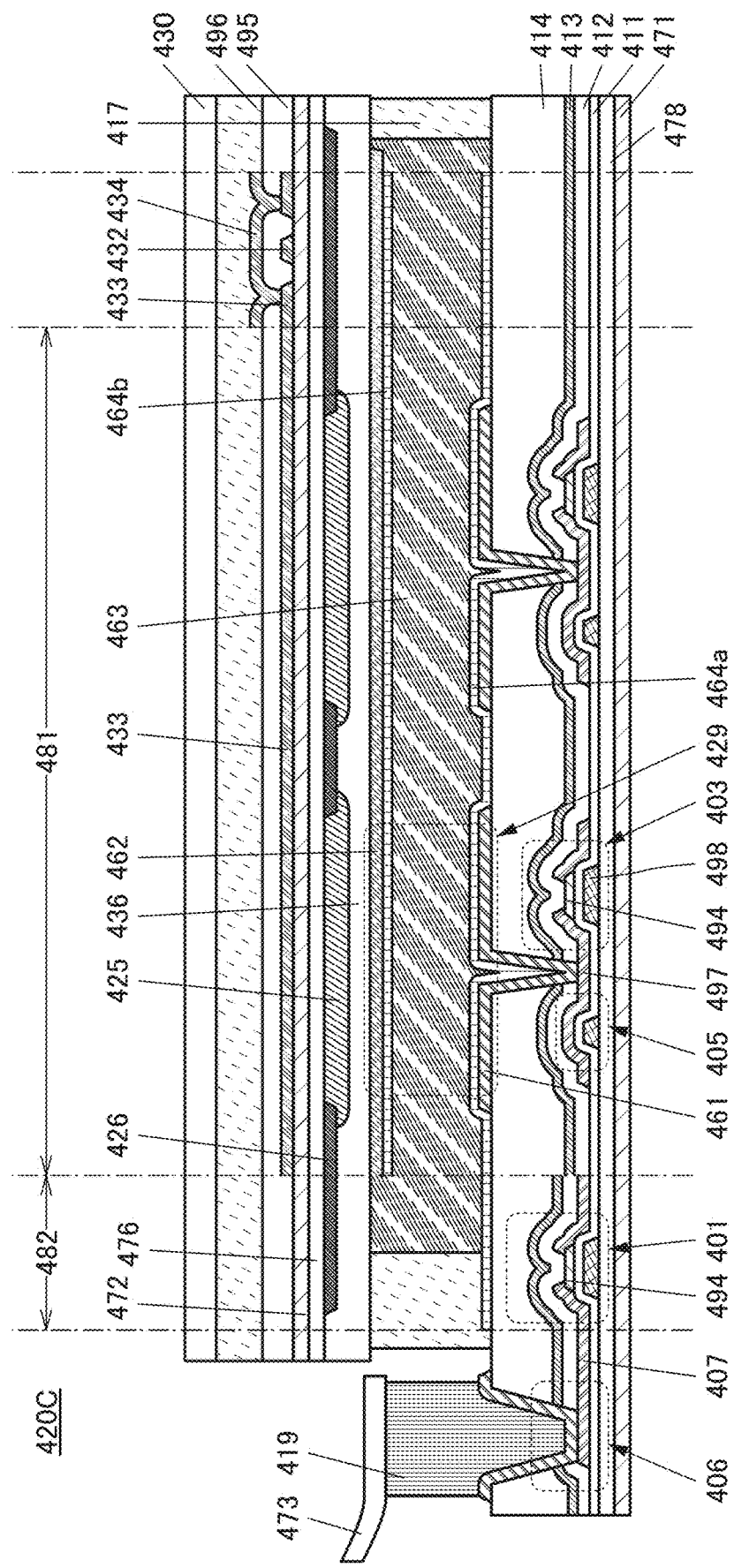
FIG. 50 is a cross-sectional view illustrating a display device.

FIG. 50 illustrates a cross section of a touch panel 420C. In the touch panel 420C, a touch sensor is provided on the opposite side of the substrate 472 from the substrate 471 in the display device 400E (FIG. 42). Such a touch panel can be referred to as an on-cell touch panel.

The electrode 432 and the electrode 433 are formed over the substrate 472 and covered by the insulating layer 495. The electrode 434 is provided over the insulating layer 495.

The substrate 430 is a substrate serving as a touch surface, and for example, serves as part of a housing, protective glass, or the like of an electronic device where the display device is incorporated. The substrates 430 and 472 are bonded with the adhesive layer 496.

FIG. 50 illustrates an example in which the electrode 433 is arranged not only in a region overlapping with the light-blocking layer 426 but also in a region overlapping with the liquid crystal element 429, the coloring layer 425, and the like. In that case, the electrode 433 can be formed using a material transmitting visible light. For example, a film containing a metal oxide, a film containing graphene, or a film that contains a metal or an alloy and is thin enough to transmit visible light can be used for the electrode 433. The same applies to the electrode 432. The electrode 434 can also be formed using a material transmitting visible light; however, a material blocking visible light, such as a metal or an alloy, may also be used in the case where the electrode 434 overlaps with the light-blocking layer 426 or the area of the electrode 434 is extremely small.

<Driving Method Example of Touch Sensor>

An example of a driving method of an input device (touch sensor) which can be applied to the display device of one embodiment of the present invention will be described below.

Figure 51A:
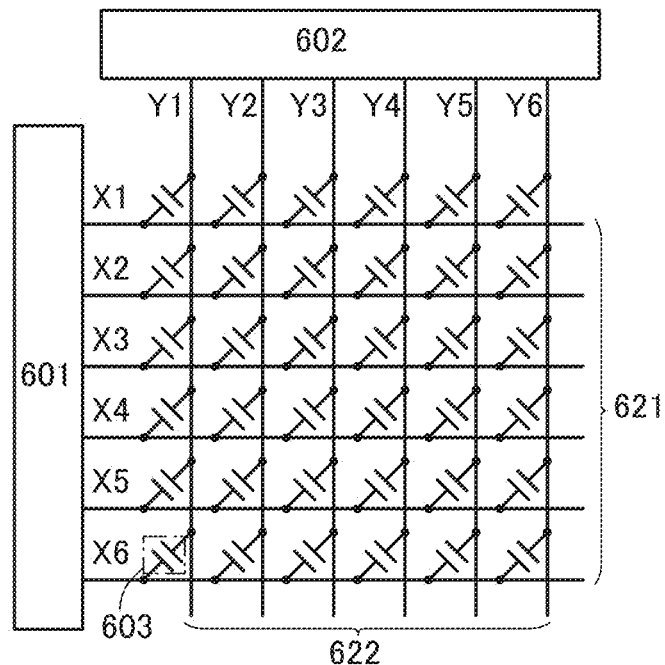
FIGS. 51A and 51B are diagrams for illustrating a driving method of an input device.

FIG. 51A is a block diagram illustrating the structure of a mutual capacitive touch sensor. FIG. 51A illustrates a pulse voltage output circuit 601 and a current sensing circuit 602. Note that in FIG. 51A, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 51A also illustrates a capacitor 603 that is formed with the electrodes 621 and 622 overlapping with each other or being provided close to each other. Note that functional replacement between the electrodes 621 and 622 is possible.

For example, the conductive layer 551 corresponds to one of the electrodes 621 and 622, and the conductive layer 552 corresponds to the other of the electrodes 621 and 622.

The pulse voltage output circuit 601 is, for example, a circuit for sequentially inputting a pulse voltage to the wirings X1 to X6. The current sensing circuit 602 is, for example, a circuit for sensing current flowing through each of the wirings Y1 to Y6.

By application of a pulse voltage to one of the wirings X1 to X6, an electric field is generated between the electrodes 621 and 622 of the capacitor 603, and current flows through the electrode 622. Part of the electric field generated between the electrodes is blocked when an object such a finger or a stylus contacts or approaches the device, so that the electric field intensity between the electrodes is changed. Consequently, the amount of current flowing through the electrode 622 is changed.

For example, in the case where there is no approach or no contact of an object, the amount of current flowing in each of the wirings Y1 to Y6 depends on the amount of capacitance of the capacitor 603. In the case where part of an electric field is blocked by the approach or contact of an object, a decrease in the amount of current flowing in the wirings Y1 to Y6 is sensed. The approach or contact of an object can be sensed by utilizing this change.

Sensing by the current sensing circuit 602 may be performed using an integral value (time integral value) of current flowing in a wiring. In that case, sensing may be performed with an integrator circuit, for example. Alternatively, the peak current value may be sensed. In that case, for example, current may be converted into voltage, and the peak voltage value may be sensed.

Figure 51B:
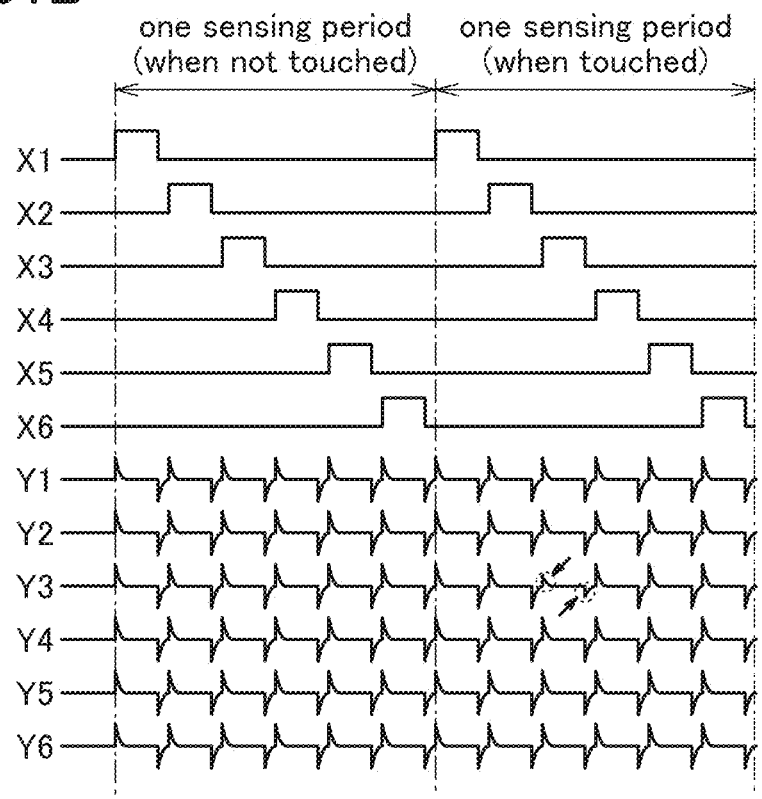

FIG. 51B is an example of a timing chart illustrating input and output waveforms in the mutual capacitive touch sensor in FIG. 51A. In FIG. 51B, sensing in each row and each column is performed in one sensing period. FIG. 51B shows a period when the contact or approach of an object is not sensed (when the touch sensor is not touched) and a period when the contact or approach of an object is sensed (when the touch sensor is touched). Here, the wirings Y1 to Y6 each show a waveform of a voltage corresponding to the amount of current to be sensed.

As shown in FIG. 51B, the wirings X1 to X6 are sequentially supplied with a pulse voltage. Accordingly, current flows in the wirings Y1 to Y6. When the touch sensor is not touched, substantially the same current flows in the wirings Y1 to Y6 in accordance with a change in voltages of the wirings X1 to X6; thus, the wirings Y1 to Y6 have similar output waveforms. Meanwhile, when the touch sensor is touched, current flowing in a wiring in a position which an object contacts or approaches among the wirings Y1 to Y6 is reduced; thus, the output waveforms are changed as shown in FIG. 51B.

FIG. 51B shows an example in which an object contacts or approaches the intersection of the wiring X3 and the wiring Y3 or the vicinity thereof.

A change in current due to block of an electric field generated between a pair of electrodes is sensed in this manner in a mutual capacitive touch sensor, so that positional information of an object can be obtained. When the detection sensitivity is high, the coordinates of the object can be determined even when the object is far from a detection surface (e.g., a surface of the touch panel).

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the frequency of sensing is increased, the detection sensitivity can be increased.

It is preferable that, as an example, the pulse voltage output circuit 601 and the current sensing circuit 602 be formed in an IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

At least part of this embodiment can be implemented in combination with any of the other embodiments described in this specification as appropriate.

Embodiment 8

In this embodiment, a method for forming an EL layer by a droplet discharge method will be described with reference to FIGS. 52A to 52D. FIGS. 52A to 52D are cross-sectional views illustrating the method for forming an EL layer 786.

Figure 52A:
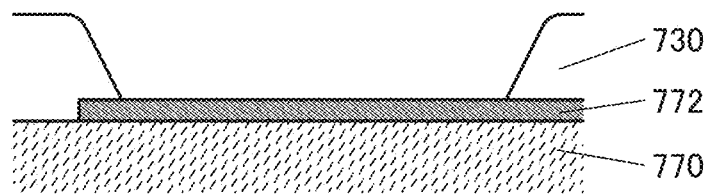
FIGS. 52A to 52D are cross-sectional views illustrating a method for forming an EL layer.
Figure 52B:
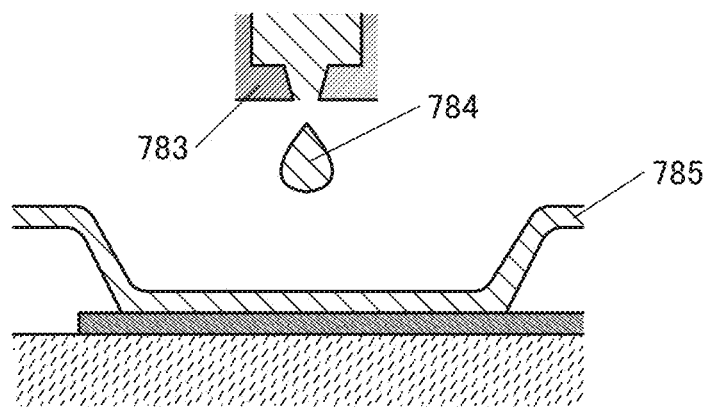

First, a conductive film 772 is formed over a planarization insulating film 770, and an insulating film 730 is formed to cover part of the conductive film 772 (see FIG. 52A).

Then, a droplet 784 is discharged to an exposed portion of the conductive film 772, which is an opening of the insulating film 730, from a droplet discharge apparatus 783, so that a composition containing layer 785 is formed. The droplet 784 is a composition containing a solvent and is attached to the conductive film 772 (see FIG. 52B).

Note that the step of discharging the droplet 784 may be performed under reduced pressure.

Figure 52C:
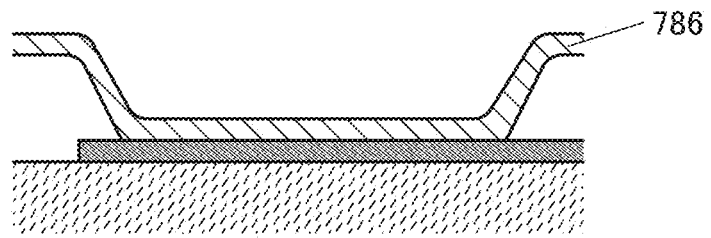

Next, the solvent is removed from the composition containing layer 785, and the resulting layer is solidified to form the EL layer 786 (see FIG. 52C).

The solvent may be removed by drying or heating.

Figure 52D:
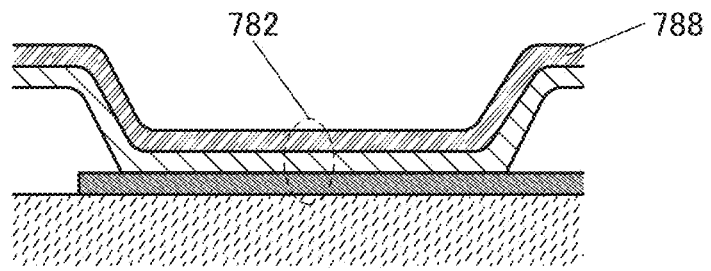

Next, a conductive film 788 is formed over the EL layer 786; thus, a light-emitting element 782 is completed (see FIG. 52D).

When the EL layer 786 is formed by a droplet discharge method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 53:
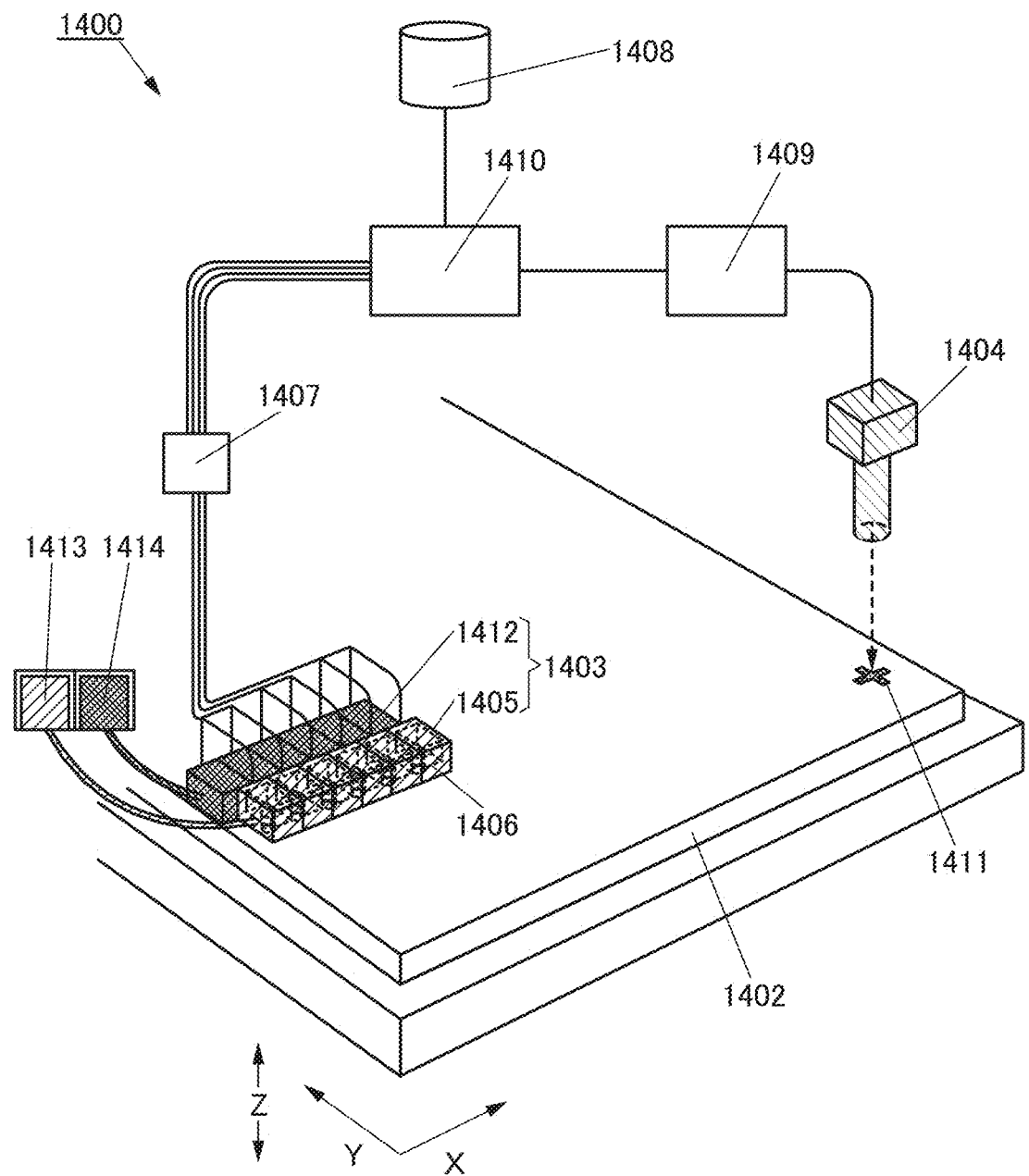
FIG. 53 is a conceptual diagram illustrating a droplet discharge apparatus.

Next, a droplet discharge apparatus used for the droplet discharge method is described with reference to FIG. 53. FIG. 53 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information about a pattern to be formed over the substrate 1402 is stored in a storage medium 1408, and a control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 53, and a region in which a pattern is drawn can be freely set. Thus, a plurality of the same patterns can be drawn over one substrate.

Furthermore, a step of discharging the composition may be performed under reduced pressure. A substrate may be heated when the composition is discharged. After discharging the composition, either drying or baking or both of them are performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that there is no particular limitation on the timing of the heat treatment and the number of times of the heat treatment. The temperature for performing each of the steps of drying and baking in a favorable manner depends on the material of the substrate and the properties of the composition.

In the above-described manner, the EL layer 786 can be formed with the droplet discharge apparatus.

At least part of this embodiment can be implemented in combination with any of the other embodiments described in this specification as appropriate.

Embodiment 9

In this embodiment, electronic devices and lighting devices of one embodiment of the present invention will be described with reference to drawings.

Electronic devices and lighting devices can be manufactured by using the display device of one embodiment of the present invention. Highly reliable electronic devices and lighting devices with curved surfaces can be manufactured by using the display device of one embodiment of the present invention. In addition, flexible and highly reliable electronic devices and lighting devices can be manufactured by using the display device of one embodiment of the present invention.

Examples of electronic devices include a television set, a desktop or notebook personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on a display portion, a touch panel function, a function of displaying a calendar, date, time, and the like, a function of executing a variety of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of taking a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic device of one embodiment of the present invention are not limited thereto, and the electronic devices can have a variety of functions.

FIGS. 54A to 54E illustrate examples of an electronic device including a display portion 7000 with a curved surface. The display surface of the display portion 7000 is bent, and images can be displayed on the bent display surface. The display portion 7000 may have flexibility.

The display portion 7000 can be formed using the display device of one embodiment of the present invention. One embodiment of the present invention makes it possible to provide a highly reliable electronic device having a curved display portion.

Figure 54A:
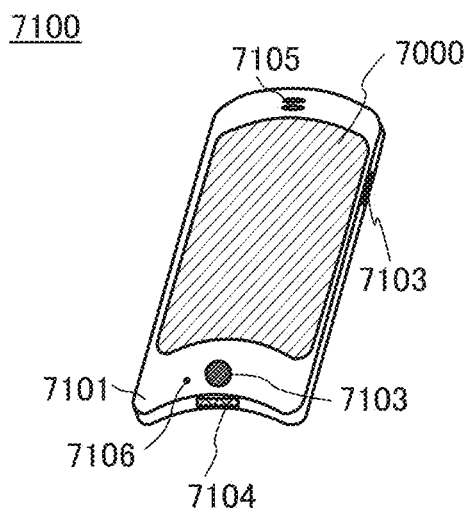
FIGS. 54A to 54F illustrate electronic devices and a lighting device.
Figure 54B:
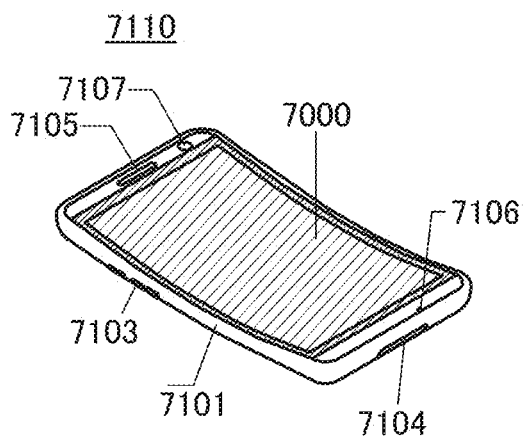

FIGS. 54A and 54B illustrate examples of mobile phones. A mobile phone 7100 illustrated in FIG. 54A and a mobile phone 7110 illustrated in FIG. 54B each include a housing 7101, the display portion 7000, operation buttons 7103, an external connection port 7104, a speaker 7105, a microphone 7106, and the like. The mobile phone 7110 illustrated in FIG. 54B also includes a camera 7107.

Each mobile phone includes a touch sensor in the display portion 7000. Operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 54C:
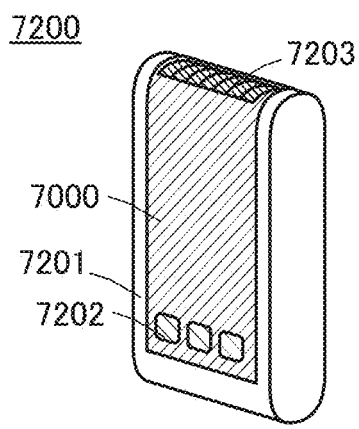
Figure 54D:
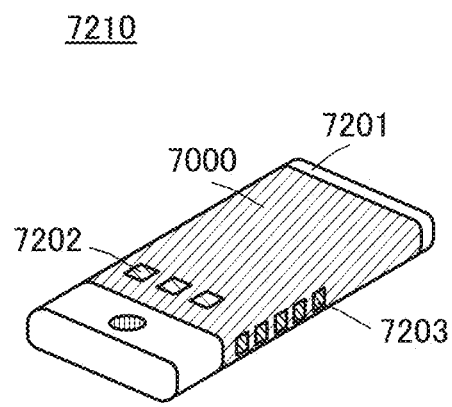

FIGS. 54C and 54D illustrate examples of portable information terminals. A portable information terminal 7200 illustrated in FIG. 54C and a portable information terminal 7210 illustrated in FIG. 54D each include a housing 7201 and the display portion 7000. Each of the portable information terminals may also include an operation button, an external connection port, a speaker, a microphone, an antenna, a camera, a battery, or the like. The display portion 7000 is provided with a touch sensor. The operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7200 and 7210 can display characters, image information, and the like on its plurality of surfaces. For example, as illustrated in FIGS. 54C and 54D, three operation buttons 7202 can be displayed on one surface, and information 7203 indicated by a rectangle can be displayed on another surface. FIG. 54C illustrates an example in which information is displayed at the top of the portable information terminal. FIG. 54D illustrates an example in which information is displayed on the side of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 54E:
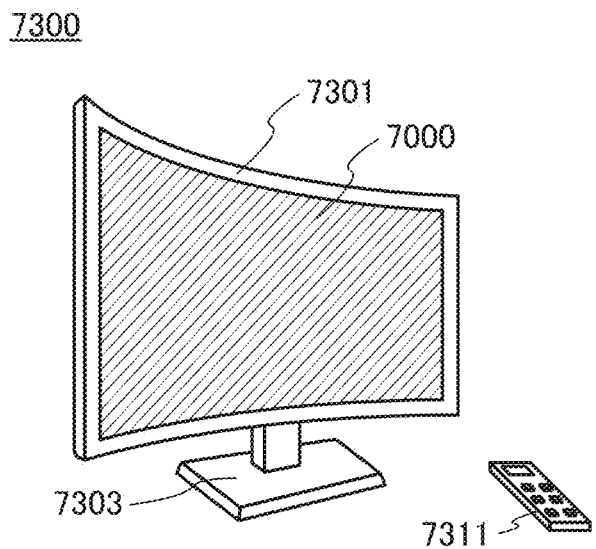

FIG. 54E illustrates an example of a television set. In a television set 7300, the display portion 7000 is incorporated into a housing 7301. Here, the housing 7301 is supported by a stand 7303.

The television set 7300 illustrated in FIG. 54E can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 54F:
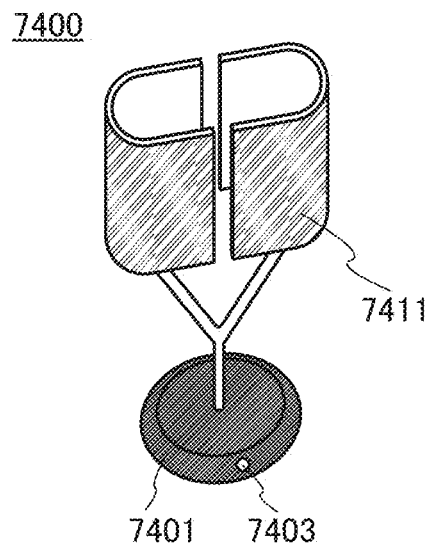

FIG. 54F illustrates an example of a lighting device having a curved light-emitting portion.

The light-emitting portion included in the lighting device illustrated in FIG. 54F can be manufactured using the display device of one embodiment of the present invention. According to one embodiment of the present invention, a highly reliable lighting device having a curved light-emitting portion can be provided.

A light-emitting portion 7411 included in a lighting device 7400 illustrated in FIG. 54F has two convex-curved light-emitting portions symmetrically placed. Thus, all directions can be illuminated with the lighting device 7400 as a center.

The light-emitting portion included in the lighting device 7400 may have flexibility. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 55A to 55I each illustrate an example of a portable information terminal including a flexible and bendable display portion 7001.

The display portion 7001 is manufactured using the display device of one embodiment of the present invention. For example, a display device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

Figure 55A:
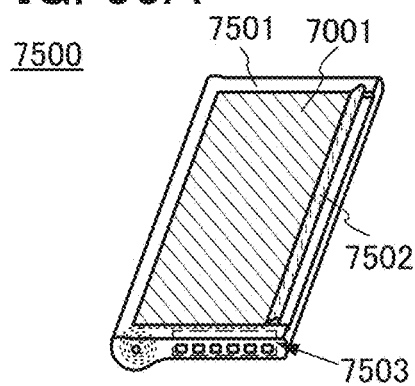
FIGS. 55A to 55I illustrate electronic devices.
Figure 55B:
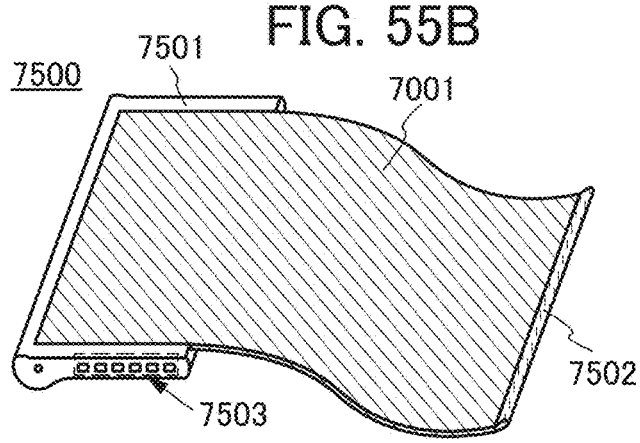

FIGS. 55A and 55B are perspective views illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out by using the display portion tab 7502.

The portable information terminal 7500 can receive a video signal with a control portion incorporated therein and can display the received image on the display portion 7001. The portable information terminal 7500 incorporates a battery. A terminal portion for connecting a connector may be included in the housing 7501 so that a video signal or power can be directly supplied from the outside with a wiring.

With the operation buttons 7503, turning on or off of the power, switching of displayed images, and the like can be performed. Although FIGS. 55A and 55B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 55B illustrates the portable information terminal 7500 in a state where the display portion 7001 is pulled out. Images can be displayed on the display portion 7001 in this state. In addition, the portable information terminal 7500 may perform different displays in the state where part of the display portion 7001 is rolled as shown in FIG. 55A and in the state where the display portion 7001 is pulled out as illustrated in FIG. 55B. For example, in the state shown in FIG. 55A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

Figure 55C:
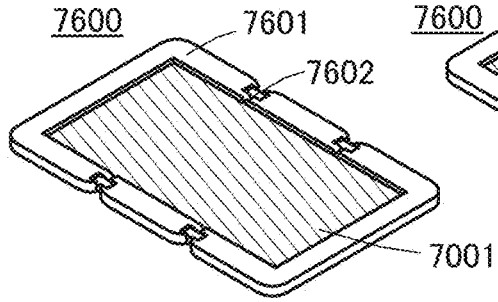
Figure 55D:
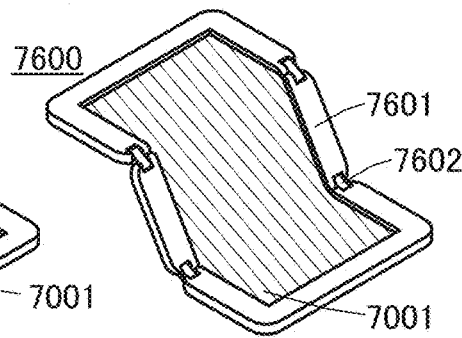
Figure 55E:
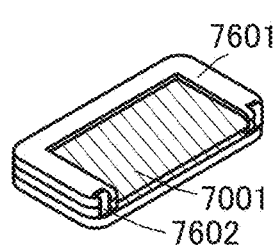

FIGS. 55C to 55E illustrate an example of a foldable portable information terminal. FIG. 55C illustrates a portable information terminal 7600 that is opened. FIG. 55D illustrates the portable information terminal 7600 that is being opened or being folded. FIG. 55E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

Figure 55F:
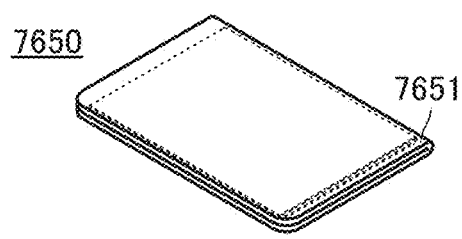
Figure 55G:
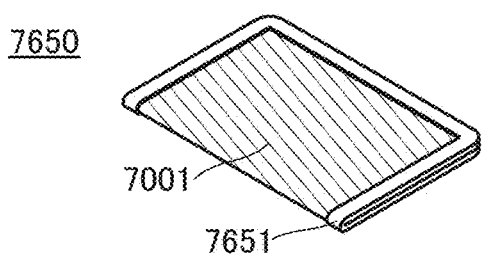

FIGS. 55F and 55G illustrate an example of a foldable portable information terminal. FIG. 55F illustrates a portable information terminal 7650 that is folded so that the display portion 7001 is on the inside. FIG. 55G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

Figure 55H:
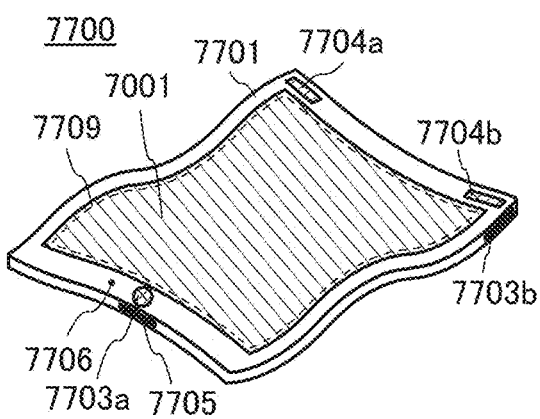

FIG. 55H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape or to twist the portable information terminal 7700. For example, the portable information terminal 7700 can be folded so that the display portion 7001 is on the inside or on the outside.

The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 55I:
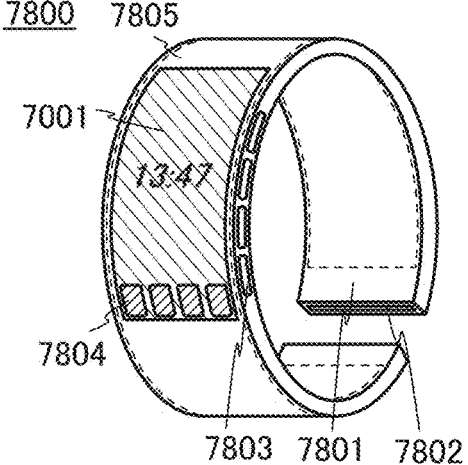

FIG. 55I illustrates an example of a wrist-watch-type portable information terminal. The portable information terminal 7800 includes a band 7801, the display portion 7001, an input/output terminal 7802, operation buttons 7803, and the like. The band 7801 functions as a housing. A flexible battery 7805 can be included in the portable information terminal 7800. The battery 7805 may be arranged to overlap with the display portion 7001, or the band 7801 and the like, for example.

The band 7801, the display portion 7001, and the battery 7805 have flexibility. Thus, the portable information terminal 7800 can be easily curved to have a desired shape.

With the operation buttons 7803, a variety of functions such as time setting, turning on or off of the power, turning on or off of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 56A:
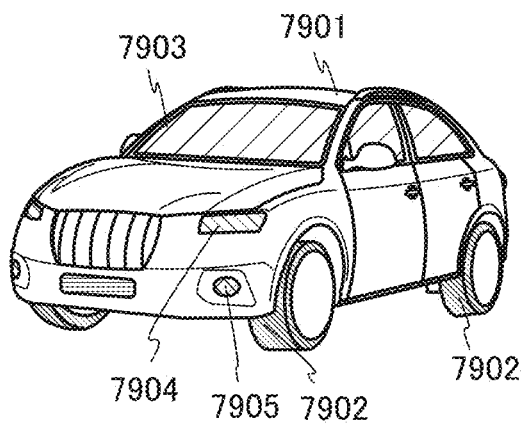
FIGS. 56A to 56E illustrate electronic devices.
Figure 56B:
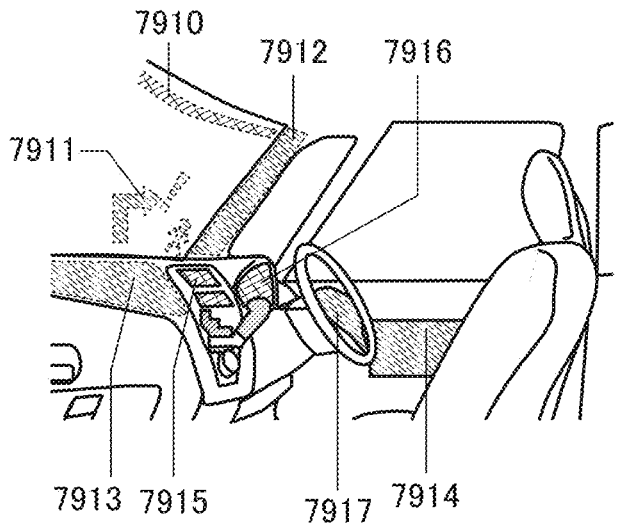

FIG. 56A is an external view of an automobile 7900. FIG. 56B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 56B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using an oxide semiconductor, is preferably used.

A display portion 7912 is provided on a pillar portion. A display portion 7913 is provided on a dashboard. For example, the display portion 7912 can compensate for the view hindered by the pillar portion by showing an image taken by an imaging means provided on the car body. Similarly, the display portion 7913 can compensate for the view hindered by the dashboard and a display portion 7914 can compensate for the view hindered by the door. That is, showing a video taken by an imaging means provided on the outside of the automobile leads to elimination of blind areas and enhancement of safety. In addition, showing a video so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation information, a speedometer, a tachometer, a mileage, a fuel meter, a gearshift indicator, and air-condition setting. The content, layout, or the like of the display on the display portions can be customized freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 56C:
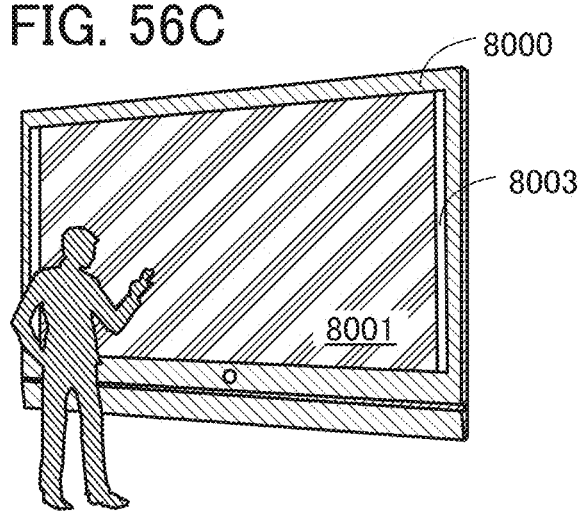
Figure 56D:
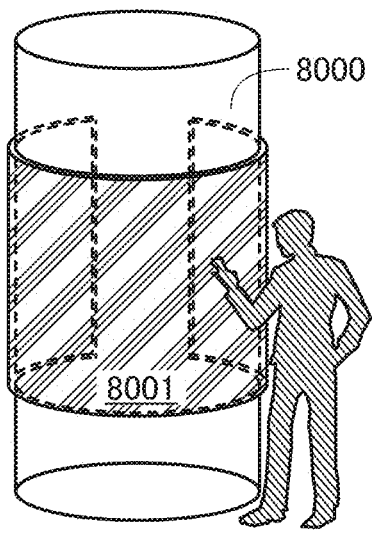

FIGS. 56C and 56D each illustrate an example of digital signage including a housing 8000, a display portion 8001, a speaker 8003, and the like. An LED lamp, operation keys (including a power switch or an operation switch), a connection terminal, a variety of sensors, a microphone, and the like may also be included.

FIG. 56D illustrates a digital signage mounted on a cylindrical pillar.

A larger display portion 8001 can provide more information at a time. In addition, a larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the device is used to provide information such as route information or traffic information, usability can be enhanced by intuitive operation.

Figure 56E:
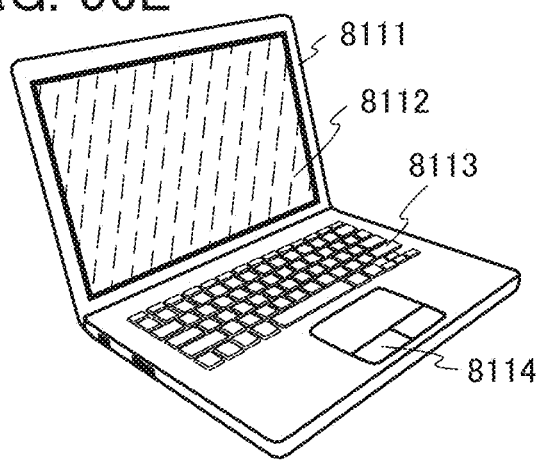

FIG. 56E illustrates a notebook personal computer which includes a housing 8111, a display portion 8112, a keyboard 8113, a pointing device 8114, and the like.

The display device of one embodiment of the present invention can be used for the display portion 8112.

At least part of this embodiment can be implemented in combination with any of the other embodiments described in this specification as appropriate.

EXPLANATION OF REFERENCE

10: display device, 11: supporting substrate, 12: adhesive layer, 13: adhesive layer, 14: formation substrate, 21: substrate, 22: substrate, 28: adhesive layer, 31: insulating layer, 32: insulating layer, 33: insulating layer, 34: insulating layer, 35: insulating layer, 40: transistor, 41: conductive layer, 42: semiconductor layer, 43a: conductive layer, 43b: conductive layer, 44: oxide semiconductor layer, 50: stage, 51: member, 52: member, 53: member, 54: member, 55: transfer stage, 60: display element, 61: conductive layer, 62: EL layer, 63: conductive layer, 71: protective layer, 72: tape, 73: supporting substrate, 74: insulating layer, 75: protective layer, 100: transistor, 100A: transistor, 100B: transistor, 100C: transistor, 100D: transistor, 100E: transistor, 100F: transistor, 100G: transistor, 100H: transistor, 100J: transistor, 100K: transistor, 102: substrate, 104: insulating film, 106: conductive film, 108: oxide semiconductor film, 108_1: oxide semiconductor film, 1082: oxide semiconductor film, 1083: oxide semiconductor film, 108d: drain region, 108f: region, 108i: channel region, 108s: source region, 110: insulating film, 112: conductive film, 112_1: conductive film, 112_2: conductive film, 116: insulating film, 118: insulating film, 120a: conductive film, 120b: conductive film, 122: insulating film, 141a: opening, 141b: opening, 143: opening, 300A: transistor, 300B: transistor, 300C: transistor, 300D: transistor, 300E: transistor, 300F: transistor, 300G: transistor, 302: substrate, 304: conductive film, 306: insulating film, 307: insulating film, 308: oxide semiconductor film, 308_1: oxide semiconductor film, 308_2: oxide semiconductor film, 308_3: oxide semiconductor film, 312a: conductive film, 312b: conductive film, 312c: conductive film, 314: insulating film, 316: insulating film, 318: insulating film, 320a: conductive film, 320b: conductive film, 341a: opening, 341b: opening, 342a: opening, 342b: opening, 342c: opening, 351: opening, 352a: opening, 352b: opening, 400A: display device, 400B: display device, 400C: display device, 400D: display device, 400E: display device, 400F: display device, 401: transistor, 402: transistor, 403: transistor, 404: light-emitting element, 405: capacitor, 406: connection portion, 407: wiring, 408: connection portion, 409: connection layer, 410: input device, 411: insulating layer, 412: insulating layer, 413: insulating layer, 414: insulating layer, 415: insulating layer, 416: spacer, 417: adhesive layer, 418: input device, 419: connection layer, 420A: touch panel, 420B: touch panel, 420C: touch panel, 421: electrode, 422: EL layer, 423: electrode, 424: optical adjustment layer, 425: coloring layer, 426: light-blocking layer, 427: insulating layer, 429: liquid crystal element, 430: substrate, 431: electrode, 432: electrode, 433: electrode, 434: electrode, 436: overcoat, 441: wiring, 442: wiring, 443: connector, 447: region, 448: region, 449: region, 450: FPC, 451: IC, 455: conductive layer, 461: electrode, 462: electrode, 463: liquid crystal, 464a: alignment film, 464b: alignment film, 470: display device, 471: substrate, 472: substrate, 473: FPC, 474: IC, 475: insulating layer, 476: insulating layer, 478: insulating layer, 479: display device, 481: display portion, 482: driver circuit portion, 485: connection portion, 486: connector, 487: intersection portion, 493: insulating layer, 494: semiconductor layer, 495: insulating layer, 496: adhesive layer, 497: conductive layer, 498: conductive layer, 499: polarizing plate, 546: conductive film, 547: conductive film, 548: conductive film, 549: nanowire, 550: input device, 551: conductive layer, 552: conductive layer, 553: conductive layer, 555: wiring, 556: wiring, 557: FPC, 558: IC, 560: substrate, 601: pulse voltage output circuit, 602: current sensing circuit, 603: capacitor, 621: electrode, 622: electrode, 730: insulating film, 770: planarization insulating film, 772: conductive film, 782: light-emitting element, 783: droplet discharge apparatus, 784: droplet, 785: composition containing layer, 786: EL layer, 788: conductive film, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head 1413: material supply source, 1414: material supply source, 7000: display portion, 7001: display portion, 7100: mobile phone, 7101: housing, 7103: operation button, 7104: external connection port, 7105: speaker, 7106: microphone, 7107: camera, 7110: mobile phone, 7200: portable information terminal, 7201: housing, 7202: operation button, 7203: information, 7210: portable information terminal, 7300: television device, 7301: housing, 7303: stand, 7311: remote controller, 7400: lighting device, 7401: stage, 7403: operation switch, 7411: light-emitting portion, 7500: portable information terminal, 7501: housing, 7502: member, 7503: operation button, 7600: portable information terminal, 7601: housing, 7602: hinge, 7650: portable information terminal, 7651: non-display portion, 7700: portable information terminal, 7701: housing, 7703a: button, 7703b: button, 7704a: speaker, 7704b: speaker, 7705: external connection port, 7706: microphone, 7709: battery, 7800: portable information terminal, 7801: band, 7802: input-output terminal, 7803: operation button, 7804: icon, 7805: battery, 7900: automobile, 7901: car body, 7902: wheel, 7903: windshield, 7904: light, 7905: fog lamp, 7910: display portion, 7911: display portion, 7912: display portion, 7913: display portion, 7914: display portion, 7915: display portion, 7916: display portion, 7917: display portion, 8000: housing, 8001: display portion, 8003: speaker, 8111: housing, 8112: display portion, 8113: keyboard, and 8114: pointing device.

This application is based on Japanese Patent Application serial no. 2015-257109 filed with Japan Patent Office on Dec. 28, 2015, Japanese Patent Application serial no. 2016-067618 filed with Japan Patent Office on Mar. 30, 2016, and Japanese Patent Application serial no. 2016-069729 filed with Japan Patent Office on Mar. 30, 2016, the entire contents of which are hereby incorporated by reference.

The invention claimed is:

1. A method for manufacturing a flexible device, comprising the steps of:
bonding a second substrate to a first substrate by a first adhesive layer, the first adhesive layer comprising a thermoplastic material;
forming a first insulating layer over the second substrate;
forming a transistor comprising a gate electrode, a gate insulating layer, an oxide semiconductor layer containing indium, gallium, and zinc, a source electrode, and a drain electrode over the first insulating layer;
forming a second insulating layer covering the transistor; and
softening the first adhesive layer by performing a heat treatment at a first temperature, thereby separating the first substrate and the second substrate from each other,
wherein the second substrate is more flexible than the first substrate,
wherein the first substrate comprises a material whose heat resistant temperature is a second temperature,
wherein the second substrate comprises a material whose heat resistant temperature is a third temperature,
wherein a heat resistant temperature of the first adhesive layer is a fourth temperature,
wherein the oxide semiconductor layer is formed at a fifth temperature which is lower than the fourth temperature,
wherein the third temperature is higher than the fourth temperature and lower than the second temperature,
wherein the first temperature is higher than the fourth temperature and lower than the third temperature,
wherein the fifth temperature is higher than or equal to 80° C. and lower than or equal to 220° C., and
wherein a width of the first adhesive layer is smaller from than each of a width of the first substrate and a width of the second substrate.

2. The method for manufacturing a flexible device, according to claim 1,
wherein the fifth temperature is higher than or equal to 80° C. and lower than or equal to 150° C.

3. The method for manufacturing a flexible device, according to claim 1,
wherein the first adhesive layer is provided in a region along an outer edge of the second substrate.

4. The method for manufacturing a flexible device, according to claim 1,
wherein the oxide semiconductor layer contains a region comprising crystal parts with crystal orientation parallel to c-axis.

5. The method for manufacturing a flexible device, according to claim 1,
wherein the oxide semiconductor layer contains a region comprising nanocrystals.

6. The method for manufacturing a flexible device, according to claim 1,
wherein the thermoplastic material is selected from the group consisting of polyamide-imide, polyetherimide, polyarylate, polysulfone, polyethersulfone, polyphenilensulfide, polytetrafluoroethylene, chlorotrifluoroethylene, polyvinylidene fluoride, and polyvinyl fluoride.

7. The method for manufacturing a flexible device, according to claim 1,
wherein the third temperature is higher than or equal to 300° C. and lower than or equal to 500° C., and
wherein the second temperature is higher than 500° C.

8. The method for manufacturing a flexible device, according to claim 1,
wherein an outer edge of the first adhesive layer is located inward from an outer edge of the second substrate.

9. The method for manufacturing a flexible device, according to claim 1, wherein, when viewed from above, a shape of the first adhesive layer is smaller than each of a shape of the first substrate and a shape of the second substrate.

10. A method for manufacturing a display device, comprising the steps of:
bonding a second substrate to a first substrate by a first adhesive layer, the first adhesive layer comprising a thermoplastic material;
forming a first insulating layer over the second substrate;
forming a transistor comprising a gate electrode, a gate insulating layer, an oxide semiconductor layer containing indium, gallium, and zinc, a source electrode, and a drain electrode over the first insulating layer;
forming a second insulating layer covering the transistor;
forming a display element over the second insulating layer, the display element electrically connected to the transistor;
forming a protective layer to cover the display element; and softening the first adhesive layer by performing a heat treatment at a first temperature, thereby separating the first substrate and the second substrate from each other, wherein the first substrate comprises a material whose heat resistant temperature is a second temperature, wherein the second substrate comprises a material whose heat resistant temperature is a third temperature, wherein a heat resistant temperature of the first adhesive layer is a fourth temperature, wherein the oxide semiconductor layer is formed at a fifth temperature which is lower than the fourth temperature, wherein the third temperature is higher than the fourth temperature and lower than the second temperature, wherein the first temperature is higher than the fourth temperature and lower than the third temperature, and wherein the fifth temperature is higher than or equal to 80° C. and lower than or equal to 220° C., and wherein a width of the first adhesive layer is smaller than each of a width of the first substrate and a width of the second substrate.

11. The method for manufacturing a display device, according to claim 10, wherein the second substrate is more flexible than the first substrate.

12. The method for manufacturing a display device, according to claim 10, further comprising a step of bonding a third substrate to the display element by a second adhesive layer before the step of separating the first substrate and the second substrate from each other, wherein the third substrate is more flexible than the first substrate, wherein the third substrate comprises a material whose heat resistant temperature is higher than the fourth temperature and lower than the second temperature, and wherein the second adhesive layer comprises a material whose heat resistant temperature is higher than the fourth temperature and lower than the second temperature.

13. The method for manufacturing a display device, according to claim 10, further comprising a step of bonding a third substrate to the display element by a second adhesive layer after the step of separating the first substrate and the second substrate from each other, wherein the third substrate is more flexible than the first substrate.

14. The method for manufacturing a display device, according to claim 10, wherein the fifth temperature is higher than or equal to 80° C. and lower than or equal to 150° C.

15. The method for manufacturing a display device, according to claim 10, wherein the thermoplastic material is selected from the group consisting of polyamide-imide, polyetherimide, polyarylate, polysulfone, polyethersulfone, polyphenilensulfide, polytetrafluoroethylene, chlorotrifluoroethylene, polyvinylidene fluoride, and polyvinyl fluoride.

16. The method for manufacturing a display device, according to claim 10, wherein the first adhesive layer is provided in a region along an outer edge of the second substrate.

17. The method for manufacturing a display device, according to claim 10, wherein the oxide semiconductor layer contains a region comprising crystal parts with crystal orientation parallel to c-axis.

18. The method for manufacturing a display device, according to claim 10, wherein the oxide semiconductor layer contains a region comprising nanocrystals.

19. The method for manufacturing a flexible device, according to claim 10, wherein an outer edge of the first adhesive layer is located inward from an outer edge of the second substrate.

20. The method for manufacturing a flexible device, according to claim 10, wherein, when viewed from above, a shape of the first adhesive layer is smaller than each of a shape of the first substrate and a shape of the second substrate.

* * * * *